(12) United States Patent
Kim et al.

(10) Patent No.: US 12,414,411 B2
(45) Date of Patent: Sep. 9, 2025

(54) LIGHT EMITTING ELEMENT WITH AN INSULATING FILM COMPRISING MULTIPLE PAIR LAYERS

(71) Applicant: Samsung Display Co., LTD., Yongin-si (KR)

(72) Inventors: Hyun Kim, Seoul (KR); Jeong Nyun Kim, Asan-si (KR); Jeong Su Park, Asan-si (KR); Zu Seok Oh, Cheonan-si (KR); Jong Chan Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 507 days.

(21) Appl. No.: 17/879,566

(22) Filed: Aug. 2, 2022

(65) Prior Publication Data
US 2023/0163247 A1  May 25, 2023

(30) Foreign Application Priority Data

Nov. 23, 2021 (KR) .................. 10-2021-0161852

(51) Int. Cl.
| H10H 20/841 | (2025.01) |
| H10H 20/821 | (2025.01) |
| H10H 20/831 | (2025.01) |
| H10H 29/14 | (2025.01) |

(52) U.S. Cl.
CPC ........ *H10H 20/841* (2025.01); *H10H 20/821* (2025.01); *H10H 20/831* (2025.01); *H10H 29/142* (2025.01)

(58) Field of Classification Search
None
See application file for complete search history.

(56) References Cited

U.S. PATENT DOCUMENTS

| 10,026,777 B2* | 7/2018 | Kang .................. H01L 25/0753 |
| 10,269,865 B2 | 4/2019 | Kang et al. |
| 10,665,633 B2 | 5/2020 | Kang et al. |

(Continued)

FOREIGN PATENT DOCUMENTS

| KR | 2018-0071465 A | 6/2018 |
| KR | 10-1891777 B1 | 8/2018 |

(Continued)

*Primary Examiner* — Davienne N Monbleau
*Assistant Examiner* — Heim Kirin Grewal
(74) *Attorney, Agent, or Firm* — Womble Bond Dickinson (US) LLP

(57) ABSTRACT

A display device includes a first electrode on a substrate and a second electrode spaced from the first electrode, a first insulating layer on the first electrode and the second electrode, a plurality of light emitting elements on the first insulating layer and on the first electrode and the second electrode, a first connection electrode on the first electrode and contacting a first end of each of the plurality of light emitting elements, and a second connection electrode on the second electrode and contacting a second end of each of the plurality of light emitting elements, wherein each of the plurality of light emitting elements includes a first semiconductor layer doped with an n-type dopant, a second semiconductor layer doped with a p-type dopant, a light emitting layer between the first semiconductor layer and the second semiconductor layer, and an insulating film surrounding at least the light emitting layer.

22 Claims, 35 Drawing Sheets

(56) References Cited

U.S. PATENT DOCUMENTS

| | | |
|---|---|---|
| 11,088,197 B2 | 8/2021 | Kang et al. |
| 2011/0156070 A1* | 6/2011 | Yoon ................. H01L 33/42 |
| | | 257/98 |
| 2013/0341658 A1 | 12/2013 | Lee et al. |
| 2014/0367727 A1 | 12/2014 | Lee et al. |
| 2017/0317228 A1 | 11/2017 | Sung |
| 2018/0040774 A1* | 2/2018 | Lee ................. H01L 33/62 |
| 2018/0175104 A1* | 6/2018 | Kang ................. F21K 9/68 |
| 2019/0165037 A1* | 5/2019 | Chae ............. H01L 25/0756 |
| 2020/0044116 A1* | 2/2020 | Chen ................. H01L 33/32 |
| 2020/0127167 A1* | 4/2020 | Lee ................. H01L 33/46 |
| 2021/0167050 A1* | 6/2021 | Cho ................. H10D 86/441 |
| 2021/0226165 A1 | 7/2021 | Ko et al. |
| 2021/0288033 A1* | 9/2021 | Lim ............. H01L 25/0753 |
| 2021/0313494 A1* | 10/2021 | Im ................. H01L 33/20 |
| 2021/0366978 A1 | 11/2021 | Kang et al. |
| 2023/0016834 A1 | 1/2023 | Jeong et al. |

FOREIGN PATENT DOCUMENTS

| | | |
|---|---|---|
| KR | 10-2020-0021014 A | 2/2020 |
| KR | 10-2020-0077671 A | 7/2020 |
| KR | 10-2021-0025144 A | 3/2021 |
| KR | 2021-0095266 A | 8/2021 |
| KR | 2023-0014038 A | 1/2023 |

* cited by examiner

LIGHT EMITTING ELEMENT WITH AN INSULATING FILM COMPRISING MULTIPLE PAIR LAYERS

CROSS-REFERENCE TO RELATED APPLICATION

This application claims priority to and the benefit of Korean Patent Application No. 10-2021-0161852 filed on Nov. 23, 2021, in the Korean Intellectual Property Office, the entire content of which is incorporated by reference herein.

BACKGROUND

1. Field

The present disclosure relates to a light emitting element and a display device including the same.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

SUMMARY

Aspects of the present disclosure provide a light emitting element having improved output efficiency of light generated by a light emitting layer and a display device including the light emitting element.

Aspects of the present disclosure also provide a display device in which an electrical short circuit between connection electrodes electrically connected to a light emitting element is prevented.

However, aspects of the present disclosure are not limited to the ones set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes a first electrode on a substrate and a second electrode spaced from the first electrode, a first insulating layer on the first electrode and the second electrode, a plurality of light emitting elements on the first insulating layer and on the first electrode and the second electrode, a first connection electrode on the first electrode and contacting a first end of each of the plurality of light emitting elements, and a second connection electrode on the second electrode and contacting a second end of each of the plurality of light emitting elements, wherein each of the plurality of light emitting elements includes a first semiconductor layer doped with an n-type dopant, a second semiconductor layer doped with a p-type dopant, a light emitting layer between the first semiconductor layer and the second semiconductor layer, and an insulating film surrounding a part of at least the light emitting layer and including a first layer and a second layer including a different material from the first layer, wherein the insulating film further includes a plurality of pair layers, each of the plurality of pair layers including the first layer and the second layer, and the first layer and the second layer are alternately stacked.

The first layer and the second layer each may include one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$) and titanium oxide ($TiO_x$), and wherein the first layer and the second layer include different materials from each other.

The display device may further include an electrode layer on the second semiconductor layer, wherein the insulating film may surround side surfaces of the first semiconductor layer, the second semiconductor layer, the light emitting layer, and the electrode layer.

The plurality of pair layers of the insulating film may include a first pair layer in which the first layer is located on the side surfaces of the light emitting layer and a second pair layer in which the first layer is located on the second layer of the first pair layer.

The display device may further include a second insulating layer on the plurality of light emitting elements, wherein the insulating film of each of the light emitting elements may include a first part between the second insulating layer and the first semiconductor layer, the light emitting layer and the second semiconductor layer and a second part that is a region of the insulating film other than the first part, a part of the second semiconductor layer may be exposed at the first end of each of the light emitting elements, and a part of the first semiconductor layer may be exposed at the second end of each of the light emitting elements.

The first connection electrode and the second connection electrode may be spaced from each other on the second insulating layer.

The first part of the insulating film may include an undercut located under both ends of the second layer, and a length of the first layer may be smaller than that of the second layer.

The display device may further include a connection electrode pattern on the second insulating layer and including a same material as the first connection electrode and the second connection electrode, wherein the connection electrode pattern may be spaced from each of the first connection electrode and the second connection electrode.

Each of the plurality of light emitting elements may include a first surface that is a side surface of the first end, a second surface that is a side surface of the second end, a third surface that is a part of an upper side surface of the first end not overlapping the second insulating layer, and a fourth surface that is a part of an upper side surface of the second end not overlapping the second insulating layer, the first connection electrode may contact the first surface and the third surface of each light emitting element, and the second connection electrode may contact the second surface and the fourth surface of each light emitting element.

The first connection electrode may contact the second semiconductor layer at the third surface, and the second connection electrode may contact the first semiconductor layer at the fourth surface.

The display device may further include a third insulating layer on the second insulating layer and the second connection electrode, wherein a part of the first connection electrode may be on the third insulating layer.

Each of the plurality of light emitting elements may extend in a direction, a length of the insulating film measured in the direction may be smaller than a length of each of the plurality of light emitting elements measured in the direction, and a length of the first layer of the insulating film measured in the direction may be smaller than a length of the second layer measured in the direction.

Each of the plurality of light emitting elements may include a first surface that is a side surface of the first end, a second surface that is a side surface of the second end, a third surface that is an upper side surface of the first end, and a fourth surface that is an upper side surface of the second end, the first connection electrode may contact the first surface and the third surface of each light emitting element, the second connection electrode may contact the second surface and the fourth surface of each light emitting element, and the first connection electrode and the second connection electrode may be spaced from each other with the insulating film interposed therebetween.

The display device may further include a connection electrode pattern on the insulating film of each light emitting element and including a same material as the first connection electrode and the second connection electrode, wherein each of the first connection electrode and the second connection electrode may be spaced from the connection electrode pattern.

The first connection electrode may contact a first surface that is a side surface of the first end of each of the plurality of light emitting elements, the second connection electrode may a second surface that is a side surface of the second end of each of the plurality of light emitting elements, in each of the plurality of light emitting elements, the insulating film may cover only a part of an outer surface of the light emitting layer, and a fifth surface that is an upper side surface on which the insulating film is not located may be exposed.

According to an embodiment of the disclosure, a light emitting element includes a first semiconductor layer doped with an n-type dopant, a second semiconductor layer doped with a p-type dopant, a light emitting layer between the first semiconductor layer and the second semiconductor layer, and an insulating film surrounding a part of at least the light emitting layer and including a first layer and a second layer including a different material from the first layer, wherein the insulating film includes a plurality of pair layers, each of the plurality of pair layers including the first layer and the second layer, and the first layer and the second layer are alternately stacked.

The first layer and the second layer each may include one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$) and titanium oxide ($TiO_x$), wherein the first layer and the second layerinclude different materials from each other.

The insulating film may have a thickness of 20 nm to 100 nm, and each of the first layer and the second layer may have a thickness of 1 nm to 10 nm.

The light emitting element may further include an electrode layer on the second semiconductor layer, wherein the insulating film may surround side surfaces of the first semiconductor layer, the second semiconductor layer, the light emitting layer, and the electrode layer.

The plurality of pair layers of the insulating film may include a first pair layer in which the first layer is located on the side surfaces of the light emitting layer and a second pair layer in which the first layer is directly on the second layer of the first pair layer.

The light emitting element may extend in a direction, wherein the insulating film may surround side surfaces of at least the light emitting layer, and a length of the insulating film measured in the direction may be smaller than a length of the light emitting element measured in the direction.

In the insulating film, a length of the first layer measured in the direction may be smaller than a length of the second layer measured in the direction.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Embodiments of the present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the scope and teachings of the present disclosure. Similarly, the second element could also be termed the first element.

Hereinafter, embodiments will be described with reference to the accompanying drawings.

Figure 1:
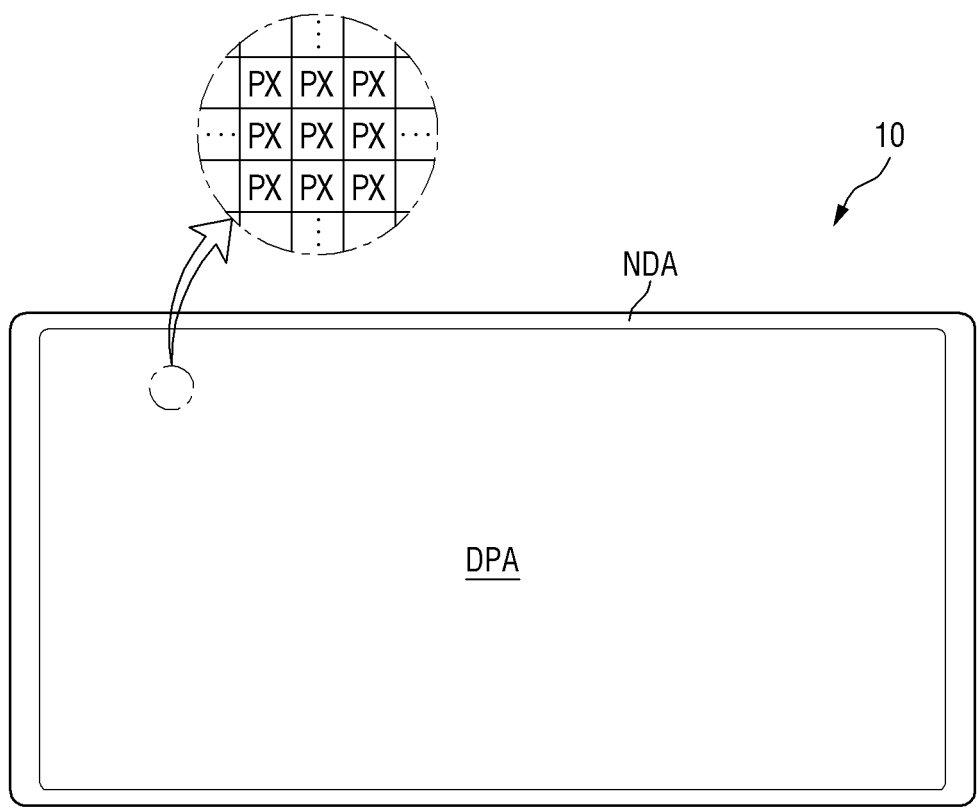
FIG. 1 is a schematic plan view of a display device according to one or more embodiments.

FIG. 1 is a schematic plan view of a display device 10 according to one or more embodiments.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the present disclosure is not limited to this case, and other display panels can also be applied as long as the same technical spirit is applicable.

The shape of the display device 10 can be variously modified. For example, the display device 10 may have various shapes such as a horizontally long rectangle, a vertically long rectangle, a square, a quadrilateral with rounded corners (e.g., vertices), other polygons, or a circle. The shape of a display area DPA of the display device 10 may also be similar to the overall shape of the display device 10. In FIG. 1, the display device 10 shaped like a rectangle that is long in a second direction DR2 is illustrated.

The display device 10 may include the display area DPA and a non-display area NDA around the edge or periphery of the display area. The display area DPA is an area where an image can be displayed, and the non-display area NDA is an area where no image is displayed. The display area DPA may also be referred to as an active area, and the non-display area NDA may also be referred to as an inactive area. The display area DPA may generally occupy the center (or the central region) of the display device 10.

The display area DPA may include a plurality of pixels PX. The pixels PX may be arranged in a matrix direction. For example, the plurality of pixels may be arranged along rows and columns of a matrix. Each of the pixels PX may be rectangular or square in a plan view. However, the present disclosure is not limited thereto, and each of the pixels PX may also have a rhombus shape having each side inclined with respect to a direction. The pixels PX may be arranged in a stripe or an island type or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILER structure)). PENTILER is a registered trademark of Samsung Display Co., Ltd., Republic of Korea. In addition, each of the pixels PX may include one or more light emitting elements that emit light of a specific wavelength band to display a specific color.

The non-display area NDA may be disposed around the edge or periphery of the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. Wirings or circuit drivers included in the display device 10 may be located, or external devices may be mounted, in each non-display area NDA.

Figure 2:
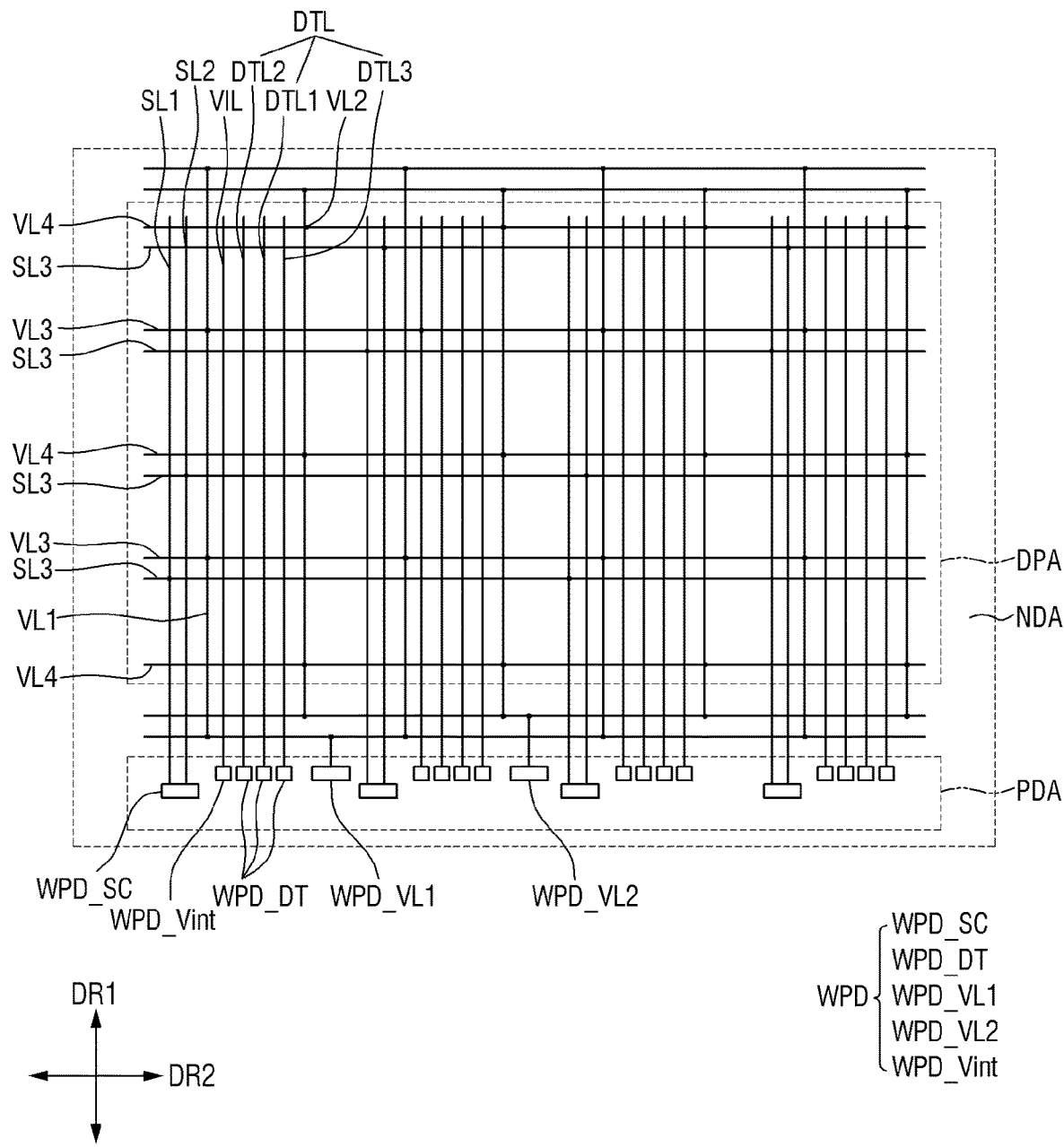
FIG. 2 is a plan view illustrating the arrangement of a plurality of wirings included in the display device according to one or more embodiments.

FIG. 2 is a plan view illustrating the arrangement of a plurality of wirings included in the display device 10 according to the embodiment.

Referring to FIG. 2, the display device 10 may include a plurality of wirings. The display device 10 may include a plurality of scan lines SL (SL1 through SL3), a plurality of data lines DTL (DTL1 through DTL3), initialization voltage lines VIL, and a plurality of voltage lines VL (VL1 through VL4). In one or more embodiments, other wirings may be further disposed in the display device 10.

First scan lines SL1 and second scan lines SL2 may extend in a first direction DR1. A first scan line SL1 and a second scan line SL2 in each pair may be disposed adjacent to each other and may be spaced from other first scan lines SL1 and other second scan lines SL2 in the second direction DR2. The first scan line SL1 and the second scan line SL2 in each pair may be connected to a scan wiring pad WPD_SC connected to a scan driver. The first scan lines SL1 and the second scan lines SL2 may extend from a pad area PDA disposed in the non-display area NDA to the display area DPA.

Third scan lines SL3 may extend in the second direction DR2, and each of the third scan lines SL3 may be spaced from other third scan lines SL3 in the first direction DR1. One third scan line SL3 may be connected to one or more first scan lines SL1 or one or more second scan lines SL2. In one or more embodiments, the first scan lines SL1 and the second scan lines SL2 may be formed of a conductive layer disposed on a different layer from the third scan lines SL3. The scan lines SL may have a mesh structure in the entire display area DPA, but the present disclosure is not limited thereto.

In the specification, the term "connect" may mean that any one member and another member are connected to each other not only through physical contact but also through another member. In addition, it can be understood that any one part and another part are connected to each other as one integrated member. Further, the connection between any one member and another member can be interpreted to include electrical connection through another member in addition to connection through direct contact.

The data lines DTL may extend in the first direction DR1. The data lines DTL include first data lines DTL1, second data lines DTL2, and third data lines DTL3. One each of the first through third data lines DTL1 through DTL3 form one group and are disposed adjacent to each other. Each of the data lines DTL1 through DTL3 may extend from the pad WPD_DT in the pad area PDA disposed in the non-display area NDA to the display area DPA. However, the present disclosure is not limited thereto, and the data lines DTL may be disposed at equal intervals between a first voltage line VL1 and a second voltage line VL2 in each pair that will be described later.

The initialization voltage lines VIL may extend in the first direction DR1. Each of the initialization voltage lines VIL may be disposed between the data lines DTL and the first and second scan lines SL1 and SL2. The initialization voltage lines VIL may extend from the pad WPD_Vint in the pad area PDA disposed in the non-display area NDA to the display area DPA.

First voltage lines VL1 and second voltage lines VL2 extend in the first direction DR1, and third voltage lines VL3 and fourth voltage lines VL4 extend in the second direction DR2. The first voltage lines VL1 and the second voltage lines VL2 may be alternately disposed along the second direction DR2, and the third voltage lines VL3 and the fourth voltage lines VL4 may be alternately disposed along the first direction DR1. The first voltage lines VL1 and the second voltage lines VL2 may extend in the first direction DR1 to cross the display area DPA. Among the third voltage lines VL3 and the fourth voltage lines VL4, some lines may be disposed in the display area DPA, and other lines may be disposed in the non-display area NDA located on both sides of the display area DPA in the first direction DR1. The first voltage lines VL1 and the second voltage lines VL2 may be formed of a conductive layer disposed on a different layer from the third voltage lines VL3 and the fourth voltage lines VL4. Each of the first voltage lines VL1 may be connected to at least one third voltage line VL3, and each of the second voltage lines VL2 may be connected to at least one fourth voltage line VL4. The voltage lines VL may have a mesh structure in the entire display area DPA. However, the present disclosure is not limited thereto.

The first scan lines SL1, the second scan lines SL2, the data lines DTL, the initialization voltage lines VIL, the first voltage lines VL1, and the second voltage lines VL2 may be electrically connected to at least one wiring pad WPD. Each wiring pad WPD may be disposed in the non-display area NDA. In one or more embodiments, each wiring pad WPD may be disposed in the pad area PDA located on a lower side of the display area DPA that is a second side in the first direction DR1. Each pair of the first and second scan lines SL1 and SL2 are connected to a scan wiring pad WPD_SC disposed in the pad area PDA, and the data lines DTL are connected to different data wiring pads WPD_DT, respectively. Each of the initialization voltage lines VIL is connected to an initialization wiring pad WPD_Vint, the first voltage lines VL1 are connected to a first voltage wiring pad WPD_VL1, and the second voltage lines VL2 are connected to a second voltage wiring pad WPD_VL2. An external device may be mounted on the wiring pads WPD. The external device may be mounted on the wiring pads WPD through an anisotropic conductive film, ultrasonic bonding, or the like. Although each wiring pad WPD is disposed in the pad area PDA located on the lower side of the display area DPA in the drawing, the present disclosure is not limited thereto. Some of the wiring pads WPD may also be disposed in an area located on an upper side or any one of left and right sides of the display area DPA.

Each pixel PX or subpixel SPXn (where n is an integer of 1 to 3) of the display device 10 includes a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit can be variously changed. According to one or more embodiments, each subpixel SPXn of the display device 10 may have a 3T1C structure in which the pixel driving circuit includes three transistors and one capacitor. Although the pixel driving circuit will be described below using the 3T1C structure as an example, the present disclosure is not limited thereto, and other various modified pixel structures such as a 2T1C structure, a 7T1C structure, and a 6T1C structure are also applicable.

Figure 3:
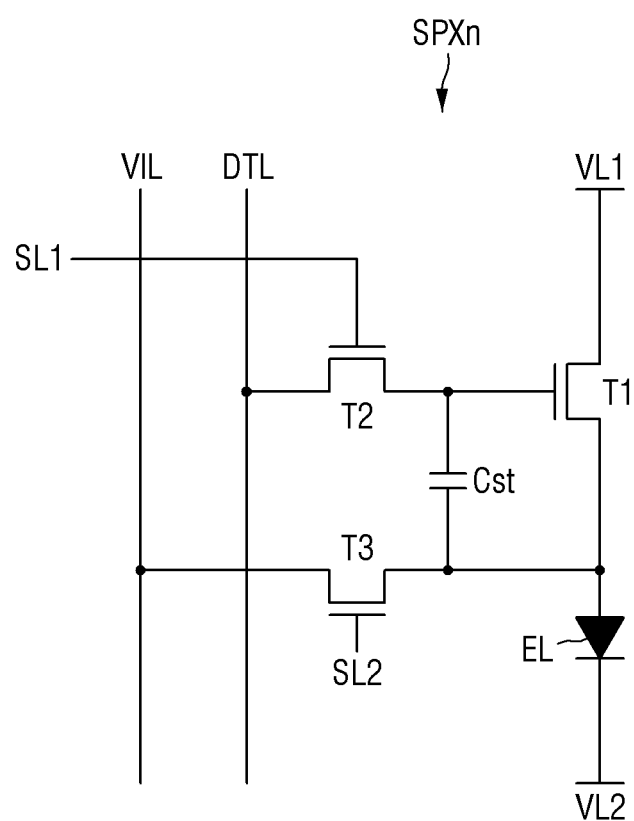
FIG. 3 is an equivalent circuit diagram of a subpixel according to one or more embodiments.

FIG. 3 is an equivalent circuit diagram of a subpixel SPXn according to one or more embodiments.

Referring to FIG. 3, each subpixel SPXn of the display device 10 according to one or more embodiments includes three transistors T1 through T3 and one storage capacitor Cst in addition to a light emitting diode EL.

The light emitting diode EL emits light according to a current supplied through a first transistor T1 (e.g., a driving transistor). The light emitting diode EL includes a first electrode, a second electrode, and at least one light emitting element disposed between them. The light emitting element may emit light of a specific wavelength band in response to electrical signals received from the first electrode and the second electrode.

A first end of the light emitting diode EL may be connected to a source electrode of the first transistor T1, and a second end of the light emitting diode EL may be connected to a second voltage line VL2 to which a low potential voltage (hereinafter, referred to as a second power supply voltage) lower than a high potential voltage (hereinafter, referred to as a first power supply voltage) of a first voltage line VL1 is supplied.

The first transistor T1 adjusts a current flowing from the first voltage line VL1, to which the first power supply voltage is supplied, to the light emitting diode EL according to a voltage difference between a gate electrode and the source electrode of the first transistor T1. For example, the first transistor T1 may be a driving transistor for driving the light emitting diode EL. The first transistor T1 may have the gate electrode connected to a source electrode of a second transistor T2 (e.g., a switching transistor), the source electrode connected to the first electrode of the light emitting diode EL, and a drain electrode connected to the first voltage line VL1 to which the first power supply voltage is applied.

The second transistor T2 is turned on by a scan signal of a first scan line SL1 to connect a data line DTL to the gate electrode of the first transistor T1. The second transistor T2 may have a gate electrode connected to the first scan line SL1, the source electrode connected to the gate electrode of the first transistor T1, and a drain electrode connected to the data line DTL.

A third transistor T3 is turned on by a scan signal of a second scan line SL2 to connect an initialization voltage line VIL to the first end of the light emitting diode EL. The third transistor T3 may have a gate electrode connected to the second scan line SL2, a drain electrode connected to the initialization voltage line VIL, and a source electrode connected to the first end of the light emitting diode EL or the source electrode of the first transistor T1.

In one or more embodiments, the source electrode and the drain electrode of each of the transistors T1 through T3 are not limited to the above description, and the opposite may also be the case. In addition, each of the transistors T1 through T3 may be formed as a thin-film transistor (TFT). In addition, although each of the transistors T1 through T3 is mainly described as an N-type metal oxide semiconductor field effect transistor (MOSFET) in FIG. 3, the present disclosure is not limited thereto. That is, each of the transistors T1 through T3 may also be formed as a P-type MOSFET, or some of the transistors T1 through T3 may be formed as N-type MOSFETs, and the other may be formed as a P-type MOSFET.

The storage capacitor Cst is formed between the gate electrode and the source electrode of the first transistor T1. The storage capacitor Cst stores a difference between a gate voltage and a source voltage of the first transistor T1.

The structure of a pixel PX of the display device 10 according to one or more embodiments will now be described in detail with further reference to other drawings.

Figure 4:
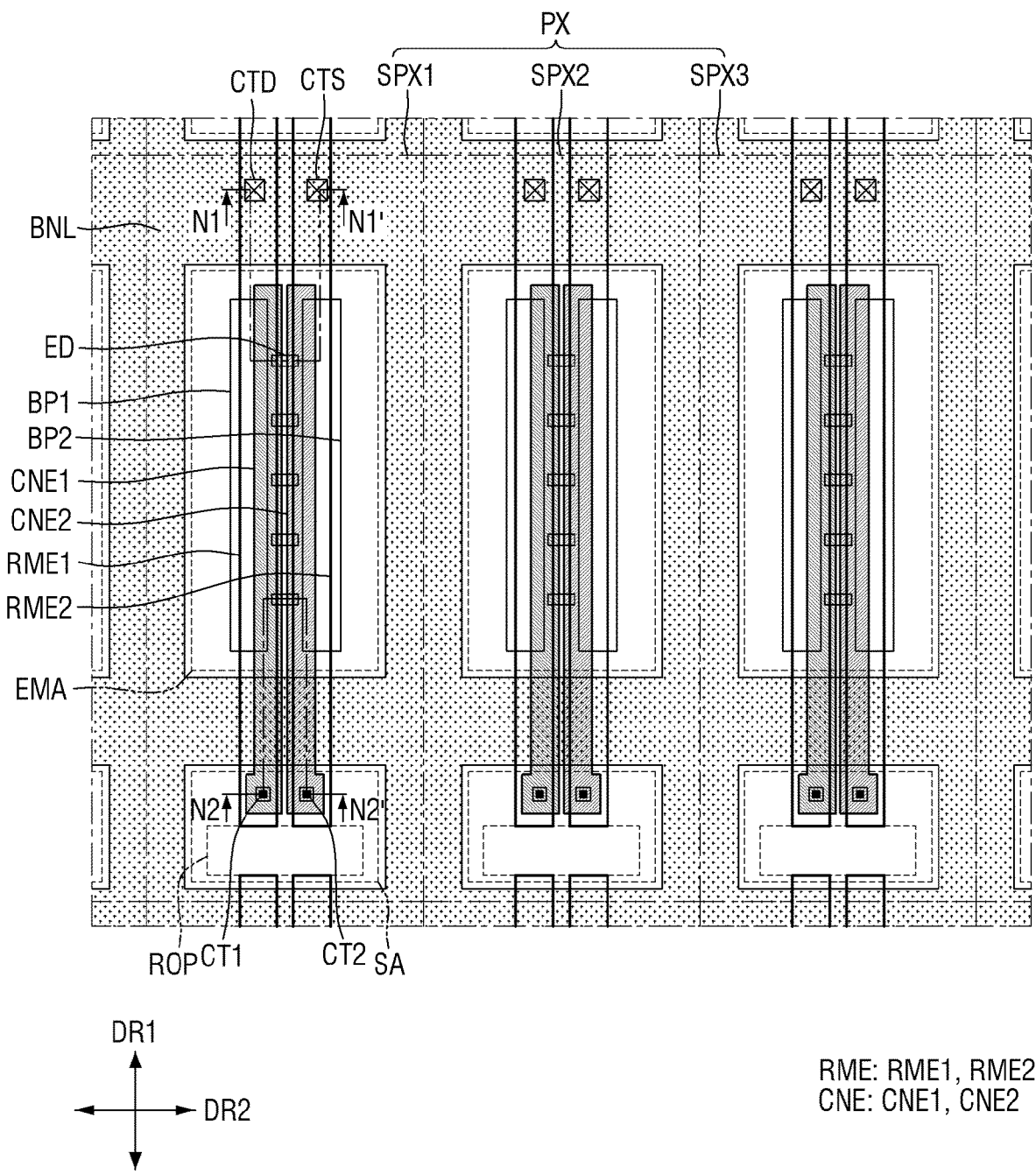
FIG. 4 is a plan view of a pixel of the display device according to one or more embodiments.

FIG. 4 is a plan view of a pixel PX of the display device 10 according to one or more embodiments. FIG. 4 illustrates the planar arrangement of electrodes RME (RME1 and RME2), bank patterns BP1 and BP2, a bank layer BNL, a plurality of light emitting elements ED, and connection electrodes CNE (CNE1 and CNE2) disposed in one pixel PX of the display device 10.

Referring to FIG. 4, each of the pixels PX of the display device 10 may include a plurality of subpixels SPXn. For example, one pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the present disclosure is not limited thereto, and the subpixels SPXn may also emit light of the same color. In one or more embodiments, the subpixels SPXn may emit blue light. Although one pixel PX includes three subpixels SPXn in the drawing, the present disclosure is not limited thereto, and the pixel PX may also include a greater number of subpixels SPXn.

Each subpixel SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area.

The emission area EMA may include an area in which the light emitting elements ED are disposed and an area which is adjacent to the light emitting elements ED and from which light emitted from the light emitting elements ED is output. For example, the emission area EMA may also include an area from which light emitted from the light emitting elements ED is output after being reflected or refracted by other members. A plurality of light emitting elements ED may be disposed in each subpixel SPXn, and an area where the light emitting elements ED are disposed and an area adjacent to this area may form the emission area EMA.

Although the respective emission areas EMA of the subpixels SPXn have substantially the same area in the drawing, the present disclosure is not limited thereto. In one or more embodiments, the emission area EMA of each subpixel SPXn may have a different area according to the color or wavelength band of light emitted from the light emitting elements ED disposed in the subpixel SPXn.

Each subpixel SPXn may further include a sub-area SA disposed in the non-emission area. The sub-area SA of a corresponding subpixel SPXn may be disposed on a lower side of the emission area EMA which is the second side in the first direction DR1. The emission area EMA and the sub-area SA may be alternately arranged along the first direction DR1, and the sub-area SA may be disposed between the emission areas EMA of different subpixels SPXn spaced from each other in the first direction DR1. For example, the emission area EMA and the sub-area SA may be alternately arranged along the first direction DR1 and may each be repeatedly arranged along the second direction DR2. However, the present disclosure is not limited thereto, and the arrangement of the emission areas EMA and the sub-areas SA in a plurality of pixels PX may also be different from that in FIG. 4.

Light may not exit from the sub-area SA because the light emitting elements ED are not disposed in the sub-area SA, but a part of each of the electrodes RME disposed in each subpixel SPXn may be disposed in the sub-area SA. The electrodes RME disposed in different subpixels SPXn may be separated from each other in a separation part ROP of the sub-area SA.

Wirings and circuit elements of a circuit layer disposed in each pixel PX and connected to the light emitting diodes EL may be connected to each of the first through third subpixels SPX1 through SPX3. However, the wirings and the circuit elements are not disposed to correspond to an area occupied by each subpixel SPXn or each emission area EMA but may be disposed regardless of the positions of the emission areas EMA in one pixel PX.

The bank layer BNL may be around (e.g., may surround) the subpixels SPXn, the emission areas EMA, and the sub-areas SA. The bank layer BNL may be disposed at boundaries between the subpixels SPXn adjacent to each other in the first direction DR1 and the second direction DR2 and also may be disposed at boundaries between the emission areas EMA and the sub-areas SA. The subpixels SPXn, the emission areas EMA, and the sub-areas SA of the display device 10 may be areas separated by the arrangement of the bank layer BNL. Distances between the subpixels SPXn, the emission areas EMA, and the sub-areas SA may vary according to a width of the bank layer BNL.

The bank layer BNL may include parts extending in the first direction DR1 and the second direction DR2 in a plan view to form a grid pattern in the entire display area DPA. The bank layer BNL may be disposed at the boundary of each subpixel SPXn to separate neighboring subpixels SPXn. In addition, the bank layer BNL may surround the emission area EMA and the sub-area SA disposed in each subpixel SPXn to separate them from each other.

Figure 5:
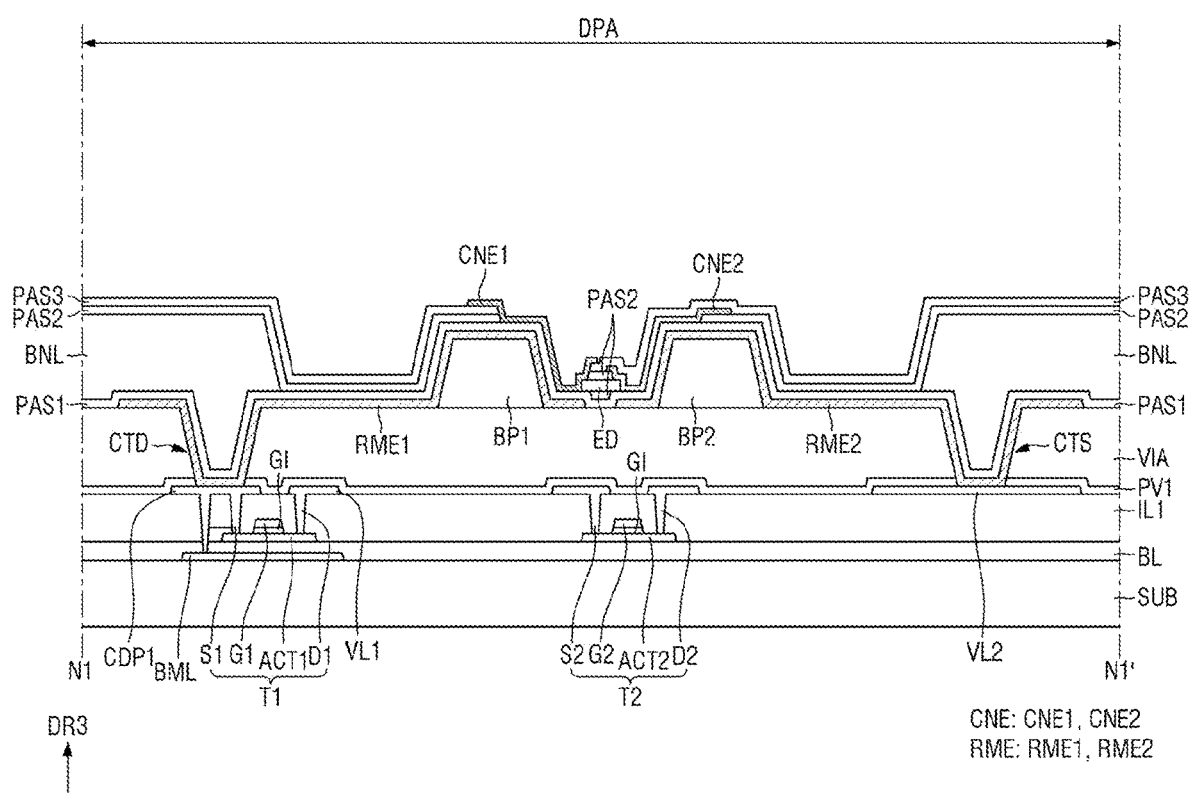
FIG. 5 is a cross-sectional view taken along the line N1-N1' of FIG. 4.
Figure 6:
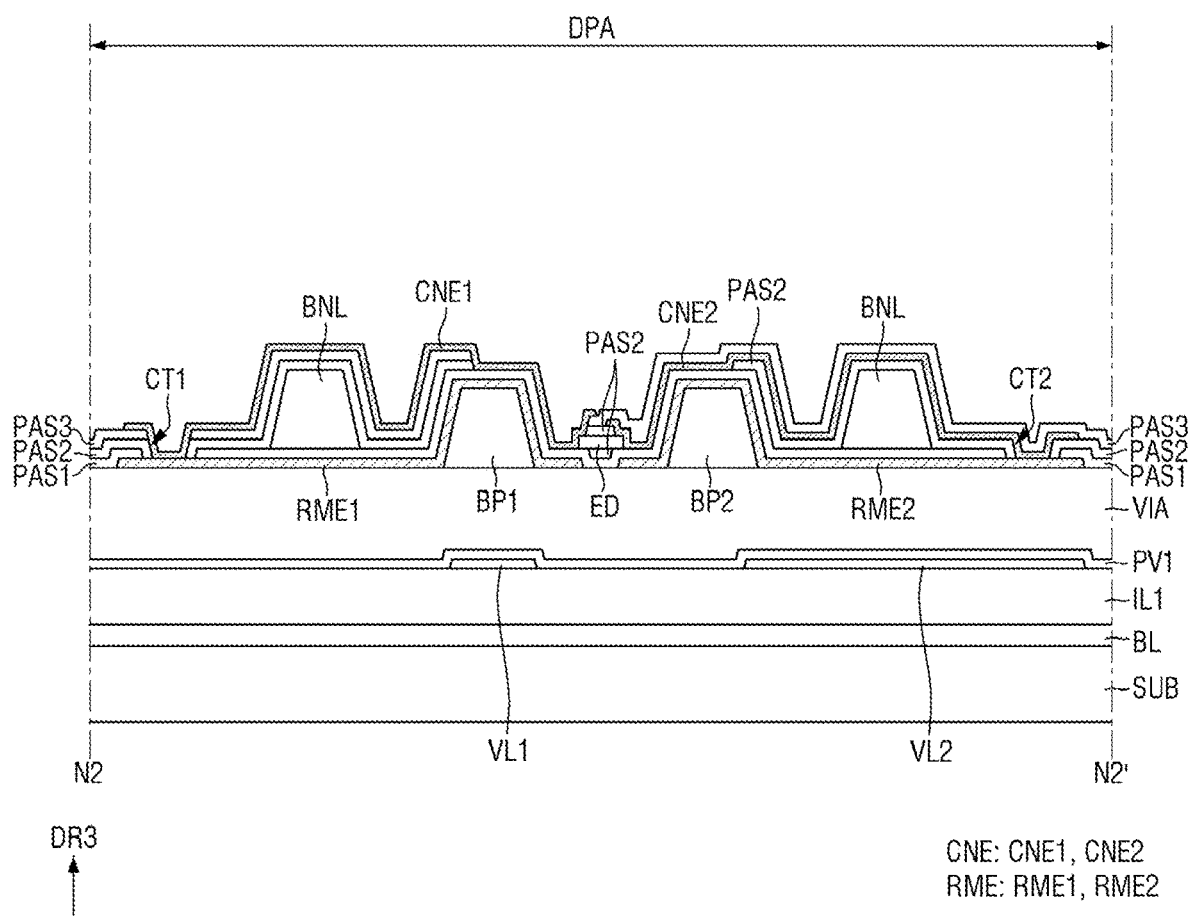
FIG. 6 is a cross-sectional view taken along the line N2-N2' of FIG. 4.

FIG. 5 is a cross-sectional view taken along the line N1-N1' of FIG. 4. FIG. 6 is a cross-sectional view taken along line N2-N2' of FIG. 4. FIG. 5 illustrates a cross section across both ends of a light emitting element ED and electrode contact holes CTD and CTS disposed in the first subpixel SPX1. FIG. 6 is a cross-sectional view taken along the line N2-N2' of FIG. 4. For example, FIG. 6 illustrates a cross section across both ends of a light emitting element ED and contact parts CT1 and CT2 disposed in the first subpixel SPX1.

Referring to FIGS. 5 and 6 in conjunction with FIG. 4, the display device 10 may include a first substrate SUB and a semiconductor layer, a plurality of conductive layers and a plurality of insulating layers disposed on the first substrate SUB. In addition, the display device 10 may include the electrodes RME (RME1 and RME2), the light emitting elements ED, and the connection electrodes CNE (CNE1 and CNE2). The semiconductor layer, the conductive layers, and the insulating layers may constitute a circuit layer of the display device 10.

The first substrate SUB may be an insulating substrate. The first substrate SUB may be made of an insulating material such as glass, quartz, or polymer resin. In addition, the first substrate SUB may be a rigid substrate, but may also be a flexible substrate that can be bent, folded, rolled, etc. The first substrate SUB may include the display area DPA and the non-display area NDA surrounding the display area DPA, and the display area DPA may include the emission area EMA and the sub-area SA that is a part of the non-emission area.

A first conductive layer may be disposed on the first substrate SUB. The first conductive layer includes a bottom metal layer BML, and the bottom metal layer BML is overlapped by an active layer ACT1 of a first transistor T1 in a thickness direction of the first substrate SUB (e.g., a third direction DR3). The bottom metal layer BML may prevent light from entering the first active layer ACT1 of the first transistor T1 or may be electrically connected to the first active layer ACT1 to stabilize electrical characteristics of the first transistor T1. However, the bottom metal layer BML may also be omitted.

A buffer layer BL may be disposed on the bottom metal layer BML and the first substrate SUB. The buffer layer BL may be formed on the first substrate SUB to protect transistors of the pixel PX from moisture introduced through the first substrate SUB that is vulnerable to moisture penetration and may perform a surface planarization function.

The semiconductor layer is disposed on the buffer layer BL. The semiconductor layer may include the first active layer ACT1 of the first transistor T1 and a second active layer ACT2 of a second transistor T2. The first active layer ACT1 and the second active layer ACT2 may respectively be partially overlapped by a first gate electrode G1 and a second gate electrode G2 of a second conductive layer, which will be described later, in the third direction DR3.

The semiconductor layer may include polycrystalline silicon, monocrystalline silicon, an oxide semiconductor, or the like. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in each subpixel SPXn of the display device 10 in the drawings, the present disclosure is not limited thereto, and the display device 10 may include a greater number of transistors.

A first gate insulating layer GI is disposed on the semiconductor layer in the display area DPA. The first gate insulating layer GI may not be disposed in the pad area PDA. The first gate insulating layer GI may serve as a gate insulating film of each of the transistors T1 and T2. In the drawings, the first gate insulating layer GI is patterned together with the gate electrodes G1 and G2 of the second conductive layer to be described later and is thus partially disposed between the second conductive layer and the active layers ACT1 and ACT2 of the semiconductor layer. However, the present disclosure is not limited thereto. In one or more embodiments, the first gate insulating layer GI may be disposed on the entire surface of the buffer layer BL.

The second conductive layer is disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3 which is a thickness direction, and the second gate electrode G2 may overlap a channel region of the second active layer ACT2 in the third direction DR3 which is the thickness direction. In one or more embodiments, the second conductive layer may further include one electrode of a storage capacitor.

A first interlayer insulating layer IL1 is disposed on the second conductive layer, the semiconductor layer, and the buffer layer BL. The first interlayer insulating layer IL1 may function as an insulating film between the second conductive layer and other layers disposed on the second conductive layer and may protect the second conductive layer.

A third conductive layer is disposed on the first interlayer insulating layer IL1. The third conductive layer may include a first voltage line VL1 and a second voltage line VL2 disposed in the display area DPA, a first conductive pattern CDP1, and a source electrode S1 or S2 and a drain electrode D1 or D2 of each of the transistors T1 and T2. In one or more embodiments, the third conductive layer may further include the other electrode of the storage capacitor.

A high potential voltage (or a first power supply voltage) supplied to a first electrode RME1 may be applied to the first voltage line VL1, and a low potential voltage (or a second power supply voltage) supplied to a second electrode RME2 may be applied to the second voltage line VL2. A part of the first voltage line VL1 may contact the first active layer ACT1 of the first transistor T1 through a contact hole penetrating the first interlayer insulating layer IL1. The first voltage line VL1 may serve as a first drain electrode D1 of the first transistor T1. The second voltage line VL2 may be directly connected to the second electrode RME2 to be described later.

The first conductive pattern CDP may contact the first active layer ACT1 of the first transistor T1 through a contact hole penetrating the first interlayer insulating layer IL1. The first conductive pattern CDP may contact the bottom metal layer BML through another contact hole penetrating the first interlayer insulating layer IL1 and the buffer layer BL. The first conductive pattern CDP may serve as a first source electrode S1 of the first transistor T1. In addition, the first conductive pattern CDP may be connected to the first electrode RME1 or a first connection electrode CNE1 to be described later. The first transistor T1 may transmit the first power supply voltage received from the first voltage line VL1 to the first electrode RME1 or the first connection electrode CNE1.

Each of a second source electrode S2 and a second drain electrode D2 may contact the second active layer ACT2 of the second transistor T2 through a contact hole penetrating the first interlayer insulating layer IL1. The second transistor T2 may be any one of the switching transistors described above with reference to FIG. 3. The second transistor T2 may transmit a signal received from the data line DTL of FIG. 3 to the first transistor T1 or transmit a signal received from the initialization voltage line VIL of FIG. 3 to the other electrode of the storage capacitor Cst.

A first passivation layer PV1 is disposed on the third conductive layer. The first passivation layer PV1 may function as an insulating film between the third conductive layer and other layers and may protect the third conductive layer.

Each of the buffer layer BL, the first gate insulating layer GI, the first interlayer insulating layer IL1, and the first passivation layer PV1 described above may be composed of a plurality of inorganic layers stacked alternately. For example, each of the buffer layer BL, the first gate insulating layer GI, the first interlayer insulating layer IL1, and the first passivation layer PV1 may be a double layer in which inorganic layers including at least any one of silicon oxide ($SiO_x$), silicon nitride ($SiN_x$) and silicon oxynitride ($SiO_xN_y$) are stacked or may be a multilayer in which the above inorganic layers are alternately stacked. However, the present disclosure is not limited thereto, and each of the buffer layer BL, the first gate insulating layer GI, the first interlayer insulating layer IL1, and the first passivation layer PV1 may also be composed of one inorganic layer including any one of the above insulating materials. In addition, in one or more embodiments, the first interlayer insulating layer IL1 may be made of an organic insulating material such as polyimide (PI).

A via layer VIA is disposed on the first passivation layer PV1 on the third conductive layer in the display area DPA. The via layer VIA may include an organic insulating material such as polyimide (PI) to compensate for a step difference due to the conductive layers thereunder and may form a flat upper surface. However, in one or more embodiments, the via layer VIA may be omitted.

The display device 10 may include, as a display element layer disposed on the via layer VIA, the bank patterns BP1 and BP2, the electrodes RME (RME1 and RME2), the bank layer BNL, the light emitting elements ED, and the connection electrodes CNE (CNE1 and CNE2). In addition, the display device 10 may include a first insulating layer PAS1 disposed on the via layer VIA and insulating layers PAS2 and PAS3.

The bank patterns BP1 and BP2 may be disposed in the emission area EMA of each subpixel SPXn. Each of the bank patterns BP1 and BP2 may have a suitable width (e.g., a predetermined width) in the second direction DR2 and may extend in the first direction DR1.

For example, the bank patterns BP1 and BP2 may include a first bank pattern BP1 and a second bank pattern BP2 spaced from each other in the second direction DR2 in the emission area EMA of each subpixel SPXn. The first bank pattern BP1 may be disposed on a left side of the center of the emission area EMA which is a first side in the second direction DR2, and the second bank pattern BP2 may be spaced from the first bank pattern BP1 and disposed on a right side of the center of the emission area EMA which is a second side in the second direction DR2. The first bank pattern BP1 and the second bank pattern BP2 may be alternately disposed along the second direction DR2 and may be disposed as island-shaped patterns in the display area DPA. A plurality of light emitting elements ED may be disposed between the first bank pattern BP1 and the second bank pattern BP2.

Lengths of the first bank pattern BP1 and the second bank pattern BP2 in the first direction DR1 may be the same but may be smaller than a length, in the first direction DR1, of the emission area EMA surrounded by the bank layer BNL. The first bank pattern BP1 and the second bank pattern BP2 may be spaced from parts of the bank layer BNL that extend in the second direction DR2. However, the present disclosure is not limited thereto, and the bank patterns BP1 and BP2 may also be integrated with the bank layer BNL or may partially overlap the parts of the bank layer BNL that extend in the second direction DR2. In this case, the length of each of the bank patterns BP1 and BP2 in the first direction DR1 may be equal to or greater than the length, in the first direction DR1, of the emission area EMA surrounded by the bank layer BNL.

The first bank pattern BP1 and the second bank pattern BP2 may have the same width in the second direction DR2. However, the present disclosure is not limited thereto, and the first bank pattern BP1 and the second bank pattern BP2 may also have different widths. For example, any one bank pattern may have a greater width than the other bank pattern, and the bank pattern having a greater width may be disposed over the emission areas EMA of different subpixels SPXn adjacent to each other in the second direction DR2. In this case, the bank pattern (e.g., the second bank pattern BP2) disposed over a plurality of emission areas EMA may overlap a part of the bank layer BNL, which extends in the first direction DR1, in the thickness direction of the first substrate SUB (e.g., the third direction DR3). Although two bank patterns BP1 and BP2 having the same width are disposed in each subpixel SPXn in the drawings, the present disclosure is not limited thereto. The number and shape of the bank patterns BP1 and BP2 may vary according to the number or arrangement structure of the electrodes RME.

The bank patterns BP1 and BP2 may be disposed on the via layer VIA. For example, the bank patterns BP1 and BP2 may be directly disposed on the via layer VIA, and at least a part of each of the bank patterns BP1 and BP2 may protrude from the upper surface of the via layer VIA. The protruding part of each of the bank patterns BP1 and BP2 may have inclined side surfaces or curved side surfaces with a predetermined curvature, and light emitted from the light emitting elements ED may be reflected upward above the via layer VIA by the electrodes RME disposed on the bank patterns BP1 and BP2. Unlike in the drawings, each of the bank patterns BP1 and BP2 may also have a shape having an outer surface curved with a suitable curvature (e.g., a predetermined curvature) in a cross section, for example, a semicircular or semielliptical shape. The bank patterns BP1 and BP2 may include, but are not limited to, an organic insulating material such as polyimide (PI).

The electrodes RME (RME1 and RME2) extend in one direction and are disposed in each subpixel SPXn. The electrodes RME1 and RME2 may extend in the first direction DR1 to lie in the emission area EMA and the sub-area SA of each subpixel SPXn and may be spaced from each other in the second direction DR2. The electrodes RME may be electrically connected to the light emitting elements ED to be described later, but the present disclosure is not limited thereto. The electrodes RME may also not be electrically connected to the light emitting elements ED.

The display device 10 may include the first electrode RME1 and the second electrode RME2 disposed in each subpixel SPXn. The first electrode RME1 is disposed on the left side of the center of the emission area EMA, and the second electrode RME2 is spaced from the first electrode RME1 in the second direction DR2 and disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may extend beyond the bank layer BNL to lie in a corresponding subpixel SPXn and a part of the sub-area SA. The first electrodes RME1 and the second electrodes RME2 of different subpixels SPXn may be spaced from each other by the separation part ROP located in the sub-area SA of any one subpixel SPXn.

Although two electrodes RME extend in the first direction DR1 in each subpixel SPXn in the drawings, the present disclosure is not limited thereto. For example, in the display device 10, a greater number of the electrodes RME may be disposed in one subpixel SPXn, or the electrodes RME may be partially bent and may have a different width according to position.

The first electrode RME1 and the second electrode RME2 may be disposed on at least the inclined side surfaces of the bank patterns BP1 and BP2. In one or more embodiments, widths of the electrodes RME measured in the second direction DR2 may be smaller than the widths of the bank patterns BP1 and BP2 measured in the second direction DR2, and a distance between the first electrode RME1 and the second electrode RME2 in the second direction DR2 may be smaller than a distance between the bank patterns BP1 and BP2. At least a part of each of the first electrode RME1 and the second electrode RME2 may be directly disposed on the via layer VIA so that they lie in the same plane.

The light emitting elements ED disposed between the bank patterns BP1 and BP2 may emit light in directions toward both ends thereof, and the emitted light may travel toward the electrodes RME disposed on the bank patterns BP1 and BP2. Each electrode RME may have a structure in which a part disposed on a bank pattern BP1 or BP2 can reflect light emitted from the light emitting elements ED. Each of the first electrode RME1 and the second electrode RME2 may cover at least one side surface of the bank pattern BP1 or BP2 to reflect light emitted from the light emitting elements ED.

Each of the electrodes RME may directly contact the third conductive layer through an electrode contact hole CTD or CTS in a part overlapping the bank layer BNL between the emission area EMA and the sub-area SA. A first electrode contact hole CTD may be formed in an area in which the bank layer BNL and the first electrode RME1 overlap, and a second electrode contact hole CTS may be formed in an area in which the bank layer BNL and the second electrode RME2 overlap. The first electrode RME1 may contact the first conductive pattern CDP1 through the first electrode contact hole CTD penetrating the via layer VIA and the first passivation layer PV1. The second electrode RME2 may contact the second voltage line VL2 through the second electrode contact hole CTS penetrating the via layer VIA and the first passivation layer PV1. The first electrode RME1 may be electrically connected to the first transistor T1 through the first conductive pattern CDP1 to receive the first power supply voltage, and the second electrode RME2 may be electrically connected to the second voltage line VL2 to receive the second power supply voltage. However, the present disclosure is not limited thereto. In one or more embodiments, the electrodes RME1 and RME2 may not be electrically connected to the voltage lines VL1 and VL2 of the third conductive layer, and the connection electrodes CNE to be described later may be directly connected to the third conductive layer.

The electrodes RME may include a conductive material having high reflectivity. For example, each of the electrodes RME may include a metal such as silver (Ag), copper (Cu) or aluminum (Al), may be an alloy including aluminum (Al), nickel (Ni) or lanthanum (La), or may have a structure in which a metal layer such as titanium (Ti), molybdenum (Mo) or niobium (Nb) and the above alloy are stacked. In one or more embodiments, each of the electrodes RME may be a double layer or a multilayer in which an alloy including aluminum (Al) and at least one metal layer made of titanium (Ti), molybdenum (Mo) or niobium (Nb) are stacked.

However, the present disclosure is not limited thereto, and each electrode RME may further include a transparent conductive material. For example, each electrode RME may include a material such as ITO, IZO or ITZO. In one or more embodiments, each electrode RME may have a structure in which a transparent conductive material and a metal layer having high reflectivity are each stacked in one or more layers or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect some of the light emitted from the light emitting elements ED in an upward direction above the first substrate SUB.

The first insulating layer PAS1 may be disposed in the entire display area DPA and may be disposed on the via layer VIA and the electrodes RME. The first insulating layer PAS1 may protect the electrodes RME while insulating them from each other. For example, because the first insulating layer PAS1 covers the electrodes RME before the bank layer BNL is formed, it may prevent the electrodes RME from being damaged in the process of forming the bank layer BNL. The first insulating layer PAS1 may also prevent the light emitting elements ED disposed thereon from directly contacting other members and thus being damaged.

In one or more embodiments, the first insulating layer PAS1 may be stepped such that a part of an upper surface of the first insulating layer PAS1 is depressed between the electrodes RME that are spaced from each other in the second direction DR2. The light emitting elements ED may be disposed on the stepped upper surface of the first insulating layer PAS1, and a space may be formed between each of the light emitting elements ED and the first insulating layer PAS1. The space may be filled with a second insulating layer PAS2 to be described later.

The bank layer BNL may be disposed on the first insulating layer PAS1. The bank layer BNL may include parts extending in the first direction DR1 and the second direction DR2 and may surround each subpixel SPXn. The bank layer BNL may surround the emission area EMA and the sub-area SA of each subpixel SPXn to separate them and may surround the outermost periphery of the display area DPA to separate the display area DPA and the non-display area NDA. The bank layer BNL may be disposed in the entire display area DPA to form a grid pattern, and areas exposed by the bank layer BNL in the display area DPA may be the emission area EMA and the sub-area SA.

Like the bank patterns BP1 and BP2, the bank layer BNL may have a suitable height (e.g., a predetermined height). In one or more embodiments, an upper surface of the bank layer BNL may be at a greater height than those of the bank patterns BP1 and BP2, and a thickness of the bank layer BNL may be equal to or greater than those of the bank patterns BP1 and BP2. The bank layer BNL may prevent ink from overflowing to adjacent subpixels SPXn in an inkjet printing process during a manufacturing process of the display device 10. Like the bank patterns BP1 and BP2, the bank layer BNL may include an organic insulating material such as polyimide.

The light emitting elements ED may be disposed in the emission area EMA. The light emitting elements ED may be disposed between the bank patterns BP1 and BP2 and may be spaced from each other in the first direction DR1. In one or more embodiments, the light emitting elements ED may extend in a direction, and both ends thereof may be disposed on different electrodes RME, respectively. A length of each light emitting element ED may be greater than the distance between the electrodes RME that are spaced in the second direction DR2. The direction in which the light emitting elements ED extend may be substantially perpendicular to the first direction DR1 in which the electrodes RME extend. However, the present disclosure is not limited thereto, and the direction in which the light emitting elements ED extend may also be the second direction DR2 or a direction oblique to the second direction DR2.

The light emitting elements ED may be disposed on the first insulating layer PAS1. The light emitting elements ED may extend in a direction, and the direction in which the light emitting elements ED extend may be parallel to an upper surface of the first substrate SUB. As will be described later, each light emitting element ED may include a plurality of semiconductor layers disposed along the extending direction, and the semiconductor layers may be sequentially disposed along a direction parallel to the upper surface of the first substrate SUB. However, the present disclosure is not limited thereto. When the light emitting element ED has a different structure, the semiconductor layers may be disposed in a direction perpendicular to the first substrate SUB.

The light emitting elements ED disposed in the subpixels SPXn may emit light of different wavelength bands depending on the materials that form the semiconductor layers described above. However, the present disclosure is not limited thereto, and the light emitting elements ED disposed in the subpixels SPXn may also emit light of the same color by including the semiconductor layers made of the same material.

The light emitting elements ED may be electrically connected to the electrodes RME and the conductive layers under the via layer VIA by contacting the connection electrodes CNE (CNE1 and CNE2) and may emit light of a specific wavelength band in response to an electrical signal.

The second insulating layer PAS2 may be disposed on the light emitting elements ED, the first insulating layer PAS1, and the bank layer BNL. The second insulating layer PAS2 includes a pattern part extending in the first direction DR1 between the bank patterns BP1 and BP2 and disposed on the light emitting elements ED. The pattern part may partially cover outer surfaces (e.g., outer peripheral or circumferential surfaces) of the light emitting elements ED and may not cover both sides or both ends of the light emitting elements ED. The pattern part may form a linear or island-shaped pattern in each subpixel SPXn in a plan view. The pattern part of the second insulating layer PAS2 may protect the light emitting elements ED while fixing the light emitting elements ED in the manufacturing process of the display device 10. The second insulating layer PAS2 may be formed to completely cover the light emitting elements ED and then may be patterned to expose both ends of each light emitting element ED, and a part of the second insulating layer PAS2 may fill the space between the light emitting elements ED and the first insulating layer PAS1 under the light emitting elements ED. In addition, a part of the second insulating layer PAS2 may be disposed on the bank layer BNL and in the sub-areas SA.

The connection electrodes CNE (CNE1 and CNE2) may be disposed on the electrodes RME and the bank patterns BP1 and BP2. The connection electrodes CNE may extend in a direction and may be spaced from each other. Each of the connection electrodes CNE may contact the light emitting elements ED and may be electrically connected to the third conductive layer.

The connection electrodes CNE may include the first connection electrode CNE1 and a second connection electrode CNE2 disposed in each subpixel SPXn. The first connection electrode CNE1 may extend in the first direction DR1 and may be disposed on the first electrode RME1 or the first bank pattern BP1. The first connection electrode CNE1 may partially overlap the first electrode RME1 and may extend from the emission area EMA to the sub-area SA beyond the bank layer BNL. The second connection electrode CNE2 may extend in the first direction DR1 and may be disposed on the second electrode RME2 or the second bank pattern BP2. The second connection electrode CNE2 may partially overlap the second electrode RME2 and may extend from the emission area EMA to the sub-area SA beyond the bank layer BNL. The first connection electrode CNE1 and the second connection electrode CNE2 may contact the light emitting elements ED and may be electrically connected to the electrodes RME or a conductive layer under the electrodes RME.

For example, each of the first connection electrode CNE1 and the second connection electrode CNE2 may be disposed on side surfaces of the second insulating layer PAS2 and the first insulating layer PAS1, and may contact the light emitting elements ED. The first connection electrode CNE1 may partially overlap the first electrode RME1 and may contact ends of the light emitting elements ED. The second connection electrode CNE2 may partially overlap the second electrode RME2 and may contact the other ends of the light emitting elements ED. The connection electrodes CNE are disposed over the emission area EMA and the sub-area SA. The connection electrodes CNE may contact the light emitting elements ED in a part disposed in the emission area EMA and may be electrically connected to the third conductive layer in a part disposed in the sub-area SA.

According to one or more embodiments, in the display device 10, each of the connection electrodes CNE may contact an electrode RME through a contact part CT1 or CT2 disposed in the sub-area SA. The first connection electrode CNE1 may contact the first electrode RME1 through a first contact part CT1 penetrating the first insulating layer PAS1, the second insulating layer PAS2, and a third insulating layer PAS3 in the sub-area SA. The second connection electrode CNE2 may contact the second electrode RME2 through a second contact part CT2 penetrating the first insulating layer PAS1 and the second insulating layer PAS2 in the sub-area SA. The connection electrodes CNE may be electrically connected to the third conductive layer through the electrodes RME, respectively. The first connection electrode CNE1 may be electrically connected to the first transistor T1 to receive the first power supply voltage via the first electrode RME1, and the second connection electrode CNE2 may be electrically connected to the second voltage line VL2 to receive the second power supply voltage via the second electrode RME2. Each of the connection electrodes CNE may contact the light emitting elements ED in the emission area EMA to transmit a power supply voltage to the light emitting elements ED.

However, the present disclosure is not limited thereto. In one or more embodiments, the connection electrodes CNE may directly contact the third conductive layer or may be electrically connected to the third conductive layer through patterns other than the electrodes RME.

The connection electrodes CNE may include a conductive material such as ITO, IZO, ITZO, or aluminum (Al). For example, the connection electrodes CNE may include a transparent conductive material, and light emitted from the light emitting elements ED may be output through the connection electrodes CNE.

The third insulating layer PAS3 is disposed on the second connection electrode CNE2 and the second insulating layer PAS2. The third insulating layer PAS3 may be disposed on the entire surface of the second insulating layer PAS2 to cover the second connection electrode CNE2, and the first connection electrode CNE1 may be disposed on the third insulating layer PAS3. The third insulating layer PAS3 may be disposed on the entire surface of the via layer VIA except for an area in which the first connection electrode CNE1 is disposed. The third insulating layer PAS3 may insulate the first connection electrode CNE1 and the second connection electrode CNE2 from each other so that they do not directly contact each other.

In one or more embodiments, another insulating layer may be further disposed on the third insulating layer PAS3 and the first connection electrode CNE1. The insulating layer may protect members disposed on the first substrate SUB from an external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least any one of the first insulating layer PAS1, the second insulating layer PAS2, and the third insulating layer PAS3 may be formed in a structure in which a plurality of insulating layers are alternately or repeatedly stacked. In one or more embodiments, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material, or some may be made of the same material while the others are made of different materials, or all of them may be made of different materials.

Figure 7:
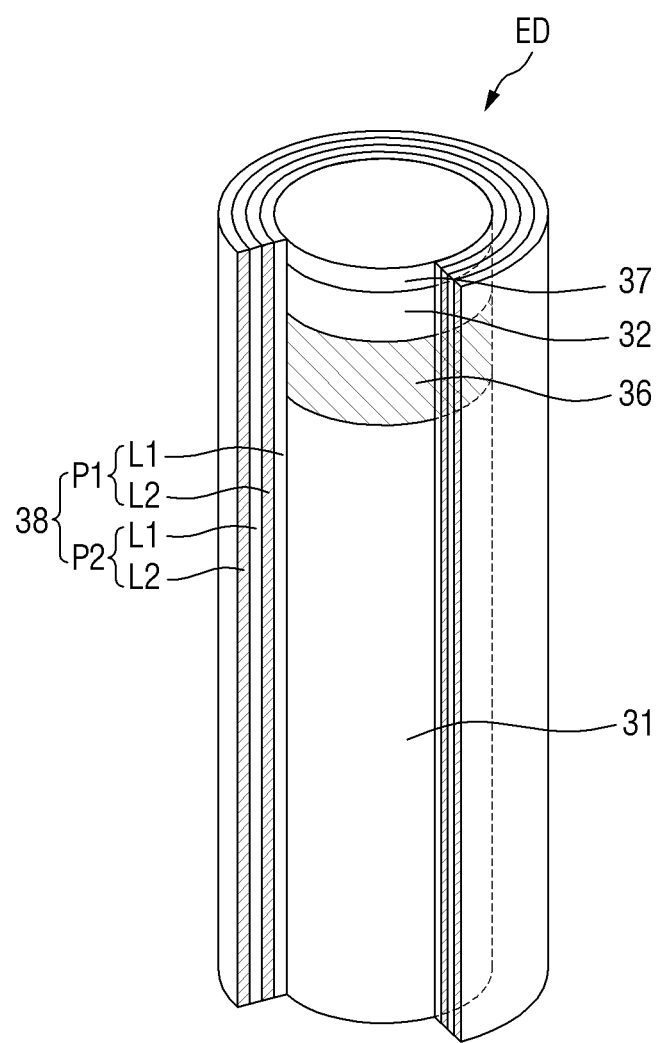
FIG. 7 is a schematic cutaway view of a light emitting element according to one or more embodiments.

FIG. 7 is a schematic cutaway view of a light emitting element ED according to one or more embodiments.

Referring to FIG. 7, the light emitting element ED may be a light emitting diode. For example, the light emitting element ED may be an inorganic light emitting diode having a size of nanometers to micrometers and made of an inorganic material. When an electric field is formed in a specific direction between two electrodes facing (or opposing) each other, the light emitting element ED may be aligned between the two electrodes in which polarities are formed.

The light emitting element ED according to the embodiment of FIG. 7 may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped and a hexagonal prism, and a shape extending in a direction and having a partially inclined outer surface.

The light emitting element ED may include a semiconductor layer doped with a dopant of any conductivity type (e.g., a p type or an n type). The semiconductor layer may receive an electrical signal from an external power source and emit light in a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN, and InN doped with a p-type dopant. The p-type dopant used to dope the second semiconductor layer 32 may be Mg, Zn, Ca, Ba, or the like.

Although each of the first semiconductor layer 31 and the second semiconductor layer 32 is composed of one layer in the drawing, the present disclosure is not limited thereto. Each of the first semiconductor layer 31 and the second semiconductor layer 32 may also include a greater number of layers, for example, may further include a clad layer or a tensile strain barrier reducing (TSBR) layer depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN, and SLs doped with an n-type dopant. The semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN, AlGaInN, or InGaN. For example, when the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different Group III to V semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be disposed at one end of the light emitting element ED. For example, the electrode layer 37 may be disposed on the second semiconductor layer 32 at one end of the light emitting element ED. However, in one or more embodiments, the electrode layer 37 may be disposed on the first semiconductor layer 31 at the other end of the light emitting element ED. The electrode layer 37 may be an ohmic connection electrode. However, the present disclosure is not limited thereto, and the electrode layer 37 may also be a Schottky connection electrode. The light emitting element ED may include at least one electrode layer 37. The light emitting element ED may include one or more electrode layers 37. However, the present disclosure is not limited thereto, and the electrode layer 37 may also be omitted.

When the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 may be around (e.g., may surround) outer surfaces (e.g., outer peripheral or circumferential surfaces) of the semiconductor layers and the electrode layer described above. For example, the insulating film 38 may be around (e.g., may surround) an outer surface (e.g., an outer peripheral or circumferential surface) of at least the light emitting layer 36 but may expose both ends of the light emitting element ED in a longitudinal direction. In addition, an upper surface of the insulating film 38 may be rounded in a cross section in an area adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). In one or more embodiments, the insulating film 38 may be formed in a multilayer structure in which a plurality of layers are stacked. In other embodiments, the insulating film 38 may be a single layer structure.

The insulating film 38 may protect the semiconductor layers and the electrode layer of the light emitting element ED. The insulating film 38 may prevent an electrical short circuit that may occur in the light emitting layer 36 when the light emitting layer 36 directly contacts an electrode through which an electrical signal is transmitted to the light emitting element ED. In addition, the insulating film 38 may prevent a reduction in luminous efficiency of the light emitting element ED.

In addition, an outer surface (e.g., an outer peripheral or circumferential surface) of the insulating film 38 may be treated. The light emitting element ED may be sprayed onto electrodes in a state where it is dispersed in ink (e.g., a predetermined ink) and then may be aligned. Here, the surface of the insulating film 38 may be hydrophobic or hydrophilic-treated so that the light emitting element ED remains separate from other adjacent light emitting elements ED in the ink without agglomerating with them.

Figure 8:
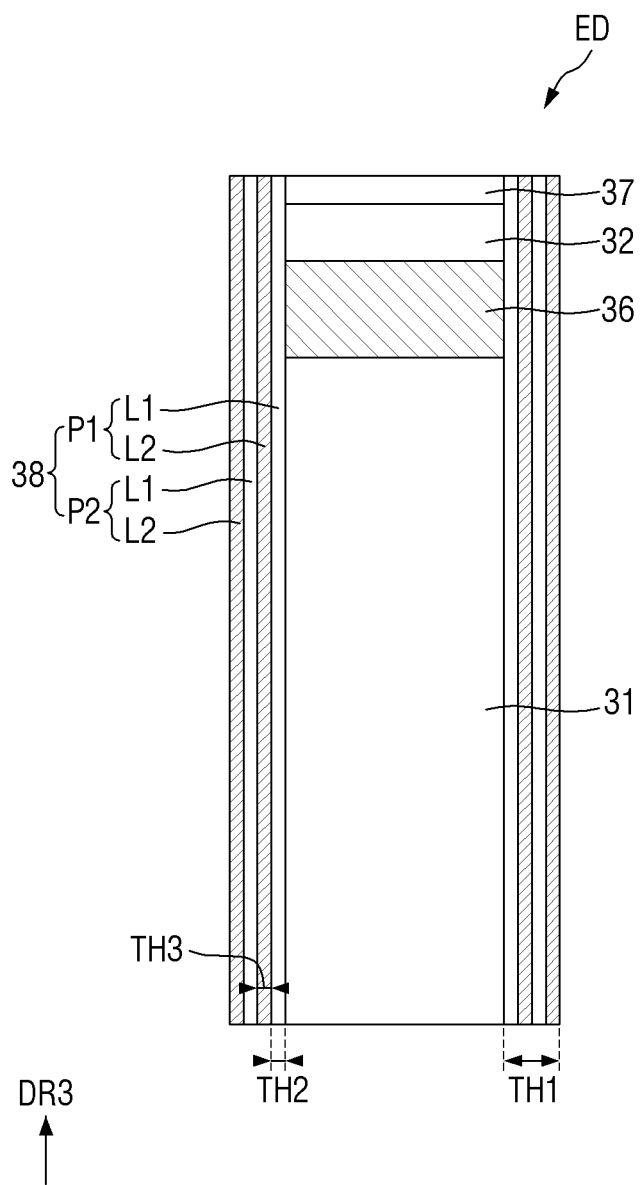
FIG. 8 is a cross-sectional view of the light emitting element of FIG. 7.

FIG. 8 is a cross-sectional view of the light emitting element ED of FIG. 7.

Referring to FIGS. 7 and 8, the insulating film 38 of the light emitting element ED according to one or more embodiments may include a plurality of pair layers P1 and P2, each including layers L1 and L2 including different materials. The insulating film 38 including a plurality of pair layers may have a structure in which layers made of different materials are alternately stacked.

The insulating film 38 may include a plurality of pair layers P1 and P2, each including a first layer L1 and a second layer L2 made of different materials. One first layer L1 and one second layer L2 may form one pair layer P1 or P2. In the insulating film 38, the pair layers P1 and P2 may be stacked so that the first layer L1 and the second layer L2 are alternately stacked. For example, the insulating film 38 may include a first pair layer P1 directly disposed on the outer surface (e.g., the outer peripheral or circumferential surface) of at least the light emitting layer 36 and a second pair layer P2 disposed on the first pair layer P1. In the insulating film 38, two first layers L1 and two second layers L2 may be alternately disposed. Although the insulating film 38 of the light emitting element ED is composed of the first pair layer P1 and the second pair layer P2 in the drawings, the present disclosure is not limited thereto. The insulating film 38 of the light emitting element ED may also include more pair layers in addition to the two pair layers P1 and P2, for example, may include three to five pair layers.

The insulating film 38 may include at least two pair layers P1 and P2 to have a sufficient thickness. When the insulating film 38 includes less than two pair layers P1 and P2, it may be too thin to protect the light emitting layer 36 and to reflect light. The insulating film 38 may function as an insulating layer by covering at least the light emitting layer 36 and may also be involved in guiding light generated from the light emitting layer 36 or separating the connection electrodes CNE1 and CNE2 as will be described later. In one or more embodiments, the insulating film 38 of the light emitting element ED may have a thickness TH1 of 20 to 100 nm or 30 to 80 nm. For example, the thickness TH1 of the insulating film 38 may be about 40 nm. A thickness TH2 of the first layer L1 and a thickness TH3 of the second layer L2 in each pair layer P1 or P2 may vary according to the thickness TH1 of the insulating film 38. For example, the thickness TH2 of the first layer L1 and the thickness TH3 of the second layer L2 may each be in the range of 1 to 10 nm, and the first layer L1 and the second layer L2 may have the same or different thicknesses TH2 and TH3.

In the embodiment of FIGS. 7 and 8, each of the pair layers P1 and P2 includes the first layer L1 as a lower layer and the second layer L2 as an upper layer disposed on the first layer L1. The first layer L1 of the first pair layer P1 may directly contact the light emitting layer 36, the first and second semiconductor layers 31 and 32 and the electrode layer 37, and the first layer L1 of the second pair layer P2 may directly contact the second layer L2 of the first pair layer P1. In the insulating film 38 of the light emitting element ED, the second layer L2 of the second pair layer P2 may be in contact with the first insulating layer PAS1. However, the present disclosure is not limited thereto. In the insulating film 38 of the light emitting element ED, the first layer L1 of each of the pair layers P1 and P2 may also be an upper layer, and the second layer L2 may also be a lower layer. In one or more embodiments, the insulating film 38 may not be disposed at both ends of the light emitting element ED so that the first semiconductor layer 31 and the second semiconductor layer 32 are in direct contact with the first insulating layer PAS1.

In one or more embodiments, the first layer L1 and the second layer L2 may include different insulating materials. For example, the first layer L1 and the second layer L2 may each include any one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$) but may be made of different materials. Because the first layer L1 and the second layer L2 include different materials, they may have different refractive indices.

According to one or more embodiments, the insulating film 38 of the light emitting element ED may guide light generated by the light emitting layer 36 in a specific direction. For example, layers made of different materials in the insulating film 38 may have different refractive indices, and the insulating film 38 in which the layers having different refractive indices are alternately stacked may reflect incident light. At least a part of light generated by the light emitting layer 36 of the light emitting element ED may travel toward the insulating film 38 and may be reflected from the insulating film 38. The light reflected from the insulating film 38 may exit from a portion of the light emitting element ED where the insulating film 38 is not formed.

Figure 9:
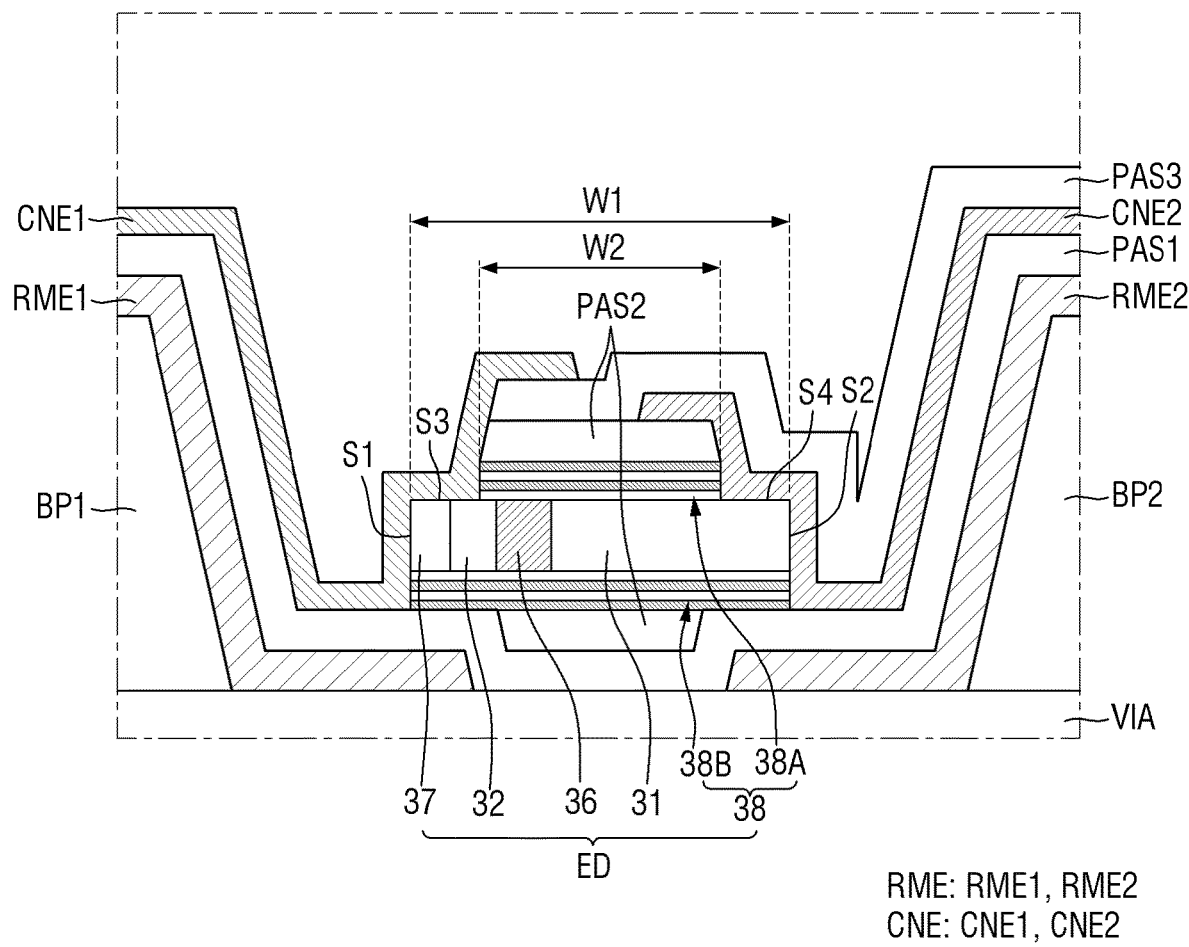
FIG. 9 is a cross-sectional view illustrating a light emitting element disposed in the display device according to one or more embodiments.

FIG. 9 is a cross-sectional view illustrating a light emitting element ED disposed in the display device 10 according to one or more embodiments.

Referring to FIG. 9, the display device 10 may include the electrodes RME1 and RME2 that are spaced from each other, and the first insulating layer PAS1, the light emitting element ED, the second insulating layer PAS2, the connection electrodes CNE1 and CNE2 and the third insulating layer PAS3 disposed on the electrodes RME1 and RME2. Both ends of the light emitting element ED may lie on the first electrode RME1 and/or the second electrode RME2. A part of the second insulating layer PAS2 may be disposed on the light emitting element ED, and a part of each of both ends of the light emitting element ED may not overlap the second insulating layer PAS2. The second insulating layer PAS2 may be formed to completely cover the light emitting element ED and then may be patterned to expose both ends of the light emitting element ED so that it remains on a part of the light emitting element ED. In this patterning process, a part of the insulating film 38 of the light emitting element ED may also be removed, and the first semiconductor layer 31 and the second semiconductor layer 32 of the light emitting element ED may also be partially exposed.

According to one or more embodiments, in the display device 10, the insulating film 38 of the light emitting element ED may include a first part 38A disposed on and around the light emitting layer 36 in cross section and a second part 38B other than the first part 38A and disposed under the light emitting layer 36. In one or more embodiments in which the insulating film 38 is formed to surround the first semiconductor layer 31, the light emitting layer 36, the second semiconductor layer 32 and the electrode layer 37 of the light emitting element ED, the second part 38B of the insulating film 38 may be disposed under the first semiconductor layer 31, the light emitting layer 36, the second semiconductor layer 32 and the electrode layer 37 in cross section. The first part 38A may be disposed on and around at least the light emitting layer 36 and may be disposed to partially surround the first semiconductor layer 31 and the second semiconductor layer 32. The first part 38A of the insulating film 38 may be a part disposed between the second insulating layer PAS2 and the light emitting layer 36 of the light emitting element ED, and the second part 38B may be a part in contact with the first insulating layer PAS1. The insulating film 38 may be partially patterned along the shape of a pattern part of the second insulating layer PAS2 that is disposed on the light emitting elements ED so that the first part 38A remains under the second insulating layer PAS2. A width of a part of the second insulating layer PAS2 that covers the light emitting elements ED may be the same as a length of the first part 38A of the insulating film 38.

In FIG. 9, a cross section across both ends of the light emitting element ED is illustrated. However, the insulating film 38 is disposed to be around (e.g., to surround) outer surfaces (e.g., outer peripheral or circumferential surfaces) of the light emitting layer 36 and the semiconductor layers 31 and 32 of the light emitting element ED. The first part 38A of the insulating film 38 may be understood as a part located between the light emitting layer 36 and the semiconductor layers 31 and 32 of the light emitting element ED and the second insulating layer PAS2 to surround the light emitting layer 36 and a part of each of the semiconductor layers 31 and 32, and the second part 38B may be understood as a part disposed under the light emitting layer 36, the semiconductor layers 31 and 32, and the electrode layer 37 of the light emitting element ED. In a part of the light emitting element ED that overlaps the second insulating layer PAS2, both the first part 38A and the second part 38B of the insulating film 38 may be located. In a part of the light emitting element ED that does not overlap the second insulating layer PAS2, only the second part 38B of the insulating film 38 may remain.

FIGS. 10 through 15 are cross-sectional views sequentially illustrating a part of a process of manufacturing a display device according to one or more embodiments. FIGS. 10 through 15 are cross-sectional views respectively illustrating structures according to the formation order of each layer in one subpixel SPXn of the display device 10. The structures of FIGS. 10 through 15 may correspond to the structure illustrated in FIG. 9.

Figure 10:
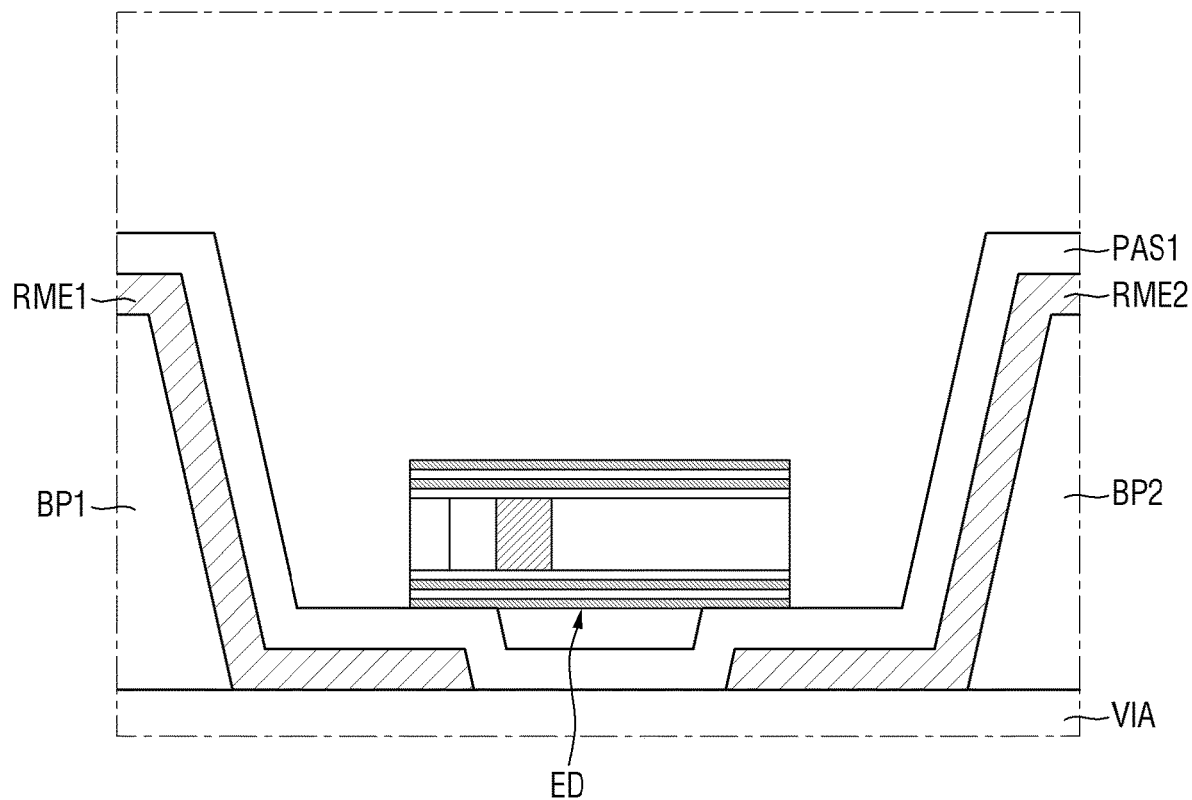
FIGS. 10 through 15 are cross-sectional views sequentially illustrating a part of a process of manufacturing a display device according to one or more embodiments.

Referring to FIG. 10, a first substrate SUB is prepared, first through third conductive layers, a buffer layer BL, a first gate insulating layer GI, a first interlayer insulating layer IL1, a via layer VIA, bank patterns BP1 and BP2, electrodes RME, a first insulating layer PAS1 and a bank layer BNL are formed on the first substrate SUB, and a light emitting element ED is disposed on the first insulating layer PAS1.

The first through third conductive layers and the electrodes RME disposed on the first substrate SUB may each be formed by depositing a material that forms each layer, for example, a metal material and patterning the material using a mask. In addition, the buffer layer BL, the first gate insulating layer GI, the first interlayer insulating layer IL1, the via layer VIA, the bank patterns BP1 and BP2, the first insulating layer PAS1 and the bank layer BNL disposed on the first substrate SUB may be formed by applying a material that forms each layer, for example, an insulating material or performing a patterning process using a mask if necessary. The description of the structure of a plurality of layers disposed on the first substrate SUB is the same as described above.

In one or more embodiments, a plurality of light emitting elements ED may be disposed on the electrodes RME through an inkjet printing process. When an electrical signal is transmitted to the electrodes RME after ink in which the light emitting elements ED are dispersed is sprayed into an area surrounded by the bank layer BNL, the light emitting elements ED in the ink may be mounted on the electrodes RME as their positions and orientation directions change. In the light emitting element ED disposed on the first insulating layer PAS1, an insulating film 38 may be formed to be around (e.g., to surround) side surfaces of semiconductor layers 31 and 32, a light emitting layer 36, and an electrode layer 37. The light emitting element ED may be placed such that a first end at which a second semiconductor layer 32 is located lies on a first electrode RME1 and that a second end at which a first semiconductor layer 31 is located lies on a second electrode RME2.

Figure 11:
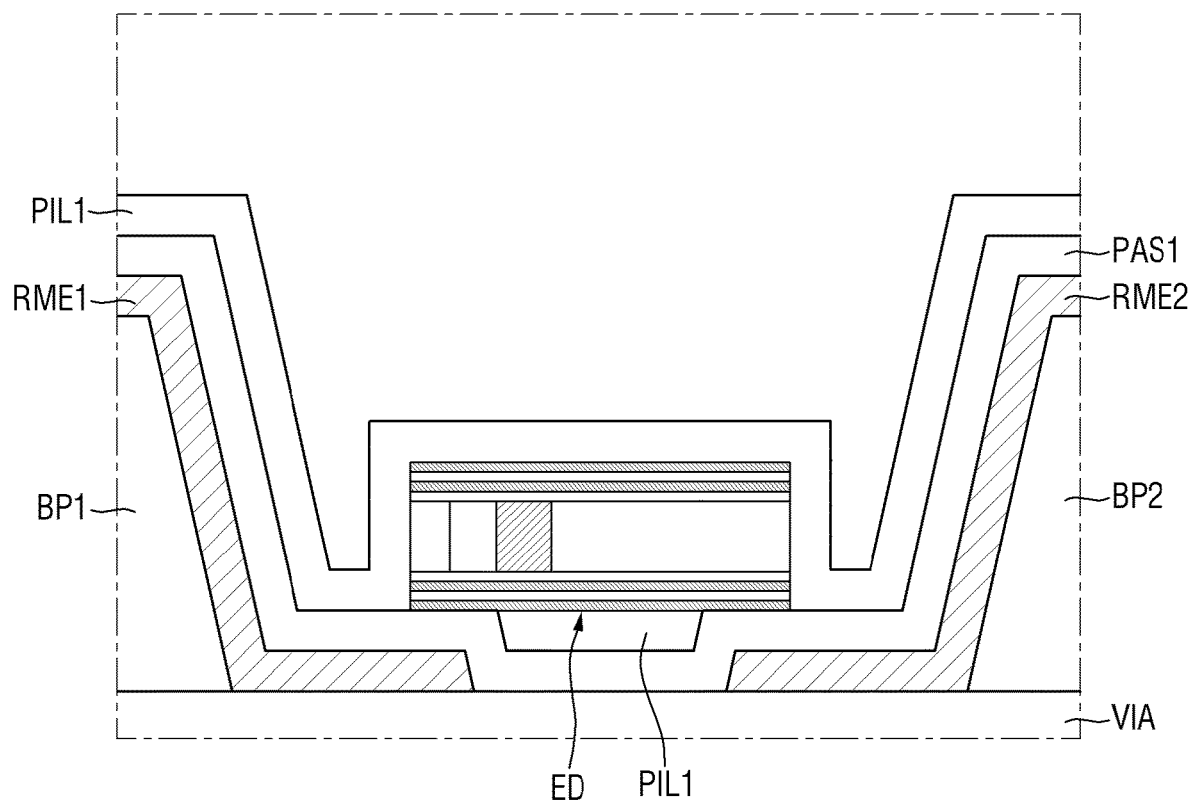

Next, referring to FIG. 11, a first insulating material layer PIL1 is formed on the first insulating layer PAS1 and the light emitting element ED. The first insulating material layer PIL1 disposed on the first insulating layer PAS1 may completely cover the light emitting element ED. The first insulating material layer PIL1 may fill a space between the light emitting element ED and the first insulating layer PAS1. The first insulating material layer PIL1 may be partially patterned in a subsequent process to form a second insulating layer PAS2.

Figure 12:
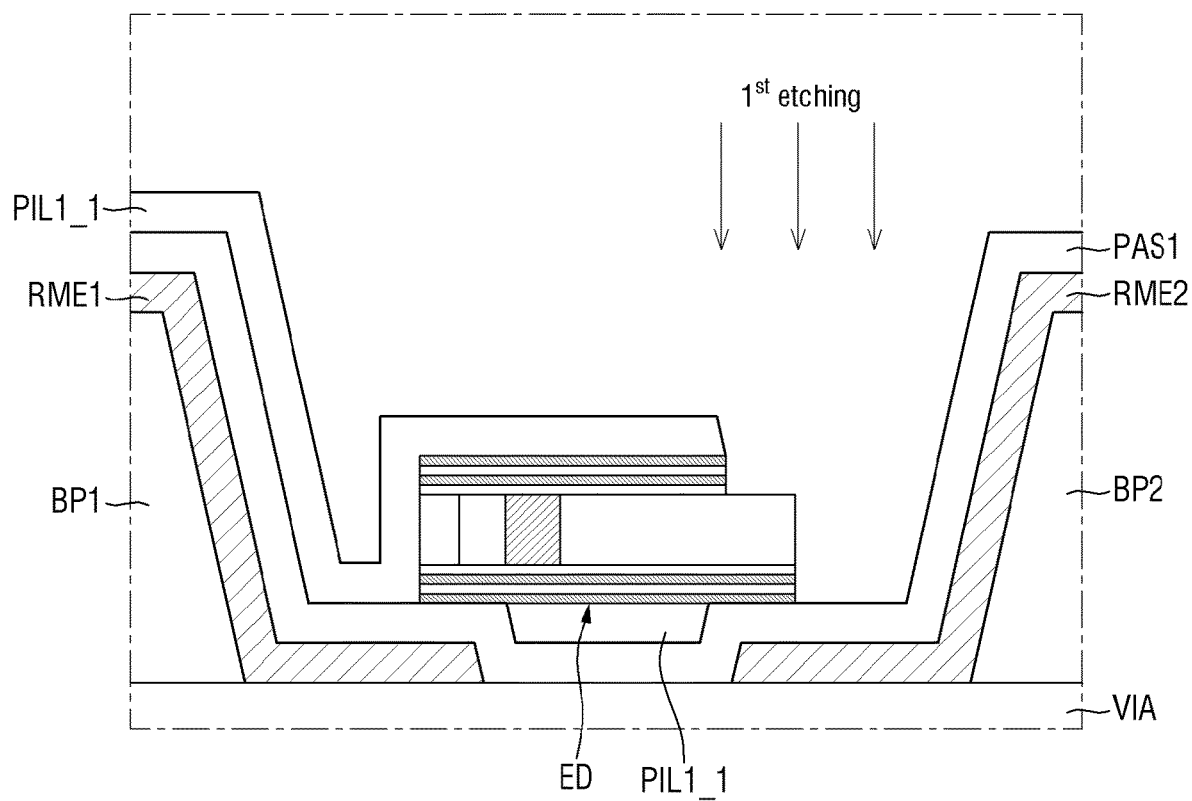
Figure 13:
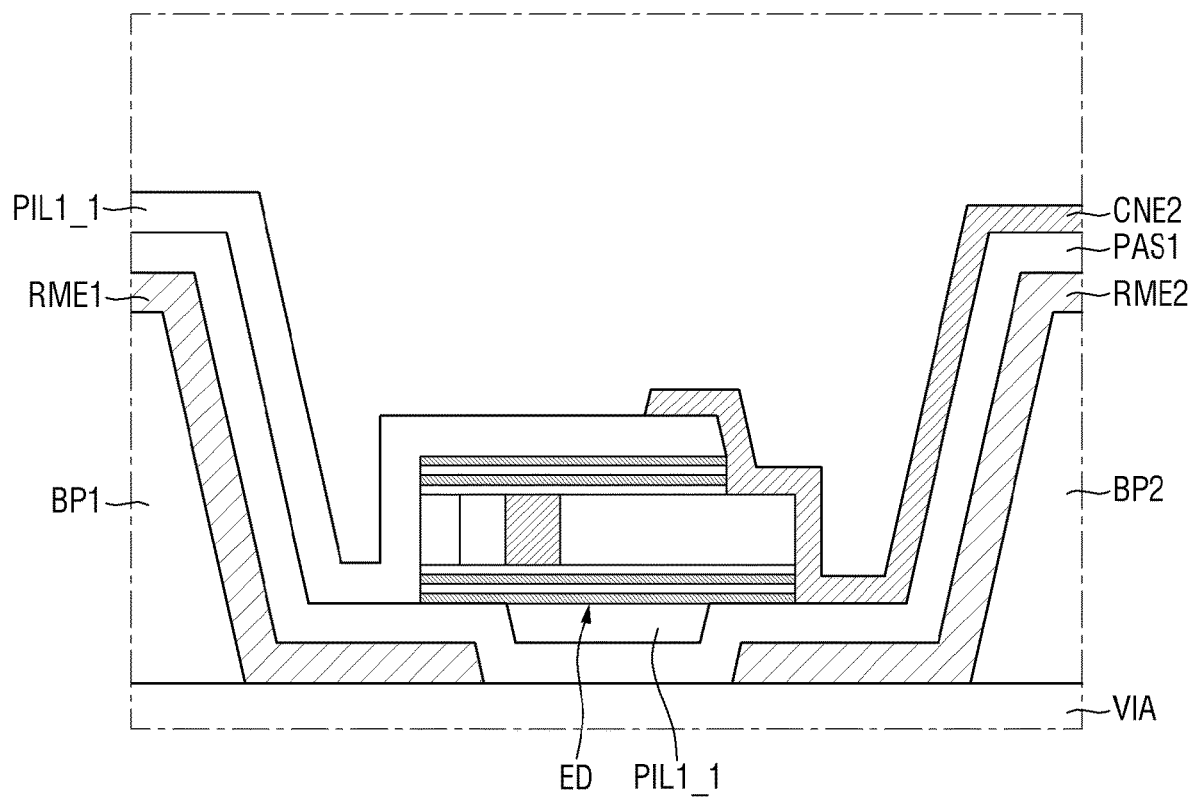

Next, referring to FIGS. 12 and 13, a part of the first insulating material layer PIL1 is etched (e.g., a first etching) to expose the second end of the light emitting element ED and form a second connection electrode CNE2 disposed on the second electrode RME2. In the etching process (e.g., the first etching) of the first insulating material layer PIL1, a part of the insulating film 38 of the light emitting element ED may also be removed. In the light emitting element ED, a part of the first semiconductor layer 31 at the second end disposed on the second electrode RME2 may be exposed during the etching process (e.g., the first etching). The second connection electrode CNE2 may be disposed on the first insulating layer PAS1 and the second insulating layer PAS2 (e.g., PIL1_1) and may contact the second end of the light emitting element ED. The second connection electrode CNE2 may directly contact the first semiconductor layer 31 exposed at the second end of the light emitting element ED.

Figure 14:
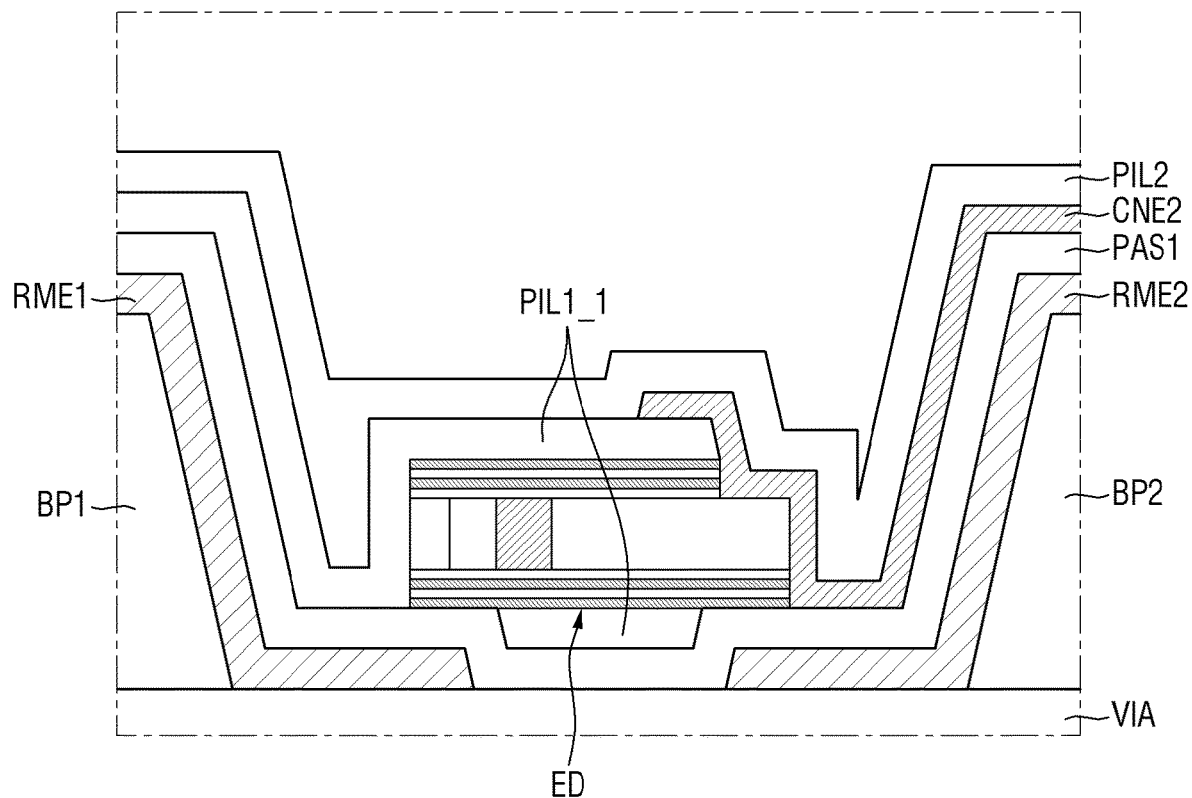

Next, referring to FIG. 14, a second insulating material layer PIL2 is formed on the first insulating layer PAS1, the first insulating material layer PIL1_1 and the second connection electrode CNE2. The second insulating material layer PIL2 may be disposed to completely cover the first insulating material layer PIL1_1 and the second connection electrode CNE2. The second insulating material layer PIL2 may be partially patterned in a subsequent process to form a third insulating layer PAS3.

Figure 15:
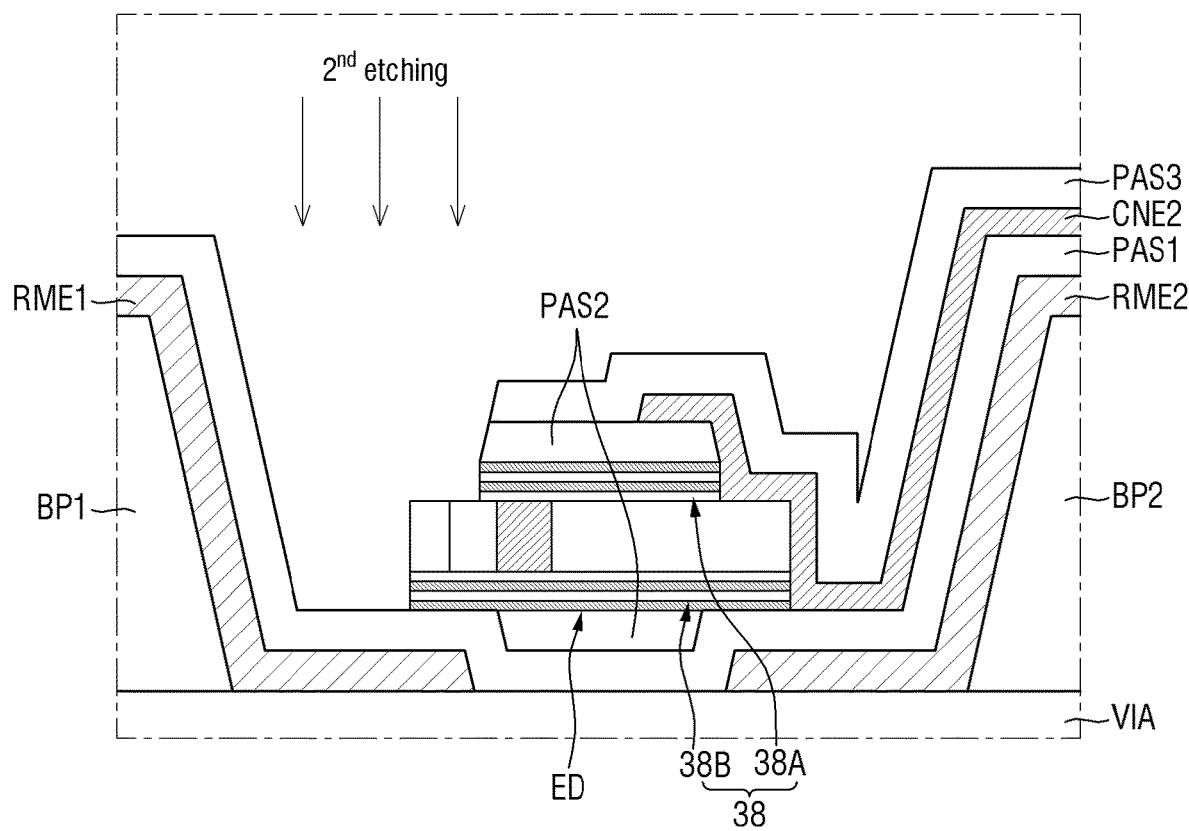

Next, referring to FIG. 15, a part of the second insulating material layer PIL2 is etched (e.g., a second etching) to expose the first end of the light emitting element ED. In the etching process (e.g., the second etching) of the second insulating material layer PIL2, the first insulating material layer PIL1_1 and the insulating film 38 of the light emitting element ED may also be partially removed. In the etching process (e.g., the second etching), the first insulating material layer PIL1 may be partially removed to form the second insulating layer PAS2, and the second insulating material layer PIL2 may be partially removed to form the third insulating layer PAS3. In the light emitting element ED, the second semiconductor layer 32 and the electrode layer 37 at the first end disposed on the first electrode RME1 may be partially exposed during the etching process (e.g., the second etching). The insulating film 38 of the light emitting element ED may be divided into a second part 38B located under the semiconductor layers 31 and 32 and the light emitting layer 36 and thus not etched and a first part 38A located on the semiconductor layers 31 and 32 and the light emitting layer 36 but not etched because it is located between the second insulating layer PAS2 and the light emitting layer 36.

Next, a first connection electrode CNE1 disposed on the first electrode RME1 may be formed. The first connection electrode CNE1 may be disposed on the first insulating layer PAS1 and the third insulating layer PAS3 and may contact the first end of the light emitting element ED. The first connection electrode CNE1 may directly contact the second semiconductor layer 32 and the electrode layer 37 exposed at the first end of the light emitting element ED.

The first part 38A of the insulating film 38 may be formed by removing the insulating film 38 to expose the first semiconductor layer 31 and the second semiconductor layer 32 or the electrode layer 37 at both ends of the light emitting element ED. Therefore, the first part 38A of the insulating film 38 may be shorter in length than the light emitting element ED. For example, a length W1 of the light emitting element ED and the second part 38B of the insulating film 38 may be greater than a length W2 of the first part 38A and a pattern part of the second insulating layer PAS2 (e.g., see FIG. 9).

The first connection electrode CNE1 and the second connection electrode CNE2 may contact both ends of the light emitting element ED, respectively. For example, the first connection electrode CNE1 may directly contact the first end disposed on the first electrode RME1 among both ends of the light emitting element ED, and the second connection electrode CNE2 may directly contact the second end disposed on the second electrode RME2 among both ends of the light emitting element ED. The light emitting element ED may include a first surface S1 which is a side surface of the first end in cross section and contacts the first connection electrode CNE1 and a second surface S2 which is a side surface of the second end in cross section and contacts the second connection electrode CNE2 (e.g., see FIG. 9). Based on FIG. 8, the first surface S1 may be an upper surface of the electrode layer 37 of the light emitting element ED, and the second surface S2 may be a lower surface of the first semiconductor layer 31 of the light emitting element ED. The first surface S1 may be a surface where the first connection electrode CNE1 and the electrode layer 37 directly contact each other, and the second surface S2 may be a surface where the second connection electrode CNE2 and the first semiconductor layer 31 directly contact each other. The first surface S1 and the second surface S2 may each include a portion where the second part 38B of the insulating film 38 is disposed and a portion where the electrode layer 37 or the first semiconductor layer 31 is disposed. In one or more embodiments in which the electrode layer 37 is omitted from the light emitting element ED, the first surface S1 may be a surface where the second semiconductor layer 32 directly contacts the first connection electrode CNE1.

Because the insulating film 38 of the light emitting element ED is partially removed to form the first part 38A, the side surfaces of the first semiconductor layer 31, the second semiconductor layer 32 and the electrode layer 37 exposed by the removal of the insulating film 38 may directly contact the connection electrodes CNE1 and CNE2. For example, the light emitting element ED may include a third surface S3 which is an upper side surface of the first end or the electrode layer 37 and the second semiconductor layer 32 in cross section or, based on FIG. 8, a side surface in contact with the first connection electrode CNE1 among the side surfaces of the electrode layer 37 and the second semiconductor layer 32. The light emitting element ED may include a fourth surface S4 which is an upper side surface of the second end or the first semiconductor layer 31 in cross section or, based on FIG. 8, a side surface in contact with the second connection electrode CNE2 among the side surfaces of the first semiconductor layer 31. The third surface S3 of the light emitting element ED may be the upper side surface of the first end of the light emitting element ED that does not overlap the second insulating layer PAS2 and is exposed because the insulating film 38 is not disposed thereon. The fourth surface S4 of the light emitting element ED may be the upper side surface of the second end of the light emitting element ED that does not overlap the second insulating layer PAS2 and is exposed because the insulating film 38 is not disposed thereon.

In the light emitting element ED, the semiconductor layer 31 and 32 or the electrode layer 37 at the first end and the second end may be electrically connected to the electrodes RME1 and RME2 by directly contacting the connection electrodes CNE1 and CNE2. In the light emitting element ED, the light emitting layer 36 may generate light in response to an electrical signal received from the electrodes RME1 and RME2. The light generated by the light emitting layer 36 may be emitted in random directions to travel toward the first semiconductor layer 31, the second semiconductor layer 32, and the insulating film 38. As described above, because the insulating film 38 includes a plurality of pair layers P1 and P2, each including a first layer L1 and a second layer L2 made of different materials, it may reflect incident light. The light may exit from a portion of the light emitting element ED where the insulating film 38 is not formed.

For example, among the above light, light travelling toward the first surface S1 and the second surface S2 that are both side surfaces of the light emitting element ED in cross section may be output as it is. However, light travelling toward the insulating film 38 after being generated by the light emitting layer 36 may be reflected by the pair layers P1 and P2 of the insulating film 38. The light reflected from the insulating film 38 may move along the semiconductor layers 31 and 32 of the light emitting element ED, and at least some of the light may be output through the third surface S3 and the fourth surface S4 where the insulating film 38 is not formed. Accordingly, in the display device 10, a part of the light generated by the light emitting element ED may be output toward the side surfaces of both ends of the light emitting element ED, and the other part may be output upward above the light emitting element ED. Although the display device 10 includes the second insulating layer PAS2 covering the light emitting element ED, the upward light output efficiency of the display device 10 may be improved.

According to one or more embodiments, in the insulating film 38 of the light emitting element ED, the first layer L1 and the second layer L2 may include different materials to have different etch rates. In the etching processes (first etching and second etching) of the first insulating material layer PIL1 and the second insulating material layer PIL2 during the manufacturing process of the display device 10, the first layer L1 and the second layer L2 of the insulating film 38 may be etched to different degrees, and an undercut may be formed between the first layer L1 and the second layer L2 in the first part 38A of the insulating film 38.

Figure 16:
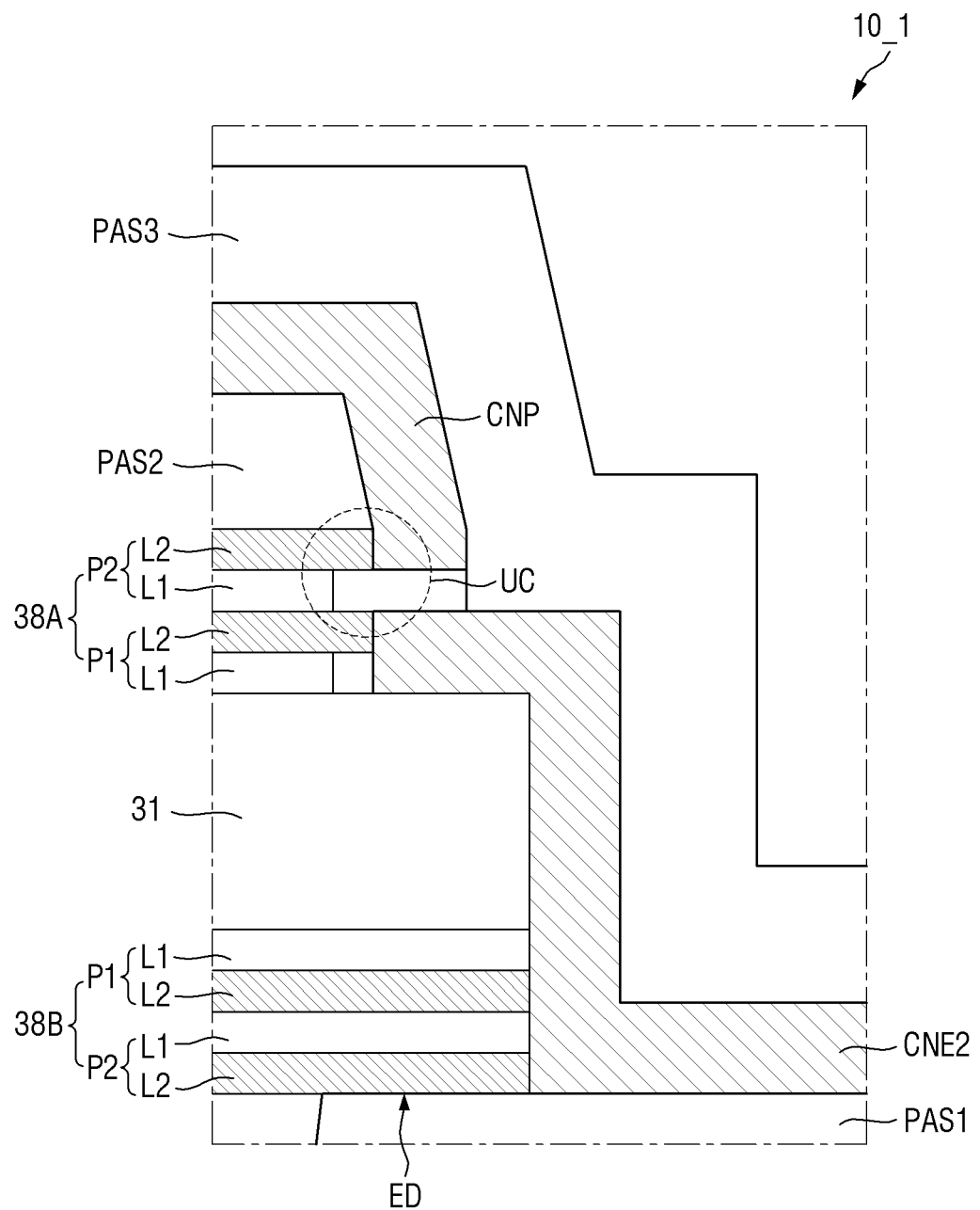
FIG. 16 is a cross-sectional view illustrating a part where a light emitting element is disposed in a display device according to one or more embodiments.

FIG. 16 is a cross-sectional view illustrating a part where a light emitting element ED is disposed in a display device 10_1 according to one or more embodiments.

Referring to FIG. 16, in the display device 10_1 according to one or more embodiments, an undercut UC may be formed between a first layer L1 and a second layer L2 in a first part 38A of an insulating film 38 of the light emitting element ED. The first layer L1 and the second layer L2 of the insulating film 38 may include different materials to have different etch rates. When the insulating film 38 is also patterned in an etching process of first and second insulating material layers PIL1 and PIL2, any one of the first layer L1 and the second layer L2 may be etched more than the other layer. For example, when the first layer L1 is etched more than the second layer L2 in the etching process of the first and second insulating material layers PIL1 and PIL2, the undercut UC in which the first layer L1 is recessed inward from the second layer L2 may be formed at the outermost end of a second insulating layer PAS2 and the second layer L2. This undercut UC may induce the material of a connection electrode CNE1 or CNE2 that contacts any one end of the light emitting element ED along a side surface of the second insulating layer PAS2 to be cut off.

Connection electrodes CNE1 and CNE2 are disposed on both ends of the light emitting element ED exposed by the etching process of the first and second insulating material layers PIL1 and PIL2. For example, when a part of the insulating film 38 of the light emitting element ED is removed to expose a part of a first semiconductor layer 31 at a second end, a second connection electrode CNE2 disposed on the second insulating layer PAS2 and a second electrode RME2 is formed. A part of the second connection electrode CNE2 is disposed on the second insulating layer PAS2, disposed on the first part 38A of the insulating film 38 of the light emitting element ED along a side surface of the second insulating layer PAS2, and disposed on the first semiconductor layer 31. When the material of the second connection electrode CNE2 is deposited, it may be partially cut off by the undercut UC formed in the insulating film 38, and the second connection electrode CNE2 in contact with the second end of the light emitting element ED and a connection electrode pattern CNP spaced from the second connection electrode CNE2 may be formed. The connection electrode pattern CNP may be directly disposed on the second insulating layer PAS2 and may directly contact a portion of the first part 38A of the insulating film 38 of the light emitting element ED.

In the display device 10_1 according to one or more embodiments, even though the material that forms the connection electrodes CNE1 and CNE2 remains on the second insulating layer PAS2 to form the connection electrode pattern CNP, the connection electrodes CNE1 and CNE2 directly contacting the light emitting element ED may be physically spaced from the connection electrode pattern CNP by the undercut UC formed in the insulating film 38. Accordingly, it is possible to prevent the connection electrodes CNE1 and CNE2 from short-circuiting due to a material remaining in an unwanted portion in the process of forming the connection electrodes CNE1 and CNE2.

Other embodiments of the display device 10 will now be described with reference to other drawings.

Figure 17:
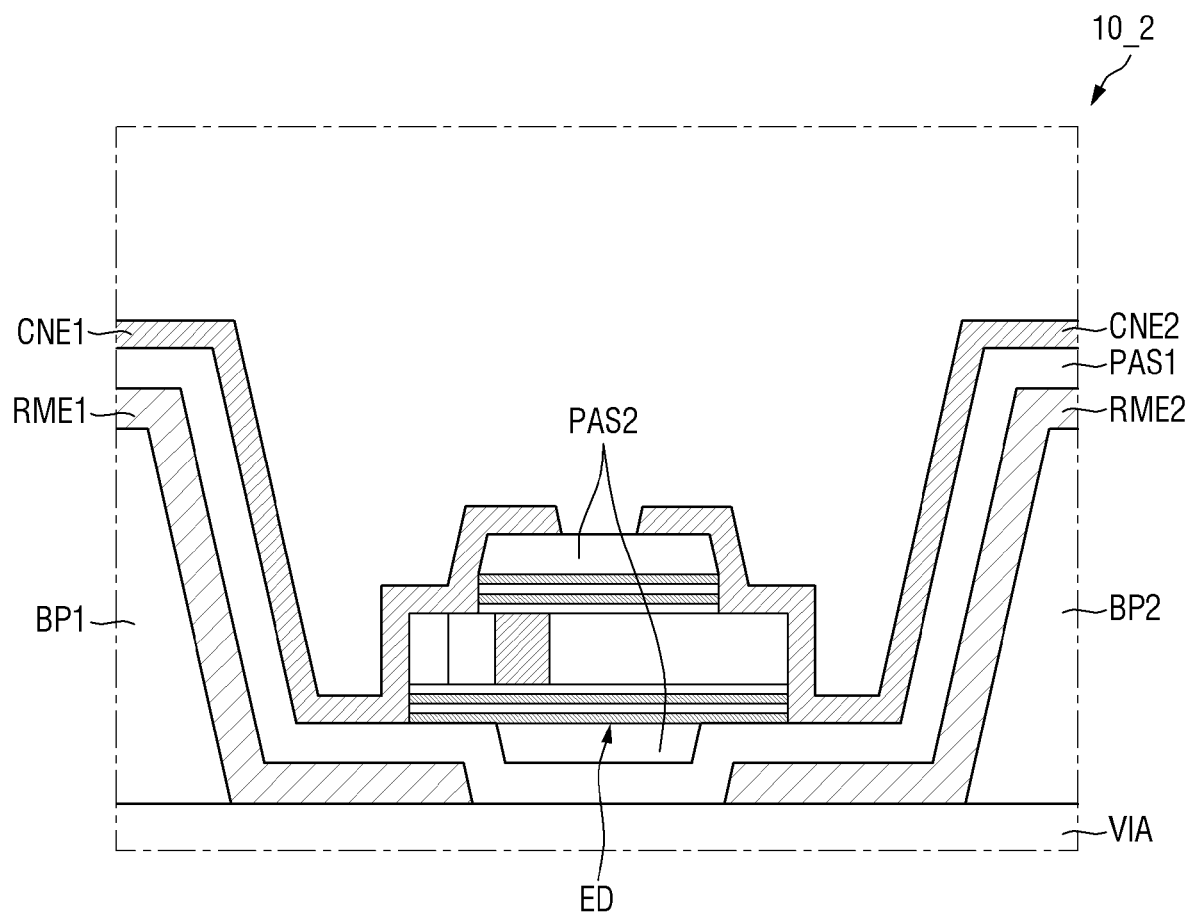
FIG. 17 is a cross-sectional view illustrating a light emitting element disposed in a display device according to one or more embodiments.

FIG. 17 is a cross-sectional view illustrating a light emitting element ED disposed in a display device 10_2 according to one or more embodiments.

Referring to FIG. 17, in the display device 10_2 according to one or more embodiments, a third insulating layer PAS3 may be omitted, and a first connection electrode CNE1 and a second connection electrode CNE2 may be directly disposed on a second insulating layer PAS2. Unlike in the embodiment of FIG. 9, in the display device 10_2 according to the current embodiment, the first connection electrode CNE1 and the second connection electrode CNE2 may be disposed on (or at) substantially the same layer.

Because the third insulating layer PAS3 is omitted, the first connection electrode CNE1 may be directly disposed on a first insulating layer PAS1 and the second insulating layer PAS2. The first connection electrode CNE1 and the second connection electrode CNE2 may be spaced from each other on the second insulating layer PAS2 and may contact a first end and a second end of the light emitting element ED, respectively. During a manufacturing process of the display device 10_2, a process of partially etching a first insulating material layer PIL1 (e.g., the first etching) may be performed to concurrently (e.g., simultaneously) expose the first end and the second end of the light emitting element ED. The first connection electrode CNE1 and the second connection electrode CNE2 may be formed as one connection electrode layer ('CNL' of FIG. 20) disposed on the second insulating layer PAS2, and then the connection electrode layer may be partially patterned into the connection electrodes CNE1 and CNE2 that are spaced from each other.

Figure 18:
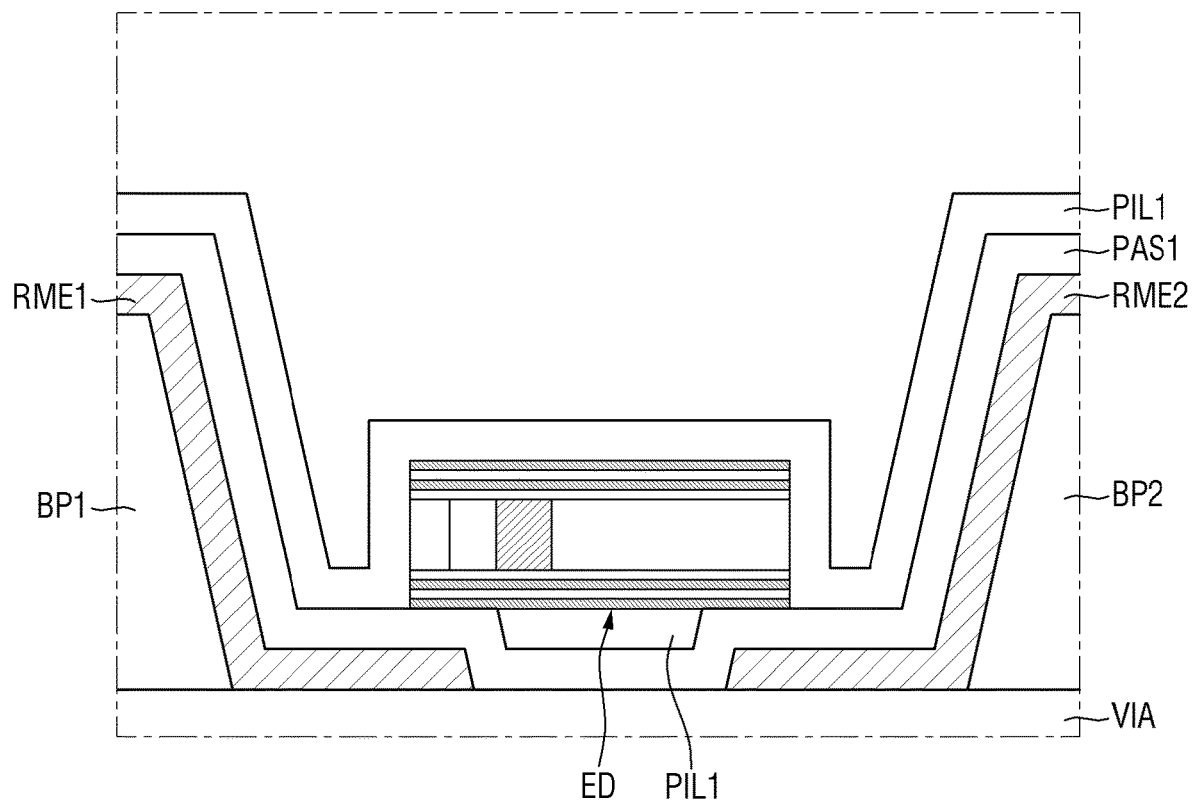
FIGS. 18 through 20 are cross-sectional views sequentially illustrating a part of a process of manufacturing the display device of FIG. 17.
Figure 19:
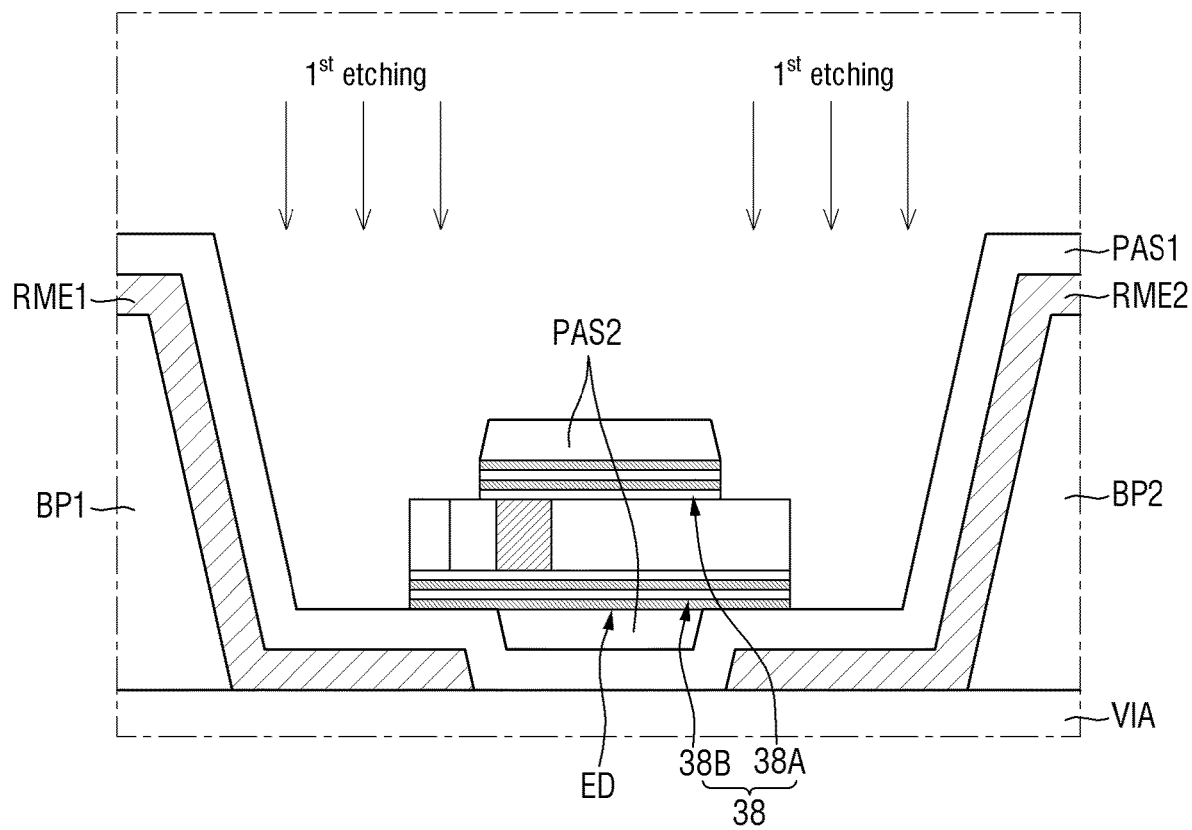
Figure 20:
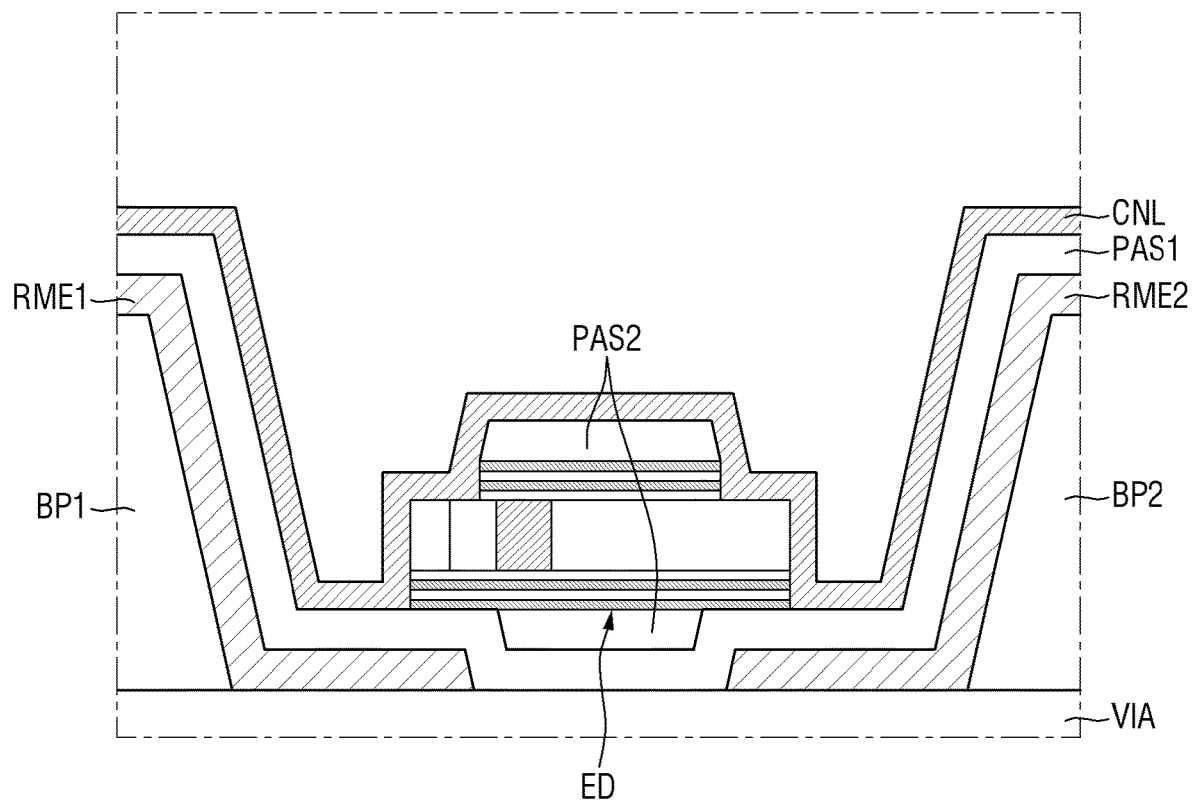

FIGS. 18 through 20 are cross-sectional views sequentially illustrating a part of a process of manufacturing the display device 10_2 of FIG. 17.

First, referring to FIG. 18, a first substrate SUB is prepared, and first through third conductive layers, a buffer layer BL, a first gate insulating layer GI, a first interlayer insulating layer IL1, a via layer VIA, bank patterns BP1 and BP2, electrodes RME, a first insulating layer PAS1 and a bank layer BNL are formed on the first substrate SUB. Then, a light emitting element ED is disposed on the first insulating layer PAS1, and a first insulating material layer PIL1 is formed on the first insulating layer PAS1 and the light emitting element ED. The first insulating material layer PIL1 may be disposed on the first insulating layer PAS1 to completely cover the light emitting element ED. The first insulating material layer PIL1 may be partially patterned in a subsequent process to form a second insulating layer PAS2. This is the same as described above with reference to FIG. 11.

Next, referring to FIG. 19, a part of the first insulating material layer PIL1 is etched (e.g., the first etching) to expose a first end and a second end of the light emitting element ED. In the etching process (e.g., the first etching) of the first insulating material layer PIL1, a part of an insulating film 38 of the light emitting element ED may also be removed. In the light emitting element ED, a part of a second semiconductor layer 32 and an electrode layer 37 at the first end and a part of a first semiconductor layer 31 at the second end may be exposed during the etching process (e.g., the first etching). The insulating film 38 of the light emitting element ED may be divided into a second part 38B located under the semiconductor layers 31 and 32 and a light emitting layer 36 and thus not etched and a first part 38A located on the semiconductor layers 31 and 32 and the light emitting layer 36 but not etched because it is located between the second insulating layer PAS2 and the light emitting layer 36.

Next, referring to FIG. 20, a connection electrode layer CNL is formed on the first insulating layer PAS1, the light emitting element ED, and the second insulating layer PAS2. The connection electrode layer CNL may be directly disposed on the second insulating layer PAS2 to cover the light emitting element ED. The connection electrode layer CNL may be disposed to partially overlap the electrodes RME and the bank patterns BP1 and BP2.

Next, a part of the connection electrode layer CNL that is disposed on the second insulating layer PAS2 may be partially removed to form a first connection electrode CNE1 and a second connection electrode CNE2 that are spaced apart from each other. A part of the first connection electrode CNE1 may be disposed on the second insulating layer PAS2 and may contact the first end of the light emitting element ED. The first connection electrode CNE1 may directly contact the second semiconductor layer 32 and the electrode layer 37 exposed at the first end of the light emitting element ED. A part of the second connection electrode CNE2 may be disposed on the second insulating layer PAS2 and may contact the second end of the light emitting element ED. The second connection electrode CNE2 may directly contact the first semiconductor layer 31 exposed at the second end of the light emitting element ED.

In the display device 10_2 according to the current embodiment, because the third insulating layer PAS3 is omitted and the first connection electrode CNE1 and the second connection electrode CNE2 are formed in one process, the manufacturing process can be shortened. As described above with reference to FIG. 16, the connection electrodes CNE1 and CNE2 may be physically spaced from a part of the connection electrode layer CNL that remains on the second insulating layer PAS2 by an undercut UC formed in the insulating film 38 during the process of forming the connection electrodes CNE1 and CNE2. Accordingly, even if a part of the material of the connection electrode layer CNL remains on the second insulating layer PAS2 in the process of patterning the connection electrode layer CNL, the first connection electrode CNE1 and the second connection electrode CNE2 may be prevented from being electrically connected to each other.

Figure 21:
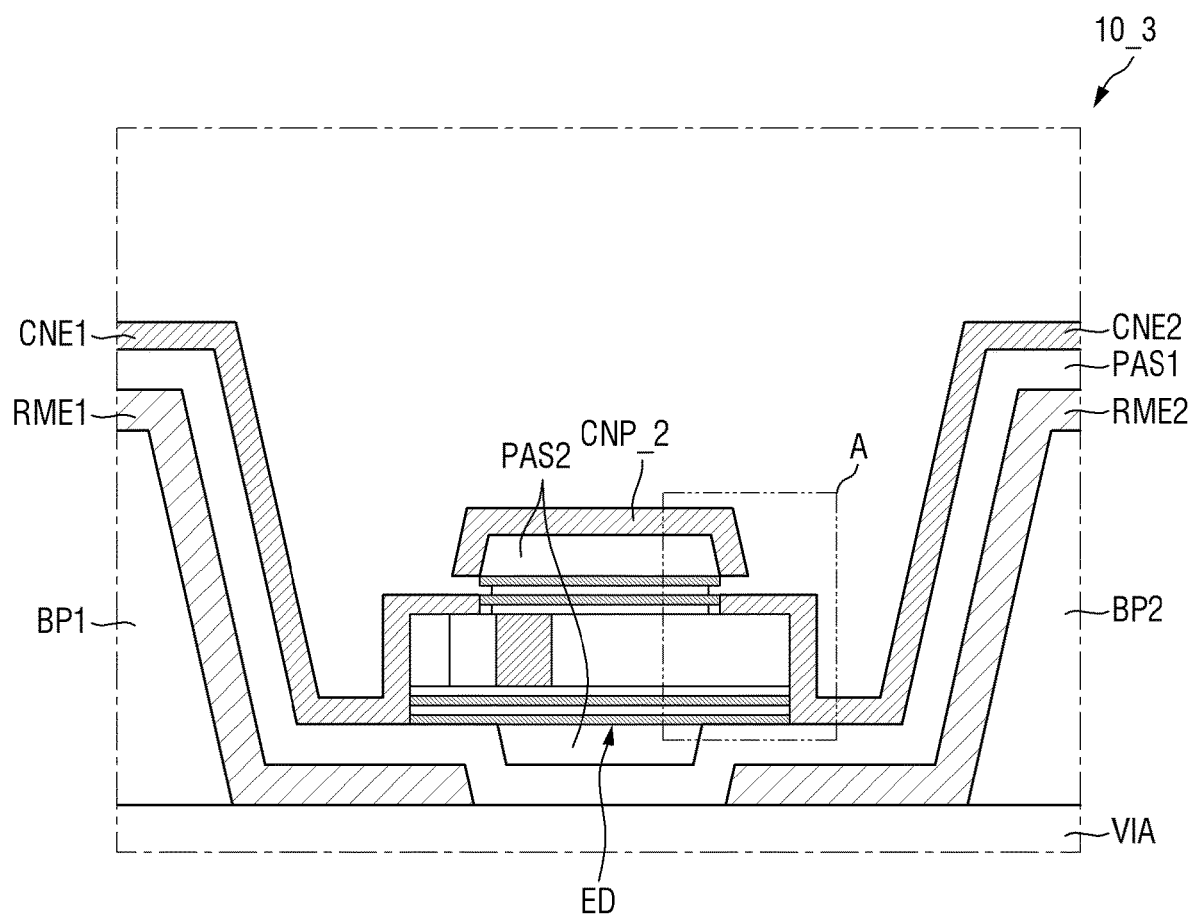
FIG. 21 is a cross-sectional view illustrating a light emitting element disposed in a display device according to one or more embodiments.
Figure 22:
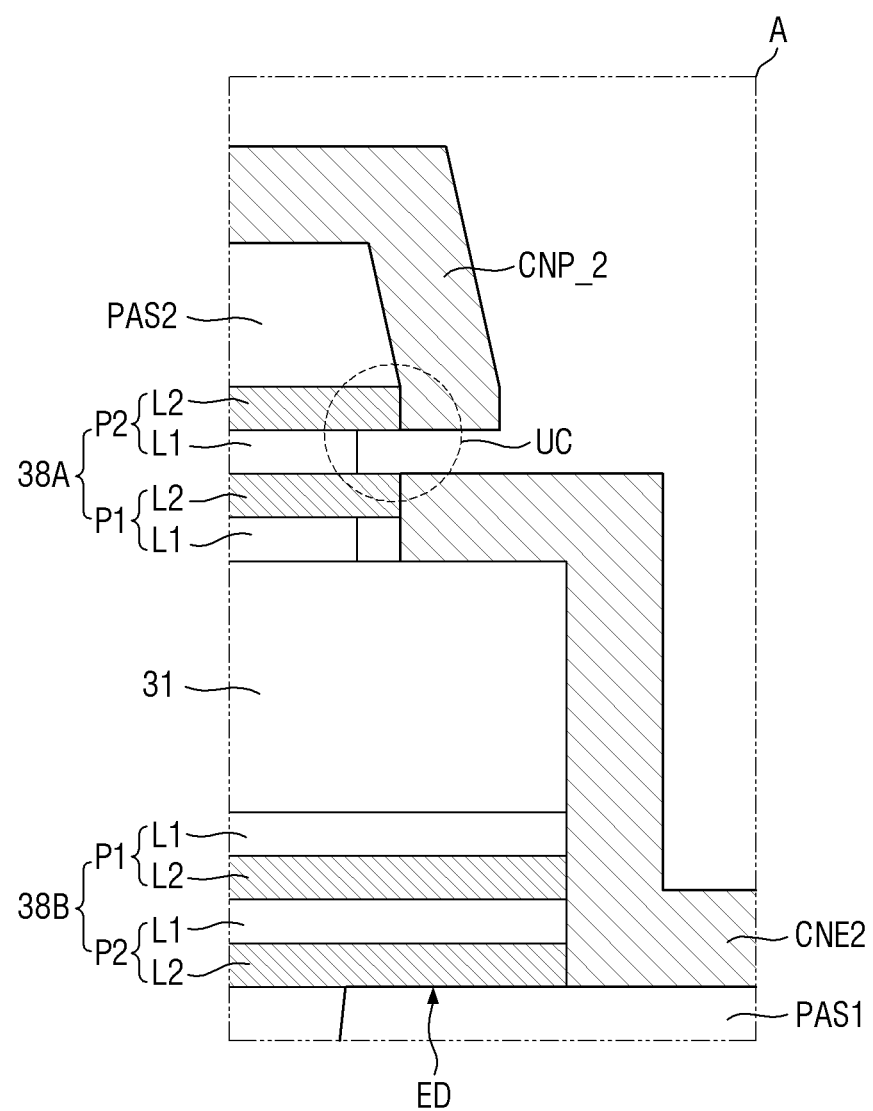
FIG. 22 is an enlarged view of part A of FIG. 21.

FIG. 21 is a cross-sectional view illustrating a light emitting element ED disposed in a display device 10_3 according to one or more embodiments. FIG. 22 is an enlarged view of a part A of FIG. 21.

Referring to FIGS. 21 and 22, the display device 10_3 according to one or more embodiments may include a connection electrode pattern CNP_2 disposed on a second insulating layer PAS2, and each of a first connection electrode CNE1 and a second connection electrode CNE2 may be spaced from the connection electrode pattern CNP_2. As described above, because a first layer L1 and a second layer L2 in an insulating film 38 of the light emitting element ED include different materials, an undercut UC may be formed at ends of a first part 38A in an etching process of a first insulating material layer PIL1. In one or more embodiments in which the first connection electrode CNE1 and the second connection electrode CNE2 are disposed on (or at) substantially the same layer as illustrated in FIG. 17, even if a connection electrode layer CNL is formed and not patterned, it may be separated into the first connection electrode CNE1, the connection electrode pattern CNP_2, and the second connection electrode CNE2. The connection electrode layer CNL covering the light emitting element ED and the second insulating layer PAS2 may be partially cut off by the undercut UC formed in the first part 38A of the insulating film 38 under the second insulating layer PAS2. A part of the connection electrode layer CNL remaining on the second insulating layer PAS2 may become the connection electrode pattern CNP_2, and parts contacting ends of the light emitting element ED may become the first connection electrode CNE1 and the second connection electrode CNE2, respectively.

If the connection electrodes CNE1 and CNE2 are physically spaced from the connection electrode pattern CNP_2 by the undercut UC formed in the insulating film 38 of the light emitting element ED, a process of partially patterning the connection electrode layer CNL to form the connection electrodes CNE1 and CNE2 that are spaced from each other may be omitted. The display device 10_3 according to the current embodiment may be desirable because a process of separating the connection electrode layer CNL into different connection electrodes CNE1 and CNE2 is omitted. Accordingly, the connection electrode pattern CNP_2 disposed on the second insulating layer PAS2 may be included. The connection electrode pattern CNP_2 may include the same material as the connection electrodes CNE1 and CNE2 but may be spaced from each of the connection electrodes CNE1 and CNE2.

Figure 23:
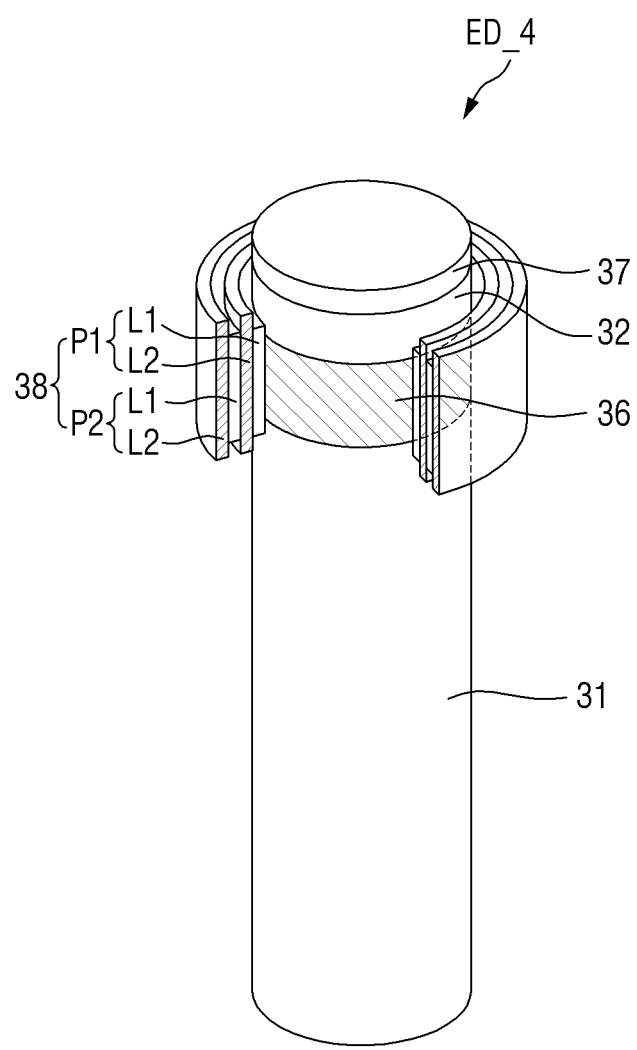
FIG. 23 is a schematic view of a light emitting element according to one or more embodiments.
Figure 24:
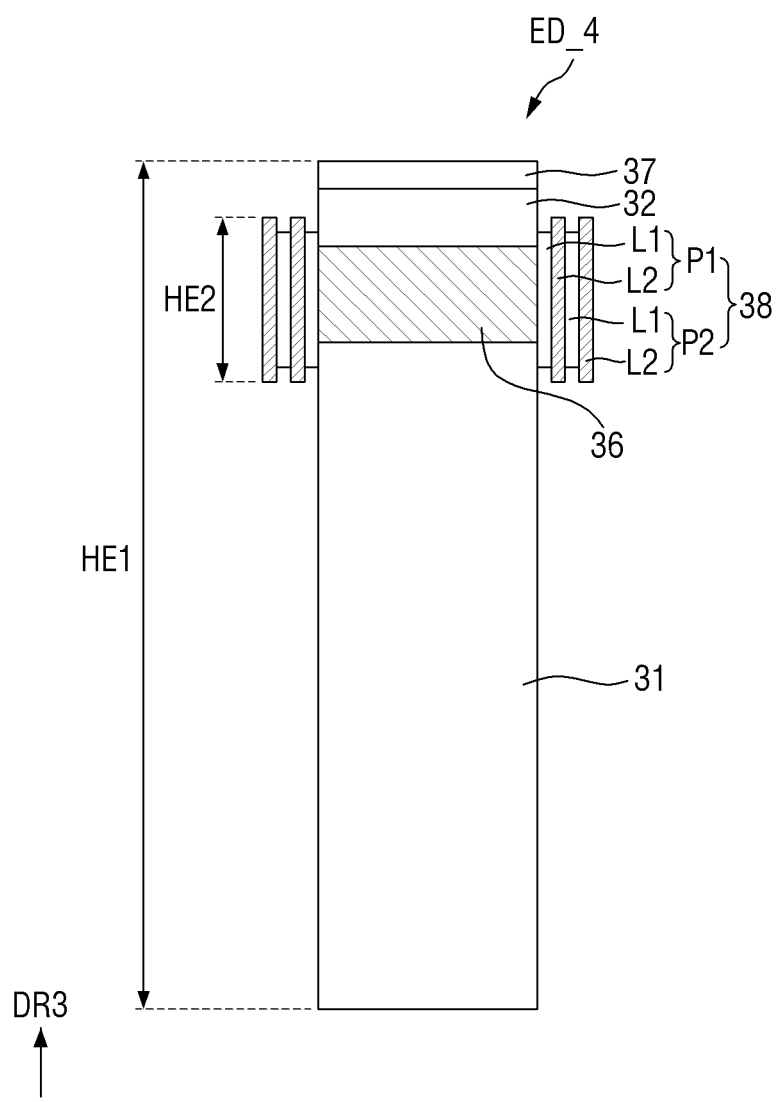
FIG. 24 is a cross-sectional view of the light emitting element of FIG. 23.
Figure 25:
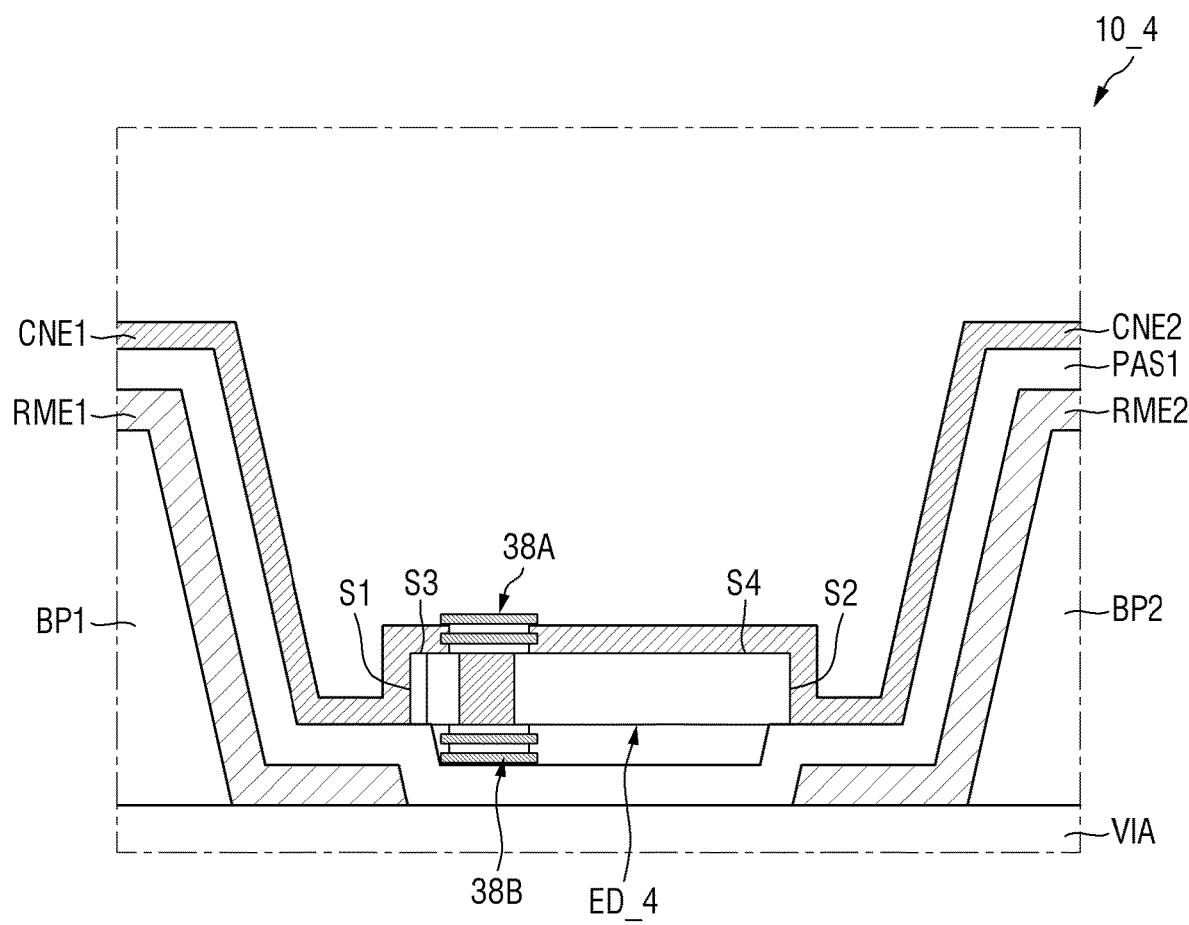
FIG. 25 is a cross-sectional view of a part of a display device including the light emitting element of FIG. 23.

FIG. 23 is a schematic view of a light emitting element ED_4 according to one or more embodiments. FIG. 24 is a cross-sectional view of the light emitting element ED_4 of FIG. 23. FIG. 25 is a cross-sectional view of a part of a display device 10_4 including the light emitting element ED_4 of FIG. 23.

Referring to FIGS. 23 through 25, in the display device 10_4 according to one or more embodiments, an insulating film 38 may completely surround side surfaces (e.g., outer peripheral or circumferential surfaces) of at least a light emitting layer 36 but may partially expose side surfaces (e.g., outer peripheral or circumferential surfaces) of semiconductor layers 31 and 32 and an electrode layer 37. A length HE1 of the light emitting element ED_4 may be greater than a length HE2 of the insulating film 38, and the insulating film 38 may not expose only the side surfaces of the light emitting layer 36.

The light emitting element ED_4 may be manufactured by forming the semiconductor layers 31 and 32, the light emitting layer 36 and the electrode layer 37 and then forming the insulating film 38 on the side surfaces (e.g., the outer peripheral or circumferential surfaces) of these layers. As in the embodiment of FIGS. 7 and 8, the insulating film 38 may be formed to completely surround the side surfaces of the semiconductor layers 31 and 32, the light emitting layer 36 and the electrode layer 37 to form the light emitting element ED. Alternatively, as in the current embodiment, the insulating film 38 may be formed to completely surround only the side surfaces (e.g., the outer peripheral or circumferential surfaces) of the light emitting layer 36 to form the light emitting element ED_4. In the insulating film 38, a plurality of pair layers P1 and P2, each including a first layer L1 and a second layer L2, may be formed on the side surfaces (e.g., the outer peripheral or circumferential surfaces) of the semiconductor layers 31 and 32, the light emitting layer 36 and the electrode layer 37 and then may be partially etched to expose the side surfaces (e.g., the outer peripheral or circumferential surfaces) of the semiconductor layers 31 and 32 and the electrode layer 37. Accordingly, before the light emitting element ED_4 is placed in the display device 10_4, an undercut may be formed between the first layer L1 and the second layer L2 of the insulating film 38. For example, in the insulating film 38 of the light emitting element ED_4, undercuts may be formed on upper and lower sides of the second layer L2, respectively, and a length of the first layer L1 measured in the third direction DR3 may be smaller than a length of the second layer L2. In the light emitting element ED_4, because the insulating film 38 surrounds only the light emitting layer 36, it may protect the light emitting layer 36 while securing more areas from which light generated by the light emitting layer 36 can be output. In the light emitting element ED_4, because the insulating film 38 is disposed in a minimum area, the light output efficiency may be further improved.

In the display device 10_4 including the light emitting element ED_4 according to the current embodiment, a second insulating layer PAS2 may be omitted, and a connection electrode layer ('CNL' of FIG. 20) may function to fix light emitting elements ED_4. The insulating film 38 of the light emitting element ED_4 may be divided into a first part 38A located on the light emitting layer 36 and a second part 38B located under the light emitting layer 36 in a cross section. However, unlike in the embodiment of FIG. 9, in the light emitting element ED_4, because the insulating film 38 is formed to surround only the light emitting layer 36 regardless of the second insulating layer PAS2 of the display device 10_4, it may not be partially etched and divided into the first part 38A and the second part 38B during a manufacturing process of the display device 10_4. In the light emitting element ED_4 of the current embodiment, because a single insulating film 38 is formed without being divided into the first part 38A and the second part 38B, the first part 38A and the second part 38B may just be parts distinguished according to their position for ease of description.

When the light emitting elements ED_4 are prepared on a first insulating layer PAS1, an insulating material layer may not be formed, but the connection electrode layer may be disposed to cover the light emitting element ED_4. The connection electrode layer may completely cover the semiconductor layers 31 and 32 and the electrode layer 37 of the light emitting element ED_4 together with the insulating film 38 or the first part 38A of the insulating film 38 of the light emitting element ED_4. In the connection electrode layer, a part disposed on the insulating film 38 may be physically separated from a part disposed on the semiconductor layers 31 and 32 and the electrode layer 37 by the undercut formed between the first layer L1 and the second layer L2 of the insulating film 38. When the part of the connection electrode layer which is disposed on the insulating film 38 is removed, the connection electrode layer may form a first connection electrode CNE1 contacting a first end of the light emitting element ED_4 and a second connection electrode CNE2 contacting a second end of the light emitting element ED_4. For example, a process of removing the part of the connection electrode layer that is disposed on the insulating film 38 may be performed through a chemical mechanical polishing (CMP) process.

In a cross section, the first connection electrode CNE1 may contact a first surface S1 which is a side surface of the first end or a side surface of the electrode layer 37 of the light emitting element ED_4 and a third surface S3 which is an upper side surface of the first end or upper surfaces of the electrode layer 37 and a second semiconductor layer 32. Alternatively, based on FIG. 24, the first connection electrode CNE1 may contact the first surface S1 which is an upper surface of the first end or the electrode layer 37 of the light emitting element ED_4 and the third surface S3 which is a side surface of the first end or the electrode layer 37 and the second semiconductor layer 32. In a cross section, the second connection electrode CNE2 may contact a second surface S2 which is a side surface of the second end of the light emitting element ED_4 or a side surface of a first semiconductor layer 31 and a fourth surface S4 which is an upper side surface of the second end or an upper surface of the first semiconductor layer 31. Alternatively, based on FIG. 24, the second connection electrode CNE2 may contact the second surface S2 which is a lower surface of the second end or the first semiconductor layer 31 of the light emitting element ED_4 and the fourth surface S4 which is a side surface of the second end or a side surface of the first semiconductor layer 31. The first connection electrode CNE1 and the second connection electrode CNE2 may be spaced from each other with the insulating film 38 of the light emitting element ED_4 interposed between them. The light emitting element ED_4 may be electrically connected to electrodes RME because the first end and the second end thereof contact different connection electrodes CNE1 and CNE2, respectively.

In the light emitting element ED_4 according to the current embodiment, the insulating film 38 may be formed to surround only the light emitting layer 36, and an undercut formed between the first layer L1 and the second layer L2 may be included. Accordingly, even if the function of fixing the light emitting elements ED_4 is performed through the connection electrode layer in the manufacturing process of the display device 10_4, a part of the connection electrode layers may be physically separated by the undercut of the light emitting element ED_4. The second insulating layer PAS2 can be omitted from the display device 10_4 including the light emitting element ED_4. In addition, because the light emitting elements ED_4 can be fixed only through the process of forming the connection electrodes CNE1 and CNE2, the manufacturing process can be shortened.

Figure 26:
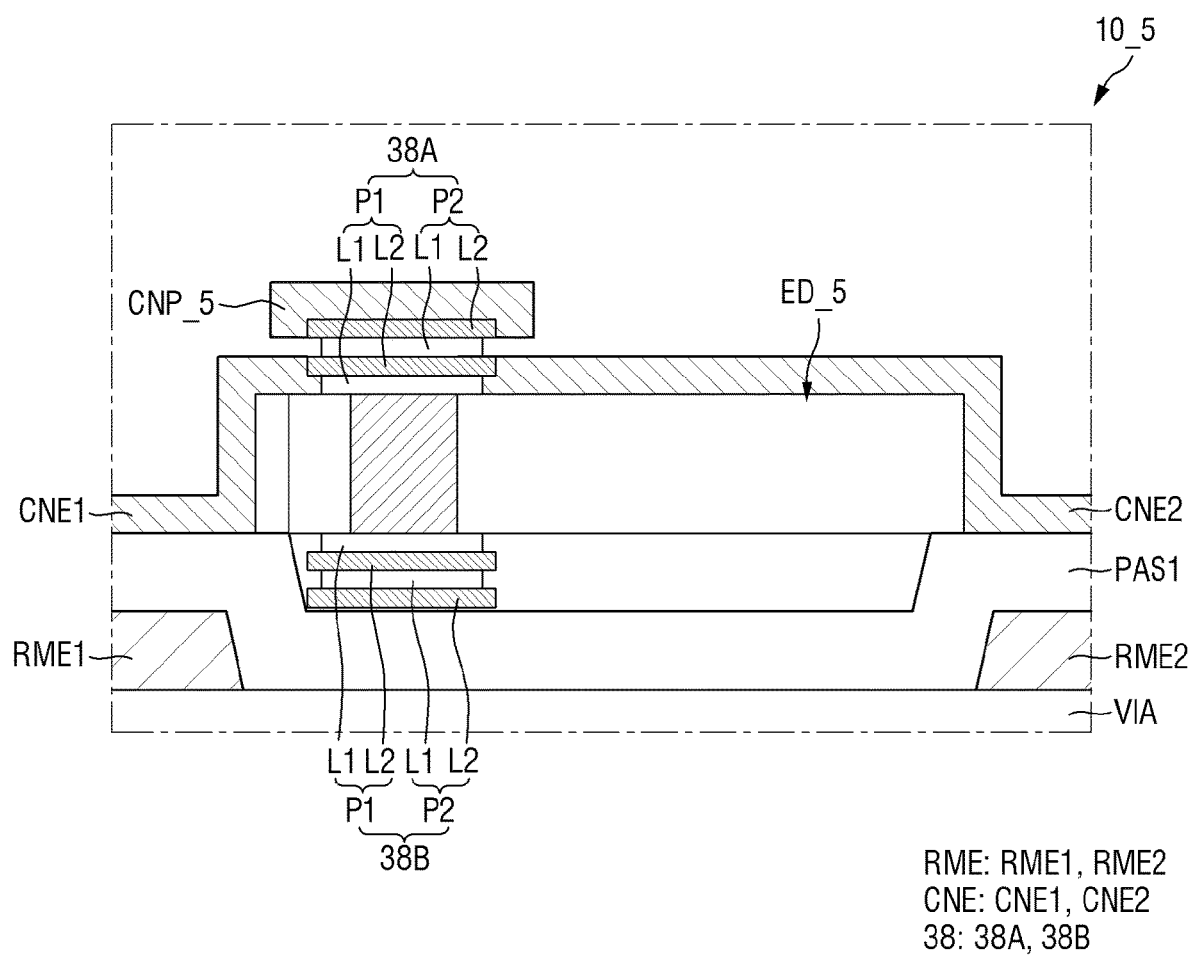
FIG. 26 is a cross-sectional view illustrating a light emitting element disposed in a display device according to one or more embodiments.

FIG. 26 is a cross-sectional view illustrating a light emitting element ED_5 disposed in a display device 10_5 according to one or more embodiments.

Referring to FIG. 26, the display device 10_5 according to one or more embodiments may include the light emitting element ED_5 in which an insulating film 38 is disposed only around a light emitting layer 36 as in the light emitting element ED_4 of FIG. 23. Therefore, the display device 10_5 may include a connection electrode pattern CNP_5 disposed on the insulating film 38 of the light emitting element ED_5. The current embodiment is different from the embodiment of FIG. 24 in that it further includes the connection electrode pattern CNP_5 disposed on the light emitting element ED_5 and spaced from connection electrodes CNE1 and CNE2.

As in the embodiment of FIG. 21, in the display device 10_5, even if a separation process is not performed, a part of a connection electrode layer disposed on the light emitting element ED_5 may be physically separated by the light emitting element ED_5 including an undercut formed in the insulating film 38. In the display device 10_5, when the connection electrode layer covering the light emitting element ED_5 is formed after the light emitting element ED_5 is disposed, a part of the material of the connection electrode layer may be cut off in the undercut of the light emitting element ED_5. Accordingly, the connection electrode layer may be divided into a first connection electrode CNE1, the connection electrode pattern CNP_5, and a second connection electrode CNE2. In the display device 10_5, even if a process of removing the connection electrode pattern CNP_5 is omitted, the first connection electrode CNE1 and the second connection electrode CNE2 may be physically spaced from each other. The display device 10_5 may include the connection electrode pattern CNP_5 remaining on a first part 38A of the insulating film 38 of the light emitting element ED_5.

Figure 27:
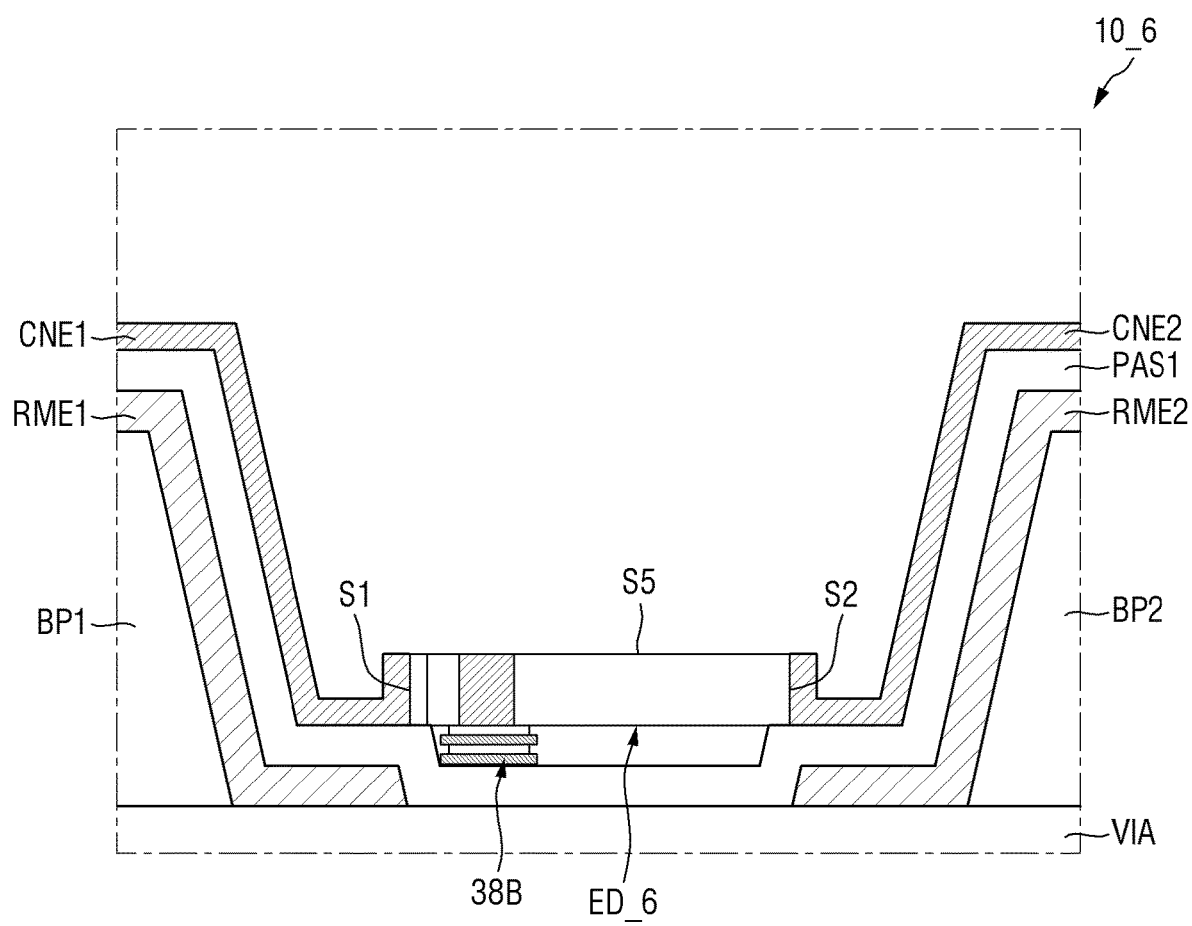
FIG. 27 is a cross-sectional view illustrating a light emitting element disposed in a display device according to one or more embodiments.

FIG. 27 is a cross-sectional view illustrating a light emitting element ED_6 disposed in a display device 10_6 according to one or more embodiments.

Referring to FIG. 27, the display device 10_6 according to one or more embodiments may include the light emitting element ED_6 in which an insulating film 38 is disposed only around a light emitting layer 36 as in the light emitting element ED_4 of FIG. 23. However, a part of the insulating film 38 which is located on the light emitting layer 36 may be removed, and only a part 38B located under the light emitting layer 36 may remain. In cross section, a first connection electrode CNE1 and a second connection electrode CNE2 respectively contacting both ends of the light emitting element ED_6 may respectively contact a first surface S1 and a second surface S2 that are both side surfaces of the light emitting element ED_6 and may expose a fifth surface S5 which is an upper surface of the light emitting element ED_6. Alternatively, based on FIG. 23, the first connection electrode CNE1 and the second connection electrode CNE2 may respectively contact the first surface S1 which is an upper surface of the light emitting element ED_6 and the second surface S2 which is a lower surface of the light emitting element ED_6 and may expose the fifth surface S5 which is a part of a side surface of the light emitting element ED_6.

As described above, a connection electrode layer remaining on the insulating film 38 may be removed through a CMP process. In the CMP process, both a part of the insulating film 38 of the light emitting element ED_6 that is located on the light emitting layer 36 and a part of the connection electrode layer that is located on the light emitting element ED_6 in cross section may be removed. Accordingly, the first connection electrode CNE1 and the second connection electrode CNE2 formed of the connection electrode layer remaining after being partially removed may contact only the side surfaces (e.g., the first surface S1 and the second surface S2) of both ends of the light emitting element ED_6, and a side surface of the light emitting layer 36 may be completely exposed. During a manufacturing process of the display device 10_6, when a process performed after the connection electrodes CNE1 and CNE2 are formed is a process in which the light emitting layer 36 of the light emitting element ED_6 is hardly likely to be damaged, a light emission defect may not occur even if the light emitting layer 36 is exposed. On the other hand, because the light emitting layer 36 of the light emitting element ED_6 is completely exposed, the light output efficiency of the light emitting element ED_6 can be further improved.

Figure 28:
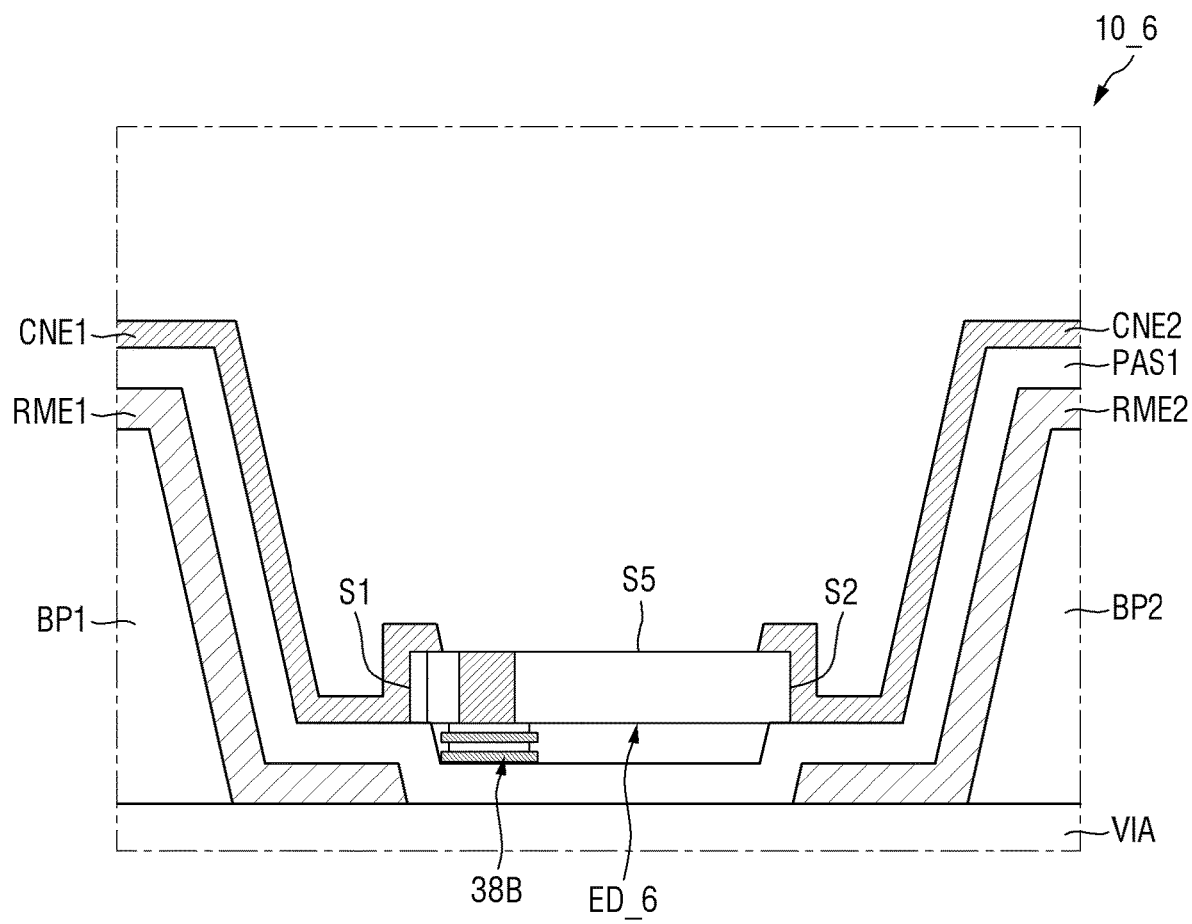
FIG. 28 is a cross-sectional view illustrating a light emitting element disposed in a display device according to one or more embodiments.

FIG. 28 is a cross-sectional view illustrating a light emitting element ED_6 disposed in a display device 10_6 according to one or more embodiments.

Referring to FIG. 28, as in the embodiment of FIG. 27, the display device 10_6 according to one or more embodiments may include the light emitting element ED_6 in which an insulating film 38 is disposed only around a light emitting layer 36, and a part of the insulating film 38 which is located on the light emitting layer 36 may be removed, and only a part 38B located under the light emitting layer 36 may remain. In a cross section, a first connection electrode CNE1 and a second connection electrode CNE2 respectively contacting both ends of the light emitting element ED_6 may respectively contact a first surface S1 and a second surface S2 that are both side surfaces of the light emitting element ED_6 as well as parts of a fifth surface S5. The fifth surface S5 which is an upper surface of the light emitting element ED_6 may be partially exposed, and its parts adjacent to both ends of the light emitting element ED_6 may be covered by the connection electrodes CNE1 and CNE2, respectively. Alternatively, based on FIG. 23, the first connection electrode CNE1 and the second connection electrode CNE2 may respectively contact the first surface S1 which is an upper surface of the light emitting element ED_6 and the second surface S2 which is a lower surface of the light emitting element ED_6 and may partially contact the fifth surface S5 which is a part of a side surface of the light emitting element ED_6.

As described above, a connection electrode layer remaining on the insulating film 38 may be removed through a CMP process. In the CMP process, both a part of the insulating film 38 of the light emitting element ED_6 that is located on the light emitting layer 36 and a part of the connection electrode layer that is located on the light emitting element ED_6 in cross section may be removed. Accordingly, the first connection electrode CNE1 and the second connection electrode CNE2 formed of the connection electrode layer remaining after being partially removed may contact the side surfaces (e.g., the first surface S1 and the second surface S2) of both ends of the light emitting element ED_6 and may partially contact the upper side surface (e.g., the fifth surface S5) of the light emitting element ED_6. The current embodiment is different from the embodiment of FIG. 27 in that the connection electrodes CNE1 and CNE2 partially contact the fifth surface S5 of the light emitting element ED_6.

Figure 29:
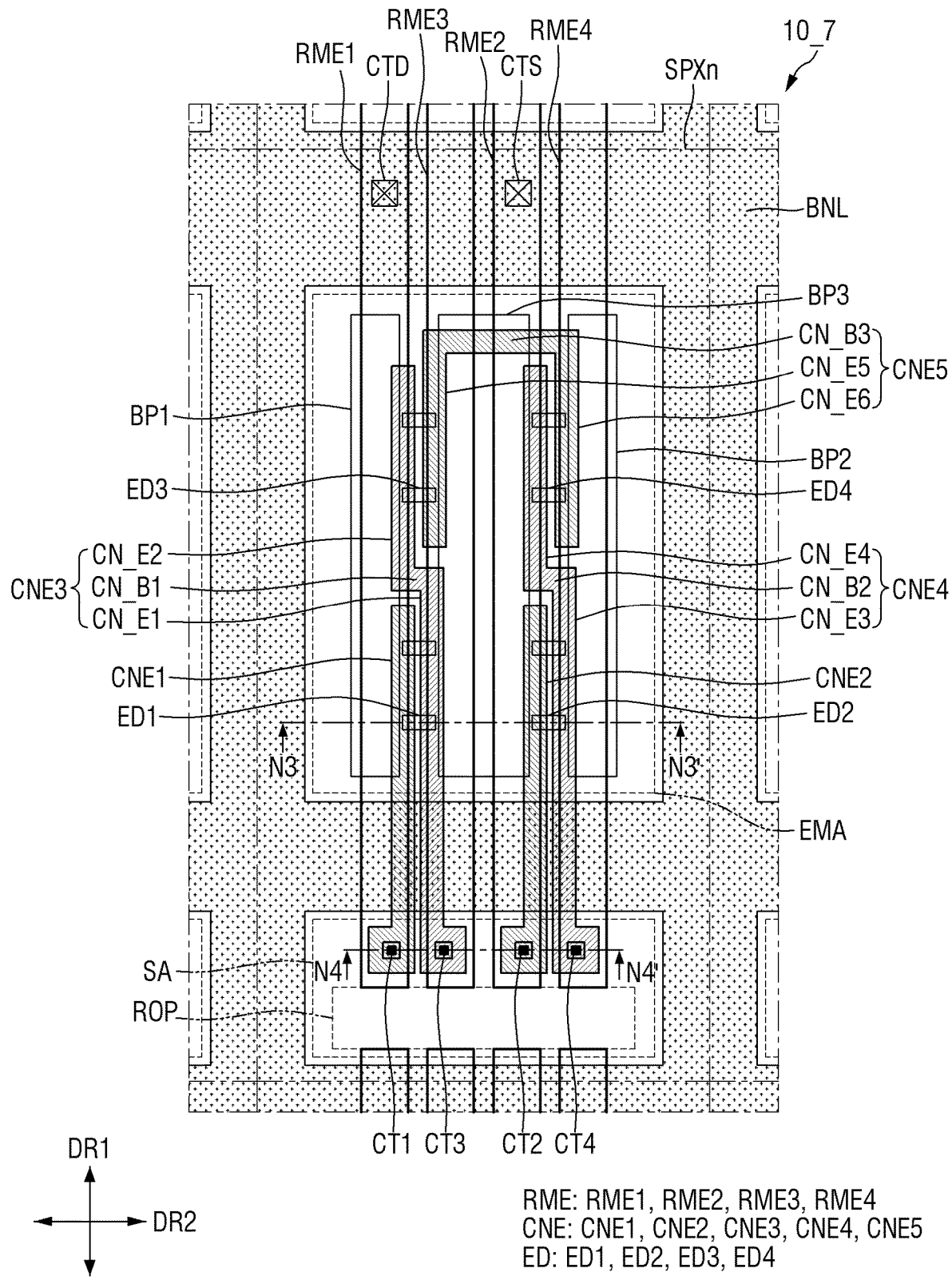
FIG. 29 is a plan view of a subpixel of a display device according to one or more embodiments.
Figure 30:
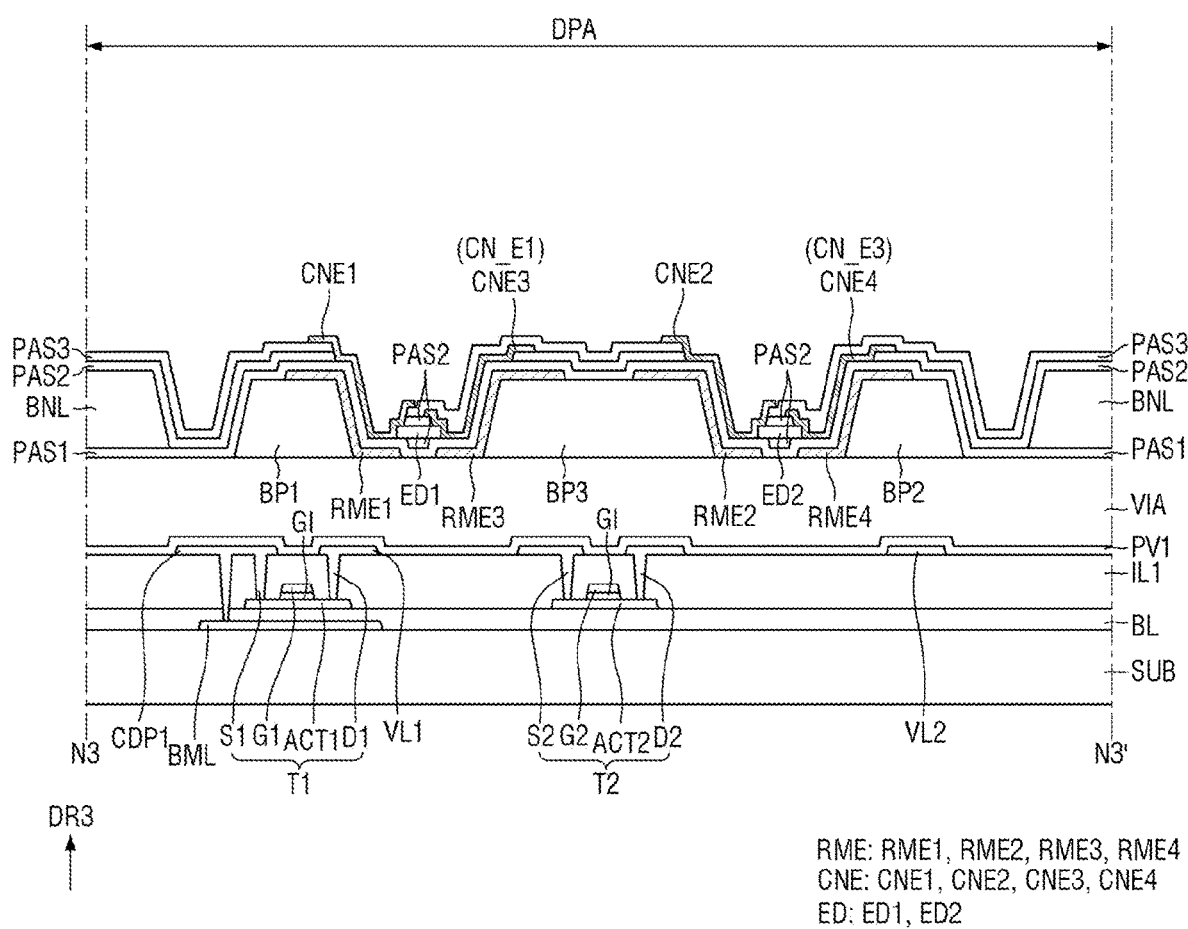
FIG. 30 is a cross-sectional view taken along the line N3-N3' of FIG. 29.
Figure 31:
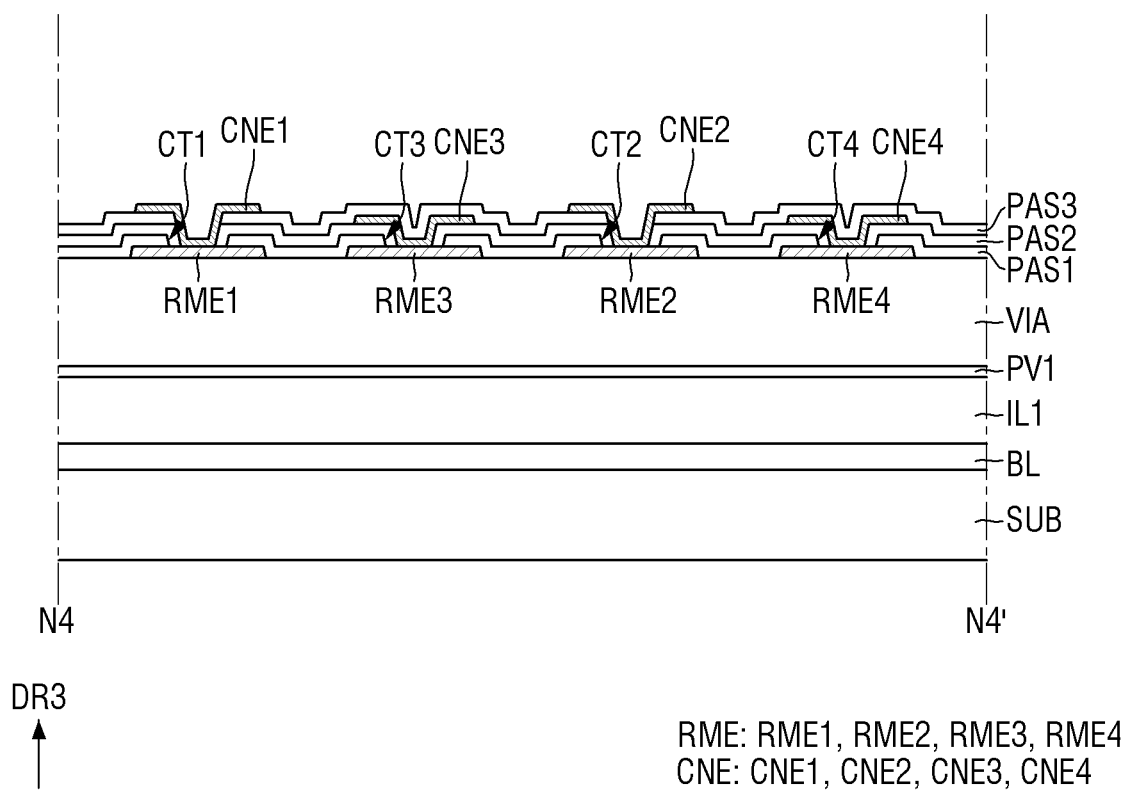
FIG. 31 is a cross-sectional view taken along the line N4-N4' of FIG. 29.

FIG. 29 is a plan view of a subpixel SPXn of a display device 10_7 according to one or more embodiments. FIG. 30 is a cross-sectional view taken along the line N3-N3' of FIG. 29. FIG. 31 is a cross-sectional view taken along the line N4-N4' of FIG. 29. FIG. 29 illustrates the planar arrangement of electrodes RME (RME1 through RME4), bank patterns BP1 through BP3, a bank layer BNL, a plurality of light emitting elements ED, and connection electrodes CNE (CNE1 through CNE5) disposed in a pixel PX of the display device 10_7. FIG. 30 illustrates a cross section across both ends of the light emitting elements ED (ED1 through ED2) disposed on different electrodes RME, and FIG. 31 illustrates a cross section across a plurality of contact parts CT1 through CT4.

Referring to FIGS. 29 through 31, the display device 10_7 according to one or more embodiments may include a greater number of the electrodes RME (RME1 through RME4), the bank patterns BP1 through BP3, the light emitting elements ED (ED1 through ED4), and the connection electrodes CNE (CNE1 through CNE5). The display device 10_7 according to the current embodiment is different from that of the embodiment of FIG. 4 in that it includes a greater number of electrodes and light emitting elements in each subpixel SPXn. Therefore, any redundant description will be omitted, and differences will be mainly described below.

The bank patterns BP1 through BP3 may further include a third bank pattern BP3 disposed between a first bank pattern BP1 and a second bank pattern BP2. The first bank pattern BP1 may be disposed on a left side of the center of an emission area EMA, the second bank pattern BP2 may be disposed on a right side of the center of the emission area EMA, and the third bank pattern BP3 may be disposed in the center of the emission area EMA. A width of the third bank pattern BP3 measured in the second direction DR2 may be greater than those of the first bank pattern BP1 and the second bank pattern BP2. A distance between the bank patterns BP1 through BP3 in the second direction DR2 may be greater than a distance between the electrodes RME. The first bank pattern BP1 may partially overlap a first electrode RME1, and the second bank pattern BP2 may partially overlap a fourth electrode RME4. The third bank pattern BP3 may partially overlap a second electrode RME2 and a third electrode RME3. At least a part of each electrode RME may not overlap the bank patterns BP1 through BP3.

The electrodes RME disposed in each subpixel SPXn may include the third electrode RME3 and the fourth electrode RME4 in addition to the first electrode RME1 and the second electrode RME2.

The third electrode RME3 may be disposed between the first electrode RME1 and the second electrode RME2, and the fourth electrode RME4 may be spaced from the third electrode RME3 in the second direction DR2 with the second electrode RME2 interposed between them. The electrodes RME may be sequentially disposed in the order of the first electrode RME1, the third electrode RME3, the second electrode RME2, and the fourth electrode RME4 from the left to the right of each subpixel SPXn. The electrodes RME may be spaced to face each other in the second direction DR2. The electrodes RME may be spaced from the electrodes RME of another adjacent subpixel SPXn in the first direction DR1 in a separation part ROP of a sub-area SA.

The first electrode RME1 and the second electrode RME2 among the electrodes RME may respectively contact a first conductive pattern CDP1 and a second voltage line VL2 thereunder through electrode contact holes CTD and CTS disposed under the bank layer BNL, but the third electrode RME3 and the fourth electrode RME4 may not contact the third conductive layer.

A first insulating layer PAS1 may be disposed in a structure similar to those of the above-described embodiments. The first insulating layer PAS1 may be disposed in the entire display area DPA and may cover the electrodes RME and the bank patterns BP1 through BP3.

The light emitting elements ED may be disposed between the bank patterns BP1 through BP3 or may be disposed on different electrodes RME. Some of the light emitting elements ED may be disposed between the first bank pattern BP1 and the third bank pattern BP3, and the others may be disposed between the third bank pattern BP3 and the second bank pattern BP2. According to one or more embodiments, the light emitting elements ED may include first light emitting elements ED1 and third light emitting elements ED3 disposed between the first bank pattern BP1 and the third bank pattern BP3 and second light emitting elements ED2 and fourth light emitting elements ED4 disposed between the third bank pattern BP3 and the second bank pattern BP2. Each of the first light emitting elements ED1 and the third light emitting elements ED3 may be disposed on the first electrode RME1 and the third electrode RME3, and each of the second light emitting elements ED2 and the fourth light emitting elements ED4 may be disposed on the second electrode RME2 and the fourth electrode RME4. The first light emitting elements ED1 and the second light emitting elements ED2 may be disposed in the emission area EMA of a corresponding subpixel SPXn to be adjacent to a lower side or the sub-area SA, and the third light emitting elements ED3 and the fourth light emitting elements ED4 may be disposed in the emission area EMA of the corresponding subpixel SPXn to be adjacent to an upper side.

However, the light emitting elements ED are not classified according to their position in the emission area EMA but may be classified according to their connection relationship with the connection electrodes CNE which will be described later. Both ends of each light emitting element ED may contact different connection electrodes CNE according to the arrangement structure of the connection electrodes CNE, and the light emitting elements ED may be classified into different light emitting elements ED according to types of the connection electrodes CNE that they contact.

The connection electrodes CNE may include a third connection electrode CNE3, a fourth connection electrode CNE4, and a fifth connection electrode CNE5 disposed over a plurality of electrodes RME in addition to a first connection electrode CNE1 disposed on the first electrode RME1 and a second connection electrode CNE2 disposed on the second electrode RME2.

Unlike in the embodiment of FIGS. 4 through 6, each of the first connection electrode CNE1 and the second connection electrode CNE2 may have a relatively short length in the first direction DR1. The first connection electrode CNE1 and the second connection electrode CNE2 may be disposed below the center of the emission area EMA in the first direction DR1. The first connection electrode CNE1 and the second connection electrode CNE2 may be disposed over the emission area EMA and the sub-area SA of a corresponding subpixel SPXn and may directly contact the electrodes RME through the contact parts CT1 and CT2 formed in the sub-area SA, respectively. The first connection electrode CNE1 may directly contact the first electrode RME1 through a first contact part CT1 penetrating the first insulating layer PAS1, a second insulating layer PAS2, and a third insulating layer PAS3 in the sub-area SA, and the second connection electrode CNE2 may contact the second electrode RME2 through a second contact part CT2 penetrating the first insulating layer PAS1, the second insulating layer PAS2, and the third insulating layer PAS3 in the sub-area SA.

The third connection electrode CNE3 may include a first extension part CN_E1 disposed on the third electrode RME3, a second extension part CN_E2 disposed on the first electrode RME1, and a first connection part CN_B1 connecting the first extension part CN_E1 and the second extension part CN_E2. The first extension part CN_E1 may be spaced from the first connection electrode CNE1 in the second direction DR2 to face (or oppose) the first connection electrode CNE1, and the second extension part CN_E2 may be spaced from the first connection electrode CNE1 in the first direction DR1. The first extension part CN_E1 may be disposed on the lower side of the emission area EMA of a corresponding subpixel SPXn in the first direction DR1, and the second extension part CN_E2 may be disposed on the upper side of the emission area EMA in the first direction DR1. The first extension part CN_E1 and the second extension part CN_E2 may be disposed in the emission area EMA. The first connection part CN_B1 may be disposed across the first electrode RME1 and the third electrode RME3 in the center of the emission area EMA. The third connection electrode CNE3 may generally extend in the first direction DR1 but may be bent in the second direction DR2 and then may extend again in the first direction DR1.

The fourth connection electrode CNE4 may include a third extension part CN_E3 disposed on the fourth electrode RME4, a fourth extension part CN_E4 disposed on the second electrode RME2, and a second connection part CN_B2 connecting the third extension part CN_E3 and the fourth extension part CN_E4. The third extension part CN_E3 may be spaced from the second connection electrode CNE2 in the second direction DR2 to face (or oppose) the second connection electrode CNE2, and the fourth extension part CN_E4 may be spaced from the second connection electrode CNE2 in the first direction DR1. The third extension part CN_E3 may be disposed on the lower side of the emission area EMA of a corresponding subpixel SPXn in the first direction DR1, and the fourth extension part CN_E4 may be disposed on the upper side of the emission area EMA in the first direction DR1. The third extension part CN_E3 and the fourth extension part CN_E4 may be disposed in the emission area EMA. The second connection part CN_B2 may be disposed across the second electrode RME2 and the fourth electrode RME4 in an area adjacent to the center of the emission area EMA. The fourth connection electrode CNE4 may generally extend in the first direction DR1 but may be bent in the second direction DR2 and then may extend again in the first direction DR1.

The fifth connection electrode CNE5 may include a fifth extension part CN_E5 disposed on the third electrode RME3, a sixth extension part CN_E6 disposed on the fourth electrode RME4, and a third connection part CN_B3 connecting the fifth extension part CN_E5 and the sixth extension part CN_E6. The fifth extension part CN_E5 may be spaced from the second extension part CN_E2 of the third connection electrode CNE3 in the second direction DR2 to face (or oppose) the second extension part CN_E2, and the sixth extension part CN_E6 may be spaced from the fourth extension part CN_E4 of the fourth connection electrode CNE4 in the second direction DR2 to face (or oppose) the fourth extension part CN_E4. Each of the fifth extension part CN_E5 and the sixth extension part CN_E6 may be disposed on the upper side of the emission area EMA in the first direction DR1, and the third connection part CN_B3 may be disposed across the third electrode RME3, the second electrode RME2, and the fourth electrode RME4. The fifth connection electrode CNE5 may be around (e.g., may surround) the fourth extension part CN_E4 of the fourth connection electrode CNE4 in a plan view.

The third connection electrode CNE3 may directly contact the third electrode RME3 through a third contact part CT3 penetrating the first insulating layer PAS1 and the second insulating layer PAS2 in the sub-area SA, and the fourth connection electrode CNE4 may contact the fourth electrode RME4 through a fourth contact part CT4 penetrating the first insulating layer PAS1 and the second insulating layer PAS2 in the sub-area SA.

However, the present disclosure is not limited thereto. In one or more embodiments, in the display device 10_7, some of the connection electrodes CNE may be directly connected to a third conductive layer. For example, each of the first connection electrode CNE1 and the second connection electrode CNE2 that are first type connection electrodes may be directly connected to the third conductive layer and may not be electrically connected to the electrodes RME. A second type connection electrode and a third type connection electrode may also not be electrically connected to the electrodes RME and may be connected only to the light emitting elements ED.

The first connection electrode CNE1 and the second connection electrode CNE2 may be first type connection electrodes connected to the electrodes RME1 and RME2 that are directly connected to the third conductive layer. The third connection electrode CNE3 and the fourth connection electrode CNE4 may be second type connection electrodes connected to the electrodes RME3 and RME4 that are not connected to the third conductive layer. The fifth connection electrode CNE5 may be a third type connection electrode not connected to the electrodes RME. The fifth connection electrode CNE5 may not be connected to the electrodes RME but may contact the light emitting elements ED and may form an electrical connection circuit of the light emitting elements ED together with other connection electrodes CNE.

The third connection electrode CNE3 and the fourth connection electrode CNE4 that are second type connection electrodes may be connection electrodes in which electrode extension parts extending in the first direction DR1 are not side by side with each other in the second direction DR2, and the fifth connection electrode CNE5 that is a third type connection electrode may be a connection electrode in which electrode extension parts extending in the first direction DR1 are side by side with each other in the second direction DR2. The third connection electrode CNE3 and the fourth connection electrode CNE4 may extend in the first direction DR1 but may be bent, and the fifth connection electrode CNE5 may be around (e.g., may surround) a part of another connection electrode.

In the above arrangement structure of the connection electrodes CNE, the light emitting elements ED may be classified into different light emitting elements ED according to the connection electrodes CNE that both ends thereof contact. Each of the first light emitting elements ED1 and the second light emitting elements ED2 may have a first end contacting a first type connection electrode and a second end contacting a second type connection electrode. The first light emitting elements ED1 may contact the first connection electrode CNE1 and the third connection electrode CNE3, and the second light emitting elements ED2 may contact the second connection electrode CNE2 and the fourth connection electrode CNE4. Each of the third light emitting elements ED3 and the fourth light emitting elements ED4 may have a first end contacting a second type connection electrode and a second end contacting a third type connection electrode. The third light emitting elements ED3 may contact the third connection electrode CNE3 and the fifth connection electrode CNE5, and the fourth light emitting elements ED4 may contact the fourth connection electrode CNE4 and the fifth connection electrode CNE5.

The light emitting elements ED may be connected to each other in series through the connection electrodes CNE. Because the display device 10_7 according to the current embodiment includes a greater number of the light emitting elements ED in each subpixel SPXn and forms a series connection of the light emitting elements ED, the amount of light emitted per unit area can be further increased.

Figure 32:
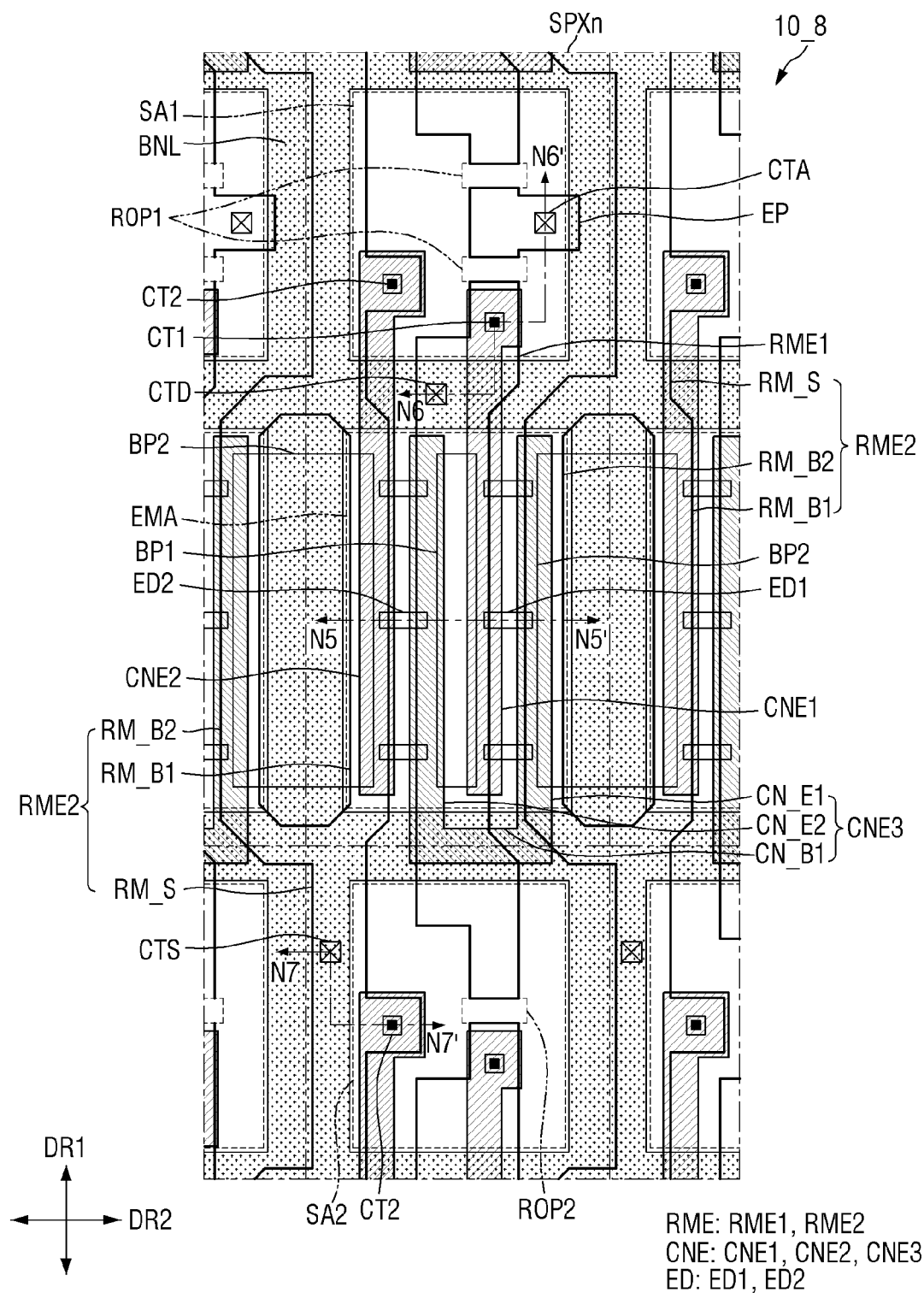
FIG. 32 is a plan view of a subpixel of a display device according to one or more embodiments.
Figure 33:
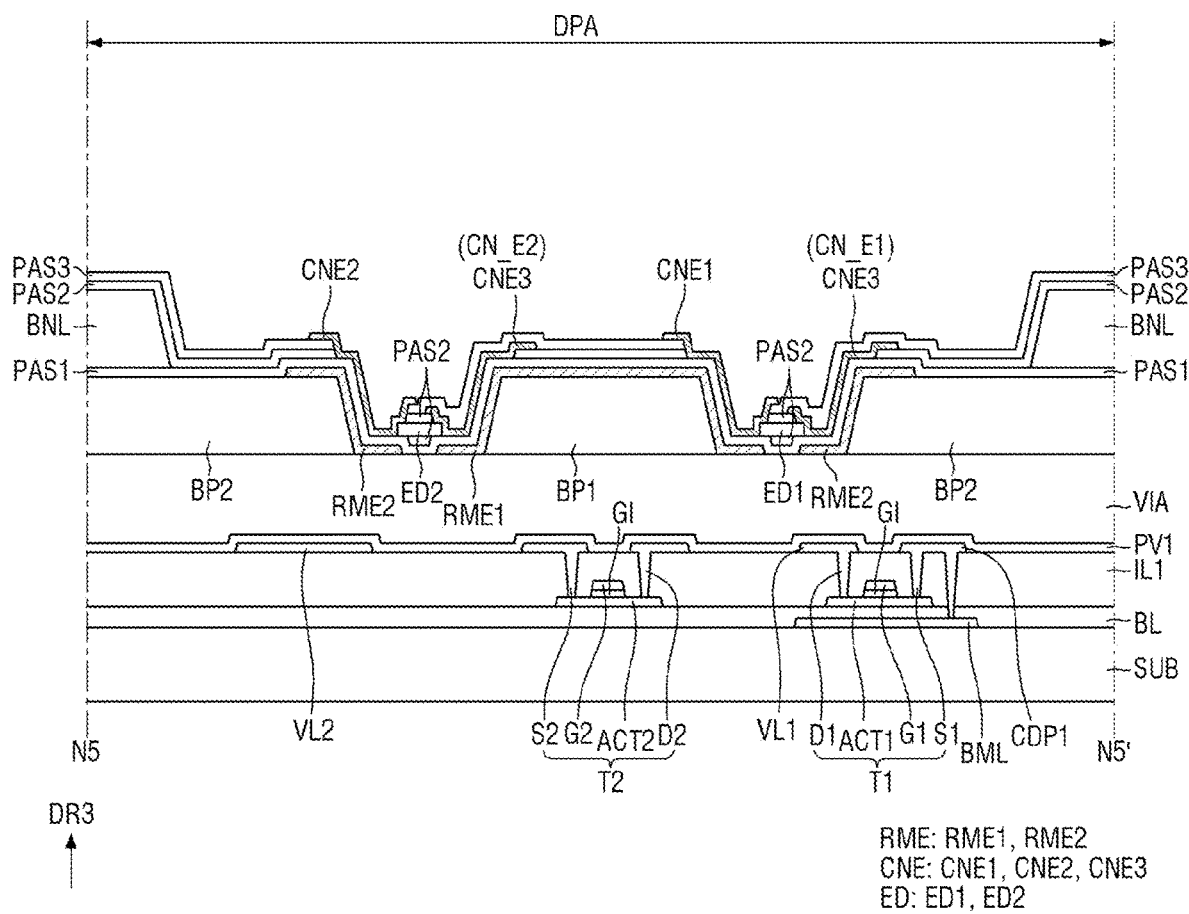
FIG. 33 is a cross-sectional view taken along the line N5-N5' of FIG. 32.
Figure 34:
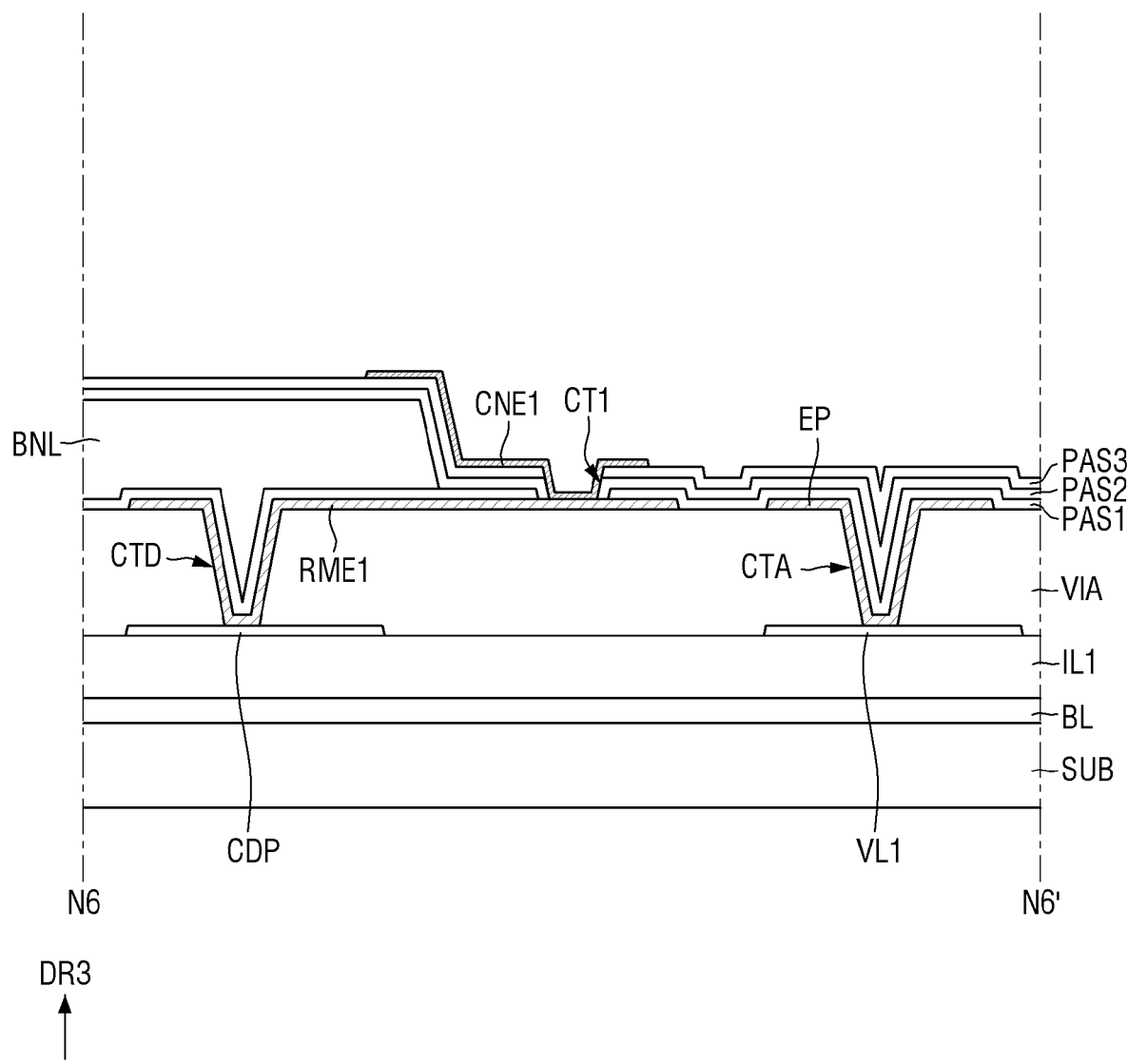
FIG. 34 is a cross-sectional view taken along the line N6-N6' of FIG. 32.
Figure 35:
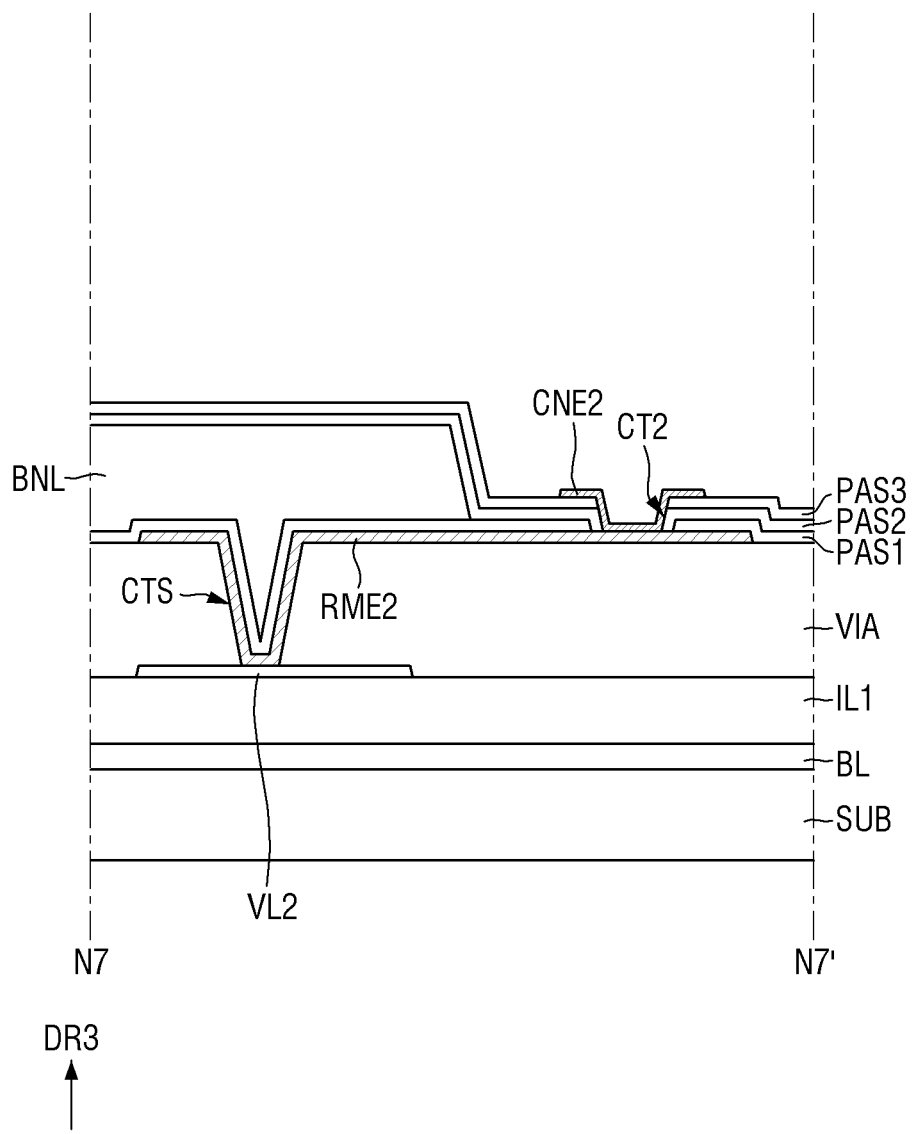
FIG. 35 is a cross-sectional view taken along the line N7-N7' of FIG. 32.

FIG. 32 is a plan view of a subpixel SPXn of a display device 10_8 according to one or more embodiments. FIG. 33 is a cross-sectional view taken along the line N5-N5' of FIG. 32. FIG. 34 is a cross-sectional view taken along the line N6-N6' of FIG. 32. FIG. 35 is a cross-sectional view taken along the line N7-N7' of FIG. 32.

FIG. 32 illustrates the planar arrangement of electrodes RME (RME1 and RME2), bank patterns BP1 and BP2, a bank layer BNL, a plurality of light emitting elements ED, and connection electrodes CNE (CNE1 through CNE3) disposed in a pixel PX of the display device 10_8. FIG. 33 illustrates a cross section across both ends of the light emitting elements ED (ED1 and ED2) disposed on different electrodes RME, and FIGS. 34 and 35 illustrate cross sections across a plurality of electrode contact holes CTD, CTS and CTA and a plurality of contact parts CT1 and CT2.

Referring to FIGS. 32 through 35, the display device 10_8 according to one or more embodiments may be different from those of the above-described embodiments in the structure of the electrodes RME, the connection electrodes CNE, and the bank patterns BP1 and BP2. Therefore, any redundant description already provided in the above embodiments will be omitted, and differences will be mainly described below.

The bank patterns BP1 and BP2 may extend in the first direction DR1 but may have different widths measured in the second direction DR2. Any one of the bank patterns BP1 and BP2 may be disposed over subpixels SPXn neighboring each other in the second direction DR2. For example, the bank patterns BP1 and BP2 may include a first bank pattern BP1 disposed in an emission area EMA of each subpixel SPXn and a second bank pattern BP2 disposed over the emission areas EMA of different subpixels SPXn.

The first bank pattern BP1 is disposed in the center of the emission area EMA, and the second banks BP2 are spaced from each other with the first bank pattern BP1 interposed between them. The first bank pattern BP1 and the second bank pattern BP2 may be alternately disposed along the second direction DR2. The light emitting elements ED may be disposed between the first bank pattern BP1 and the second bank pattern BP2 that are spaced from each other.

The first bank pattern BP1 and the second bank pattern BP2 may have the same length in the first direction DR1 but may have different widths measured in the second direction DR2. A part of the bank layer BNL that extends in the first direction DR1 may overlap the second bank pattern BP2 in the thickness direction (e.g., the third direction DR3). The first bank pattern BP1 may overlap a first electrode RME1, and the second bank pattern BP2 may overlap electrode branch parts RM_B1 and RM_B2 of a second electrode RME2 and the bank layer BNL.

The bank patterns BP1 and BP2 may be disposed as island-shaped patterns in the entire display area DPA.

The electrodes RME include the first electrode RME1 disposed in the center of each subpixel SPXn and the second electrode RME2 disposed over different subpixels SPXn. The first electrode RME1 and the second electrode RME2 may generally extend in the first direction DR1, but parts disposed in the emission area EMA may have different shapes.

The first electrode RME1 may be disposed in the center of each subpixel SPXn, and a part disposed in the emission area EMA may be disposed on the first bank pattern BP1. The first electrode RME1 may extend in the first direction DR1 from a sub-area SA to the sub-area SA of another sub-pixel SPXn. A width of the first electrode RME1 measured in the second direction DR2 may vary according to position, and at least a part overlapping the first bank pattern BP1 in the emission area EMA may have a greater width than the first bank pattern BP1.

The second electrode RME2 may include a part extending in the first direction DR1 and parts branching in the vicinity of the emission area EMA. In one or more embodiments, the second electrode RME2 may include an electrode stem part RM_S extending in the first direction DR1 and a plurality of electrode branch parts RM_B1 and RM_B2 branching from the electrode stem part RM_S, bending in the second direction DR2, and then extending again in the first direction DR1. The electrode stem part RM_S may overlap a part of the bank layer BNL that extends in the first direction DR1 and may be disposed on a side of the sub-area SA in the second direction DR2. The electrode branch parts RM_B1 and RM_B2 may branch from the electrode stem part RM_S disposed in a part of the bank layer BNL that extends in the first direction DR1 and a part of the bank layer BNL that extends in the second direction DR2 and may be bent to both sides in the second direction DR2. The electrode branch parts RM_B1 and RM_B2 may extend across the emission area EMA in the first direction DR1 and then may be bent again to be integrally connected to the electrode stem part RM_S. That is, the electrode branch parts RM_B1 and RM_B2 of the second electrode RME2 may branch off on an upper side of the emission area EMA of any one subpixel SPXn and then may be connected to each other again on a lower side of the emission area EMA.

The second electrode RME2 may include a first electrode branch part RM_B1 disposed on a left side of the first electrode RME1 and a second electrode branch part RM_B2 disposed on a right side of the first electrode RME1. The electrode branch parts RM_B1 and RM_B2 included in one second electrode RME2 may be respectively disposed in the emission areas EMA of subpixels SPXn neighboring each other in the second direction DR2, and the electrode branch parts RM_B1 and RM_B2 of different second electrodes RME2 may be disposed in one subpixel SPXn. The first electrode branch part RM_B1 of the second electrode RME2 may be disposed on the left side of the first electrode RME1, and the second electrode branch part RM_B2 of another second electrode RME2 may be disposed on the right side of the first electrode RME1.

Each of the electrode branch parts RM_B1 and RM_B2 of the second electrode RME2 may overlap a side of the second bank pattern BP2. The first electrode branch part RM_B1 may partially overlap the second bank pattern BP2 disposed on a left side of the first bank pattern BP1, and the second electrode branch part RM_B2 may partially overlap the second bank pattern BP2 disposed on a right side of the first bank pattern BP1. Both sides of the first electrode RME1 may be spaced from different electrode branch parts RM_B1 and RM_B2 of different second electrodes RME2 to face (or oppose) them, and a distance between the first electrode RME1 and each of the electrode branch parts RM_B1 and RM_B2 may be smaller than a distance between different bank patterns BP1 and BP2.

A width of the first electrode RME1 measured in the second direction DR2 may be greater than widths of the electrode stem part RM_S and the electrode branch parts RM_B1 and RM_B2 of the second electrode RME2. The first electrode RME1 may have a greater width than the first bank pattern BP1 to overlap both sides of the first bank pattern BP1, but the second electrode RME2 may have a relatively small width so that each of the electrode branch parts RM_B1 and RM_B2 overlaps only one side of the second bank pattern BP2.

The first electrode RME1 may contact a first conductive pattern CDP of a third conductive layer through a first electrode contact hole CTD in a part overlapping a part of the bank layer BNL that extends in the second direction DR2. The second electrode RME2 may contact a second voltage line VL2 of the third conductive layer through a second electrode contact hole CTS in the electrode stem part RM_S. A part of the first electrode RME1 that is disposed in the sub-area SA may overlap a first contact part CT1. The second electrode RME2 may include a part protruding from the electrode stem part RM_S in the second direction DR2 to lie in the sub-area SA and may overlap a second contact part CT2 in the protruding part.

The first electrode RME1 among the first electrode RME1 and the second electrode RME2 may be disposed up to separation parts ROP1 and ROP2 of the sub-areas SA, but the second electrode RME2 may not be separated in the sub-areas SA. One second electrode RME2 may include a plurality of electrode stem parts RM_S and a plurality of electrode branch parts RM_B1 and RM_B2 to extend in the first direction DR1 and may branch in the vicinity of the emission area EMA of each subpixel SPXn. The first electrode RME1 may be disposed between the separation parts ROP1 and ROP2 disposed in different sub-areas SA1 and SA2 of each subpixel SPXn and may be disposed across the emission area EMA.

According to one or more embodiments, the display device 10_8 may include a wiring connection electrode EP disposed in a first sub-area SA1 among a plurality of sub-areas SA1 and SA2 of each subpixel SPXn and disposed between the first electrodes RME1 of different subpixels SPXn. The wiring connection electrode EP may not be disposed in a second sub-area SA2 of each subpixel SPXn, and the first electrodes RME1 of different subpixels SPXn adjacent to each other in the first direction DR1 may be spaced from each other in the second sub-area SA2. In the subpixel SPXn illustrated in FIG. 32 among a plurality of subpixels SPXn, the first sub-area SA1 in which the wiring connection electrode EP is disposed may be disposed above the emission area EMA in the first direction DR1, and the second sub-area SA2 may be disposed below the emission area EMA in the first direction DR1. On the other hand, in a subpixel SPXn adjacent to the subpixel SPXn of FIG. 32 in the first direction DR1, the first sub-area SA1 in which the wiring connection electrode EP is disposed may be disposed below the emission area EMA, and the second sub-area SA2 may be disposed above the emission area EMA.

The first electrode RME1 may be spaced from the wiring connection electrode EP with a first separation part ROP1 interposed between them in the first sub-area SA1. Two first separation parts ROP1 may be disposed in one first sub-area SA1. The wiring connection electrode EP may be spaced from the first electrode RME1 disposed in a corresponding subpixel SPXn with a lower first separation part ROP1 interposed between them and may be spaced from the first electrode RME1 disposed in another subpixel SPXn with an upper first separation part ROP1 interposed between them. In the second sub-area SA2, one second separation part ROP2 may be disposed, and different first electrodes RME1 may be spaced from each other in the first direction DR1.

In one or more embodiments, the wiring connection electrode EP may be connected to a first voltage line VL1 of the third conductive layer through a third electrode contact hole CTA penetrating a via layer VIA. The first electrode RME1 may be formed to be connected to the wiring connection electrode EP, and an electrical signal transmitted to place the light emitting elements ED may be transmitted from the first voltage line VL1 to the first electrode RME1 through the wiring connection electrode EP. In the process of placing the light emitting elements ED, signals may be transmitted to the first voltage line VL1 and the second voltage line VL2 and then may be transferred to the first electrode RME1 and the second electrode RME2, respectively.

The relative position of the second electrode contact hole CTS may be different from that of the third electrode contact hole CTA to be described later. The second electrode contact hole CTS may be disposed in a portion of the bank layer BNL that surrounds the second sub-area SA2, and the third electrode contact hole CTA may be disposed in the first sub-area SA1. That is, because the second electrode contact hole CTS and the third electrode contact hole CTA expose upper surfaces of different voltage lines VL2 and VL1, respectively, the position of each of the second electrode contact hole CTS and the third electrode contact hole CTA may be determined accordingly.

The bank layer BNL may surround the emission area EMA and the sub-areas SA1 and SA2 as in the above-described embodiments. However, in one or more embodiments in which the display device 10 includes the sub-areas SA1 and SA2 separated from each other, the areas surrounded by the bank layer BNL may be separated from each other. The bank layer BNL is the same as those of the above-described embodiments except that it surrounds the sub-areas SA1 and SA2 that are different from each other.

The light emitting elements ED may be disposed on different electrodes RME between different bank patterns BP1 and BP2. The light emitting elements ED may include first light emitting elements ED1 having both ends disposed on the first electrode RME1 and the second electrode branch part RM_B2 of the second electrode RME2 and second light emitting elements ED2 having both ends disposed on the first electrode RME1 and the first electrode branch part RM_B1 of another second electrode RME2. The first light emitting elements ED1 may be disposed on the right side of the first electrode RME1, and the second light emitting elements ED2 may be disposed on the left side of the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE (CNE1 through CNE3) may include a first connection electrode CNE1, a second connection electrode CNE2, and a third connection electrode CNE3.

The first connection electrode CNE1 may extend in the first direction DR1 and may be disposed on the first electrode RME1. A portion of the first connection electrode CNE1 that is disposed on the first bank pattern BP1 may overlap the first electrode RME1 and may extend in the first direction DR1 from here to the first sub-area SA1 located above the emission area EMA beyond the bank layer BNL. The first connection electrode CNE1 may contact the first electrode RME1 through the first contact part CT1 in the first sub-area SA1.

The second connection electrode CNE2 may extend in the first direction DR1 and may be disposed on the second electrode RME2. A portion of the second connection electrode CNE2 that is disposed on the second bank pattern BP2 may overlap the second electrode RME2 and may extend in the first direction DR1 from here to the first sub-area SA1 located above the emission area EMA beyond the bank layer BNL. The second connection electrode CNE2 may contact the second electrode RME2 through the second contact part CT2 in the first sub-area SA1.

In a subpixel SPXn adjacent to the subpixel SPXn of FIG. 32 in the first direction DR1, the first connection electrode CNE1 and the second connection electrode CNE2 may respectively contact the first electrode RME1 and the second electrode RME2 through the contact parts CT1 and CT2 disposed in the second sub-area SA2.

The third connection electrode CNE3 may include extension parts CN_E1 and CN_E2 extending in the first direction DR1 and a first connection part CN_B1 connecting the extension parts CN_E1 and CN_E2. A first extension part CN_E1 faces (or opposes) the first connection electrode CNE1 in the emission area EMA and is disposed on the second electrode branch part RM_B2 of the second electrode RME2. A second extension part CN_E2 faces (or opposes) the second connection electrode CNE2 in the emission area EMA and is disposed on the first electrode RME1. The first connection part CN_B1 may extend in the second direction DR2 on the bank layer BNL disposed below the emission area EMA and may connect the first extension part CN_E1 and the second extension part CN_E2. The third connection electrode CNE3 may be disposed in the emission area EMA and on the bank layer BNL and may not be directly connected to the electrodes RME. The second electrode branch part RM_B2 disposed under the first extension part CN_E1 may be electrically connected to the second voltage line VL2, but a second power supply voltage applied to the second electrode branch part RM_B2 may not be transmitted to the third connection electrode CNE3.

In a light emitting element according to one or more embodiments, an insulating film surrounding semiconductor layers and a light emitting layer includes a plurality of pair layers, each including a plurality of layers made of different materials. The insulating film may guide light generated from the light emitting layer by reflecting the light.

A display device according to one or more embodiments include the above light emitting element having the insulating film partially removed. Therefore, upward output efficiency of light generated by the light emitting element can be improved. In addition, the display device can prevent an electrical short circuit between connection electrodes connected to the light emitting element through a shape formed in the insulating film of the light emitting element.

In concluding the detailed description, those skilled in the art will appreciate that many variations and modifications can be made to the described embodiments without substantially departing from the principles and scope of the present disclosure. Therefore, the described embodiments of the present disclosure are used in a generic and descriptive sense only and not for purposes of limitation.

What is claimed is:

1. A display device comprising:
   a first electrode on a substrate and a second electrode spaced from the first electrode;
   a first insulating layer on the first electrode and the second electrode;
   a plurality of light emitting elements on the first insulating layer and on the first electrode and the second electrode;
   a first connection electrode on the first electrode and contacting a first end of each of the plurality of light emitting elements; and
   a second connection electrode on the second electrode and contacting a second end of each of the plurality of light emitting elements,
   wherein each of the plurality of light emitting elements comprises:
   a first semiconductor layer doped with an n-type dopant;
   a second semiconductor layer doped with a p-type dopant;
   a light emitting layer between the first semiconductor layer and the second semiconductor layer; and
   an insulating film surrounding a part of at least the light emitting layer and comprising a first layer and a second layer comprising a different material from the first layer,
     wherein the insulating film further comprises a plurality of pair layers, each of the pair layers comprising the first layer and the second layer, the first layer and the second layer being alternately stacked.

2. The display device of claim 1, wherein the first layer and the second layer each comprise one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$) and titanium oxide ($TiO_x$), and wherein the first layer and the second layer comprise different materials from each other.

3. The display device of claim 1, further comprising an electrode layer on the second semiconductor layer,
wherein the insulating film surrounds side surfaces of the first semiconductor layer, the second semiconductor layer, the light emitting layer, and the electrode layer.

4. The display device of claim 3, wherein the plurality of pair layers of the insulating film comprises a first pair layer in which the first layer is located on the side surfaces of the light emitting layer and a second pair layer in which the first layer is located on the second layer of the first pair layer.

5. The display device of claim 1, further comprising a second insulating layer on the plurality of light emitting elements,
wherein the insulating film of each of the light emitting elements comprises a first part between the second insulating layer and the first semiconductor layer, the light emitting layer, and the second semiconductor layer, and a second part that is a region of the insulating film other than the first part,
a part of the second semiconductor layer is exposed at the first end of each of the light emitting elements, and
a part of the first semiconductor layer is exposed at the second end of each of the light emitting elements.

6. The display device of claim 5, wherein the first connection electrode and the second connection electrode are spaced from each other on the second insulating layer.

7. The display device of claim 5, wherein the first part of the insulating film comprises an undercut located under both ends of the second layer, and
wherein a length of the first layer is smaller than that of the second layer.

8. The display device of claim 7, further comprising a connection electrode pattern on the second insulating layer and comprising a same material as the first connection electrode and the second connection electrode,
wherein the connection electrode pattern is spaced from each of the first connection electrode and the second connection electrode.

9. The display device of claim 5, wherein each of the plurality of light emitting elements comprises:
a first surface that is a side surface of the first end;
a second surface that is a side surface of the second end;
a third surface that is a part of an upper side surface of the first end not overlapping the second insulating layer; and
a fourth surface that is a part of an upper side surface of the second end not overlapping the second insulating layer,
wherein the first connection electrode contacts the first surface and the third surface of each light emitting element, and
wherein the second connection electrode contacts the second surface and the fourth surface of each light emitting element.

10. The display device of claim 9, wherein the first connection electrode contacts the second semiconductor layer at the third surface, and
wherein the second connection electrode contacts the first semiconductor layer at the fourth surface.

11. The display device of claim 5, further comprising a third insulating layer on the second insulating layer and the second connection electrode,
wherein a part of the first connection electrode is on the third insulating layer.

12. The display device of claim 1, wherein each of the plurality of light emitting elements extends in a direction,
wherein a length of the insulating film measured in the direction is smaller than a length of each of the plurality of light emitting elements measured in the direction, and
wherein a length of the first layer of the insulating film measured in the direction is smaller than a length of the second layer measured in the direction.

13. The display device of claim 12, wherein each of the plurality of light emitting elements comprises:
a first surface that is a side surface of the first end;
a second surface that is a side surface of the second end;
a third surface that is an upper side surface of the first end; and
a fourth surface that is an upper side surface of the second end,
wherein the first connection electrode contacts the first surface and the third surface of each light emitting element,
wherein the second connection electrode contacts the second surface and the fourth surface of each light emitting element, and
wherein the first connection electrode and the second connection electrode are spaced from each other with the insulating film interposed therebetween.

14. The display device of claim 12, further comprising a connection electrode pattern on the insulating film of each light emitting element and comprising a same material as the first connection electrode and the second connection electrode,
wherein each of the first connection electrode and the second connection electrode is spaced from the connection electrode pattern.

15. The display device of claim 12, wherein the first connection electrode contacts a first surface that is a side surface of the first end of each of the plurality of light emitting elements, the second connection electrode contacts a second surface that is a side surface of the second end of each of the plurality of light emitting elements,
wherein in each of the plurality of light emitting elements, the insulating film covers only a part of an outer surface of the light emitting layer, and
wherein a fifth surface that is an upper side surface of the light emitting element on which the insulating film is not located is exposed.

16. A light emitting element comprising:
a first semiconductor layer doped with an n-type dopant;
a second semiconductor layer doped with a p-type dopant;
a light emitting layer between the first semiconductor layer and the second semiconductor layer; and
an insulating film surrounding a part of at least the light emitting layer and comprising a first layer and a second layer comprising a different material from the first layer,
wherein the insulating film comprises a plurality of pair layers, each of the pair layers comprising the first layer and the second layer, the first layer and the second layer being alternately stacked.

17. The light emitting element of claim 16, wherein the first layer and the second layer each comprise one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$) and titanium oxide ($TiO_x$), wherein the first layer and the second layer comprise different materials from each other.

18. The light emitting element of claim 16, wherein the insulating film has a thickness of 20 nm to 100 nm, and
   wherein each of the first layer and the second layer has a thickness of 1 nm to 10 nm.

19. The light emitting element of claim 16, further comprising an electrode layer on the second semiconductor layer,
   wherein the insulating film surrounds side surfaces of the first semiconductor layer, the second semiconductor layer, the light emitting layer, and the electrode layer.

20. The light emitting element of claim 19, wherein the plurality of pair layers of the insulating film comprises a first pair layer in which the first layer is located on the side surfaces of the light emitting layer and a second pair layer in which the first layer is located on the second layer of the first pair layer.

21. The light emitting element of claim 16, the light emitting element extends in a direction,
   wherein the insulating film surrounds side surfaces of at least the light emitting layer, and
   wherein a length of the insulating film measured in the direction is smaller than a length of the light emitting element measured in the direction.

22. The light emitting element of claim 21, wherein in the insulating film, a length of the first layer measured in the direction is smaller than a length of the second layer measured in the direction.

\* \* \* \* \*